United States Patent [19]
Sano et al.

[11] Patent Number: 5,546,048
[45] Date of Patent: Aug. 13, 1996

[54] AMPLIFIER AND DISPLAY APPARATUS EMPLOYING THE SAME

[75] Inventors: Yuji Sano, Zushi; Sadao Tsuruga; Kouji Kitou, both of Yokohama; Michitaka Ohsawa, Fujisawa, all of Japan

[73] Assignee: Hitachi, Ltd., Tokyo, Japan

[21] Appl. No.: 114,612

[22] Filed: Aug. 31, 1993

[30] Foreign Application Priority Data

Sep. 4, 1992 [JP] Japan .................................. 4-236696
Sep. 9, 1992 [JP] Japan .................................. 4-240257
Feb. 22, 1993 [JP] Japan .................................. 5-031060

[51] Int. Cl.⁶ .......................... H03F 3/26; H04N 5/14
[52] U.S. Cl. .......................................... 330/263; 348/707
[58] Field of Search ................................ 330/263, 264, 330/265, 267, 268, 293, 302, 303, 76, 77, 81, 302, 303; 348/707

[56] References Cited

U.S. PATENT DOCUMENTS

| | | | |
|---|---|---|---|
| 4,446,443 | 5/1984 | Johnson | 330/265 |
| 4,476,442 | 10/1984 | Iwamatsu | 330/293 |
| 4,577,160 | 3/1986 | Lettvin | 330/293 |
| 4,598,316 | 7/1986 | Rogers, III | 358/168 |
| 4,628,279 | 12/1986 | Nelson | 330/293 |
| 4,879,522 | 11/1989 | Mattfeld | 330/263 |
| 5,235,288 | 8/1993 | Rinderle | 330/264 |

FOREIGN PATENT DOCUMENTS

| | | | |
|---|---|---|---|
| 2646386 | 4/1978 | Germany | 330/263 |
| 57-20724 | 5/1982 | Japan . | |
| 60-5693 | 1/1985 | Japan . | |

OTHER PUBLICATIONS

The Sylvania Technologies 4/57 vol. X, No. 2 p. 36.
RCA Review 1966, Jun. pp. 199–211.

*Primary Examiner*—Steven Mottola
*Assistant Examiner*—Tiep H. Nguyen
*Attorney, Agent, or Firm*—Kenyon & Kenyon

[57] ABSTRACT

A push-pull circuit formed of transistors drives a peaking capacitor of an amplifier circuit to enhance charge and discharge of the peaking capacitor. This reduces a bias current, resulting in reduction of a power consumption. A feedback impedance is connected to an emitter of a transistor to feed an output signal back to an input of the amplifier circuit as a current signal in a wide frequency range. Thus, a high-power, wideband amplifier is accomplished.

32 Claims, 41 Drawing Sheets

AMPLIFIER AND DISPLAY APPARATUS EMPLOYING THE SAME

BACKGROUND OF THE INVENTION

The present invention relates to an amplifier, and more particularly concerns a high output, low power consumption amplifier.

Also, the present invention relates to a wideband amplifier, and more particularly concerns a high-amplitude, wideband amplifier useful in a picture tube drive circuit which needs a high amplitude output.

The present invention relates to an amplifier applicable to a signal processor useful in controlling a video signal for driving a display apparatus, such as a CRT display.

As the display apparatus is made to have higher resolution in recent years, the picture tube drive circuit tends to have wider frequency band, particularly in a computer display for CAD and CAM which requires a bandwidth as wide as 50 to 300 MHz. The voltage amplitude of the drive signal needed is around 30 V for a monochrome picture tube or as high as around 50 V for a color picture tube. The voltage amplitude is being made higher with current demand for larger display size.

As a result, it is a problem that the power consumption of the drive circuit is increased, resulting in that the circuit components are large sized and heavy weight. In connection with that problem, FIG. 2 depicts a circuit diagram illustrating a capacitive load drive circuit for a prior picture tube or CRT which is described in the Japanese Patent Application Publication No. 57-20724.

The prior capacitive load drive circuit in FIG. 2 operates as follows. A wideband signal fed from a signal source 1 to an input pin 2 is divided into a low-frequency component and high frequency component before being amplified to drive a capacitive load 6. The low-frequency component is amplified by a parallel feedback amplifier circuit formed of a transistor 25 having a feedback path of an input resistor 27, a feedback resistor 7, and frequency response compensation capacitor 28, with a temperature drift and a distortion suppressed. A collector current of a transistor 4 forming a bias constant-current circuit can be suppressed to suppress the power consumption of the amplifier circuit. The high-frequency component is amplified by a series feedback amplifier circuit formed of a transistor 26 having a feedback resistor 31 and a peaking capacitor 32. Both frequency components are composed at an emitter of a grounded-base transistor 3 before being fed out to an output pin 5.

The prior technique described above involves a problem that the wideband signal cannot be amplified to a sufficiently high signal amplitude. That is, if the prior capacitive load drive circuit in FIG. 2 is used to amplify the high-frequency signal to a high amplitude, there is often a side effect wherein the peaking capacitor 32, with the circuit power consumption suppressed, cuts off the transistor 26, resulting in insufficient output amplitude. Further detailed description is given below.

If the input signal falls down, the peaking capacitor 32 has to be discharged to make the voltage waveform at the emitter of the transistor follow the input signal. A maximum discharge current of the peaking capacitor 32, however, is suppressed to a bias current of the transistor. Therefore, in the state that the bias current of the transistor 26 is suppressed to suppress the circuit power consumption if the input signal of high amplitude falls down in a very short transition time, the peaking capacitor 32 cannot be fully discharged, causing the transistor 26 to be cut off.

Also, it is another problem that the frequency response of the feedback system of the prior technique affects the characteristics of the amplifier circuit. For example, a phase delay caused in the feedback network sometimes affects stability of the amplifier circuit too much to fully secure the frequency band. Also, if the frequency band of the feedback network is not fully secured, a shoot caused in the transient response of the amplifier circuit is too much to fully secure the frequency band for the amplifier circuit as described above.

Further, it is still another problem that a load effect of the feedback network sometimes deteriorates the high-amplitude, wideband output capability of the amplifier circuit. In FIG. 2, also, parasitic capacitance and parasitic inductance of the feedback circuit elements, including the input resistor 27, the feedback resistor 7, the frequency response compensation capacitor 28, and the transistor 25 deteriorate the characteristics of the amplifier circuit. Moreover, it is still another problem that the frequency response compensation capacitor 28 makes narrower the frequency band at the time of high amplitude output as it is loaded on the amplifier circuit, although it is used to improve the transient response characteristic of the amplifier circuit.

As the display apparatus is made to have finer definition in recent years, the picture tube drive circuit tends to have higher amplitude and wider frequency band.

The following describes an example of the amplifier used as the picture tube drive circuit described in the Japanese Patent Application Laid-Open No. 60-5693.

FIG. 49 depicts a circuit diagram illustrating the prior amplifier used as the picture tube drive circuit. The amplifier used as the picture tube drive circuit, as shown in FIG. 49, has a cascade amplifier formed of a grounded-emitter transistor 310 and a grounded-base transistor 311. The transistor 310 has a video signal input thereto. The transistor 310 also has at an emitter thereof an emitter peaking circuit 312 for increasing a signal gain of the picture tube drive circuit at a high-frequency range of the video signal. The transistor 311 has at a collector thereof an output resistor 313. The output resistor 313 also is connected in series with a parallel peaking circuit coil 314 for increasing the signal gain of the picture tube drive circuit at the high-frequency range of the video signal. An output signal $V_{OUT}$ is fed out of a collector pin of the transistor 311 before being connected to the picture tube.

The amplifier constructed as described above can have a wide band because of the cascade construction and the parallel peaking. In fact, however, as shown in FIG. 50 which is a circuit equivalent to the one in FIG. 49, the transistor 311 has some parasitic capacitors amounting to a total parasitic capacitance $C_S$ added onto on the collector. The parasitic capacitors include a load capacitor 315 of capacitance $C_L$, a parasitic capacitor 316 of capacitance $C_C$ at the collector pin of the transistor 311, a parasitic capacitor 317 of capacitance $C_R$ of the output resistor 313 of resistance $R_L$, a wiring capacitor 318 of capacitance $C_P$, and an output capacitor 319 of capacitance $C_{Ob}$ of the transistor 311.

Let $f_{BH}$ denote an basic frequency band of the amplifier with no peaking made. The basic frequency band $f_{BH}$ is given by $$f_{BH} = \frac{1}{2\pi \cdot C_S \cdot R_L} \quad (1)$$

The total parasitic capacitance $C_S$ is given by $$C_S = C_C + C_P + C_R + C_L + C_{Ob} \quad (2)$$

It can be seen from Eq. (1) that the basic frequency band $f_{BH}$ is in inverse proportion to $C_S$ and $R_L$.

In the prior technique, $C_S$ is too high to make wider the frequency ban of the amplifier. If the frequency ban of the amplifier is forcibly made wider with $C_S$ being too high, the value of $R_L$ has to be reduced. As a result, it is a problem that the power consumption of the amplifier is increased.

FIG. 69 depicts a circuit diagram illustrating a prior video amplifier for use in a color CRT display. In the prior circuit shown in FIG. 69, three color video signals R(red), G(green), and B(blue) are fed from the respective signal sources 604R, 604G, and 604B through the respective video signal processor circuits 615R, 615G, and 615B to the respective cathodes 603R, 603G, and 603B of a CRT 604. The video signal processor circuits 615R, 615G, and 615B must have wide frequency band and large output power characteristics, respectively.

The following typically describes operation of the R color circuit 615R only since the other color circuits are identical. An input signal voltage Vir is applied to a base of a grounded emitter transistor amplifier 606R and is inverted and amplified at a collector thereof before being fed out as an output signal voltage Vor. The output signal is applied to the cathode 603B of the CRT 604.

An operating point of the output signal voltage Vor can be adjusted with a cut-off adjustment variable resistor 608R. A voltage gain can be adjusted with a drive adjustment variable resistor 609R. An adjustable range of the operating point of the output signal voltage Vor can be limited with a resistor 607R. A resistor 610R, like the resistor 607R, limits the voltage gain adjustable range.

A prior white balance adjustment can be made by repeating cut-off adjustments of the primary color circuits and drive adjustments of at least two primary color video amplifier circuits.

The prior white balance adjustment process is described below by reference to FIG. 70 which shows input-output characteristic curves of the video amplifier circuit. In the input-output characteristic graph in the figure, Vi denotes the input signal voltage on the axis of abscissas, and Voo denotes the output signal voltage on the axis of ordinates. A solid straight line 650 in the graph is an input-output characteristic with a target white balance secured.

In FIG. 70, assume the white balance to be in a state that the input signal voltage is at values Vic and Vid, which can be achieved with the cut-off adjustment and the drive adjustment, respectively. Also, assume an initial state of the video amplifier circuit is of a characteristic indicated by a broken line 651. With the first cut-off adjustment, the characteristic is moved, or chiefly level-shifted, to the output voltage Voo, or the one indicated by a broken line 653, as shown by an arrow 652.

With the next drive adjustment, a voltage gain adjustment indicated by an arrow 654 is made to change the characteristic to the one indicated by a broken line 655. This ends the first white balance adjustment. However, it is a problem that as can be seen by an arrow 656, the drive adjustment adversely deviates the preceding cut-off adjustment.

Therefore, the prior video amplifier circuit involves such a problem that the cut-off adjustment and the drive adjustment interfere with each other. The white balance adjustment cannot be completed unless the adjustments are repeated.

Also, in the above-described prior technique, any of the video signal processor circuits 615R, 615G, and 615B has to have a wide range of the signal voltage, including the dc component input thereto. This means that any of the video signal processor circuits 615R, 615G, and 615B has to have a wide input dynamic range. However, it is another problem that with the input dynamic range enlarged, the output dynamic range and the power supply voltage must be made high, so that the power consumption of the circuit is increased.

Further, in the above-described prior technique, if a white color temperature displayed on the picture tube (CRT) 604 is varied by a user, drive adjustment variable resistors for the primary color circuits are allowed for the user to adjust. However, when the user who has no measuring instruments is allowed to do the drive adjustment that is the same as the procedures as in factory, it may happen that the output amplitude of any of the primary color signal circuit becomes too high. This results in a deterioration of the linearity of the video circuit and the picture streaks. On the contrary, it may happen that the brightness is made too low. Therefore, it is still a further problem that the brightness is changed with the color temperature varied and further, the white balance is lost.

SUMMARY OF THE INVENTION

In view of the foregoing, it is a first object of the present invention to provide an amplifier capable of feeding out a high-amplitude, wideband signal without increasing power consumption.

If the value $C_S$ is reduced, the bandwidth of the amplifier can be made wider or can increase the value $R_L$ so that the power consumption of the amplifier can be made lower.

Therefore, a second object of the present invention is to make an amplifier have a wider frequency band or operate at a low power consumption, thus providing a wideband amplifier capable of feeding out a high-amplitude, wideband signal.

A third object of the present invention is to provide an amplifier applicable to a signal processor having at least one operating point on an input-output characteristic curve at which an input-output relationship can be held even with a varied gain. If the signal processor of the present invention is used in a video amplifier circuit, an already set cut-off adjustment cannot be deviated even with a drive adjustment made.

A fourth object of the present invention is to provide an amplifier applicable to a signal processor capable of making effective use of a signal dynamic range without enlarging the signal dynamic range.

A fifth object of the present invention is to provide an amplifier applicable to a signal processor of which a brightness cannot be changed and a white balance cannot be lost with a white color temperature changed.

In order to accomplish the above-mentioned first object, the wideband amplifier of the present invention has a first means of a peaking capacitor connected to an ordinary output end of a push-pull circuit, although in the present invention, the output end is not for output, but for setting a gain.

Also, in order to accomplish the above-mentioned first object, the wideband amplifier of the present invention has a second means of feedback network formed by connecting a feedback impeder of an output signal with a low impedance pin of an active element. Further, in order to accomplish the above-mentioned first object, the wideband amplifier of the present invention has a third means of an output signal detector section of high impedance connected with a feedback impeder. Further, in order to accomplish the above-mentioned first object, the wideband amplifier of the present invention has a fourth means of drive elements forming the push-pull circuit connected with a current signal distributor circuit. Still further, in order to accomplish the above-mentioned first object, the wideband amplifier of the present invention has a fifth means of an active element having an ac-connecting pin connected in one signal path with a part of the other signal path. Finally, in order to accomplish the above-mentioned first object, the wideband amplifier of the present invention has a sixth means of connecting a peaking element with a output resistor through a capacitor.

In order to accomplish the above-mentioned second object, the wideband amplifier of the present invention has a first means of ac-connecting one end of the output resistor. Also, in order to accomplish the above-mentioned second object, the wideband amplifier of the present invention has a second means of connecting a constant-resistance circuit between the output resistor and a collector pin of an output transistor. Further, in order to accomplish the above-mentioned second object, the wideband amplifier of the present invention has a third means of a bear chip type of output transistor in a way that parts of or all of the wideband amplifier is made a hybrid IC. Still further, in order to accomplish the above-mentioned second object, the wideband amplifier of the present invention has a fourth means of eliminating parts of a ground pattern on a rear side of a circuit board of ceramics when the wideband amplifier is made a hybrid IC.

In order to accomplish the above-mentioned third object, the amplifier applicable to the signal processor of the present invention has one input pin of an adder-subtracter connected with an output of a variable gain amplifier to which an input signal to be processed is fed. Also, a control signal source for controlling a gain of the above-mentioned variable gain amplifier is connected with the other pin of the above-mentioned adder-subtracter and to a gain control pin of the above-mentioned variable gain amplifier. Further, an output pin of the above-mentioned adder-subtracter is connected to an output pin of the signal processor of the present invention. Alternatively, the positions of the variable gain amplifier and the adder-subtracter can be replaced by each other.

In order to accomplish the above-mentioned fourth object, the amplifier applicable to the signal processor of the present invention has the input signal to be processed fed to one input Pin of a switch which is switched over on the basis of a periodically generated signal, such as a blanking signal, and has a dc signal of controllable level, such as a dc level control signal during blanking, fed to the other input pin of the switch. Also, an input pin of a dc component controller is connected to an output pin of the switch. Further, an output pin of the dc component controller is connected to the output pin of the signal processor of the present invention.

In order to accomplish the above-mentioned fifth object, the amplifier applicable to the signal processor of the present invention uses three variable gain amplifiers having a R, G, and B primary color signals input thereto, respectively. Three output pins of a gain controller are connected to the respective control pins of the three variable gain amplifiers. Output pins of the three variable gain amplifiers are connected to the respective output pins of the signal processor of the present invention.

DETAILED DESCRIPTION

Figure 2:
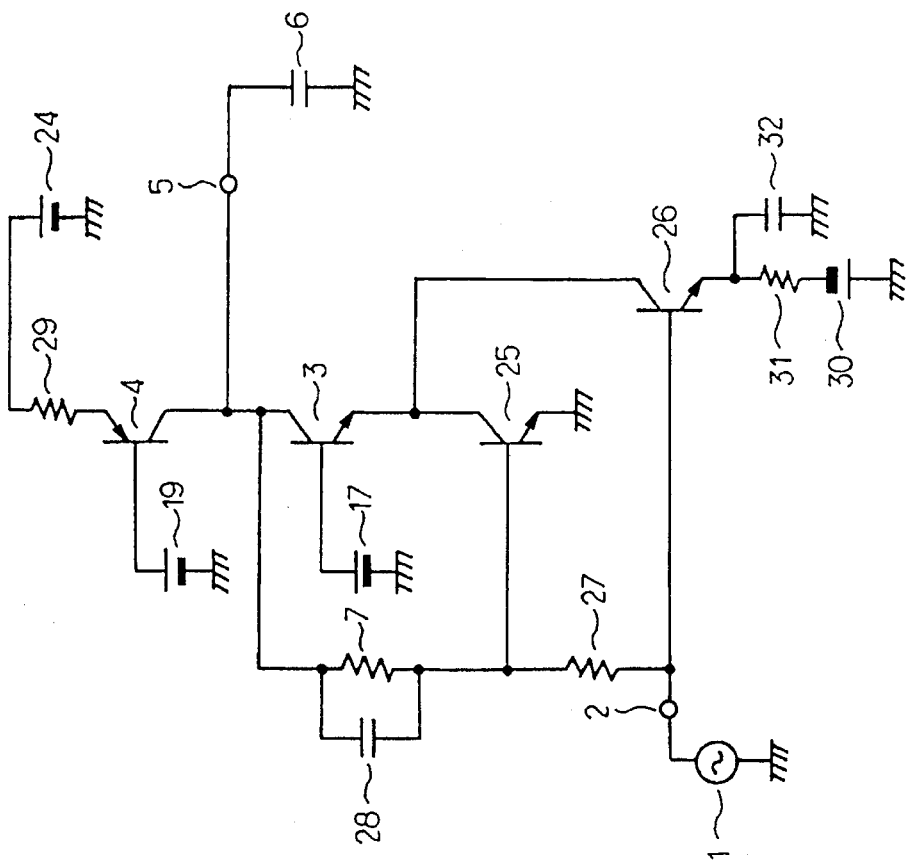
FIG. 2 is a circuit diagram illustrating a prior capacitive load drive circuit.

The first means of the peaking capacitor to accomplish the first object serves to improve the frequency response of the amplifier circuit. The push-pull circuit enhances charge and discharge of the peaking capacitor. Such features achieve the above-mentioned object.

The second means of the feedback impeder to accomplish the first object serves to feed back the output signal as current signal. The active element having the low impedance pin to which the impeder is connected serves to feed back the output signal to the input of the amplifier circuit over a wide frequency band. The feedback network is formed of the feedback impeder and the active element achieves the above-mentioned object.

The third means of the output signal detector section of high impedance to accomplish the first object serves to lead the output signal to the output pin. The feedback impeder operates to feed back the output signal to the input of the amplifier circuit while reducing the impedance of the output signal detector section to suppress the time constant. Such features achieve the above-mentioned object.

The fourth means of the drive elements forming the push-pull circuit serves to feed out the high-amplitude, wideband signal without increasing the power consumption as being complementarily operated. The current signal distributor circuit distributes the current signal over the wide frequency range from the dc component to the high-frequency component to the drive elements. Such features achieve the above-mentioned object.

The fifth means of the active element connected in the signal path the current signal distributor circuit to accomplish the first object amplifies the signal. The other signal path has a part thereof connected to the ac grounding pin to cancel the parasitic impedance of the active element connected in the signal path. Such features achieve the above-mentioned object.

The sixth means of the peaking element to accomplish the first object serves to improve the frequency response of the amplifier circuit. The output resistor serves both to determine the gain of the amplifier circuit and to damp the peaking element. The capacitor connected between the peaking element and the output resistor connects the both at frequencies at which damping is needed. Such features achieve the above-mentioned object.

With the features described above, the wideband amplifier capable of feeding out the high-amplitude, wideband signal without increasing the power consumption can be provided.

The first means of ac-connecting one end of the output resistor to accomplish the second object can reduce the parasitic capacitance $C_R$ to a great extent. Such features achieve the above-mentioned second object.

The second means of the constant-resistance circuit to accomplish the second object can cancel the parasitic capacitance $C_R$ due to the output resistor, resulting in elimination of the parasitic capacitance $C_R$. Such features achieve the above-mentioned second object.

The third means of the bear chip type of output transistor to accomplish the second object can cancel the parasitic capacitance $C_R$ of the lead frame connected to the collector of the transistor. Such features achieve the above-mentioned second object.

The fourth means of eliminating parts of the ground pattern to accomplish the second object can reduce the wiring capacitance $C_P$ between the wiring and the ground pattern on the rear side. Such features achieve the above-mentioned second object.

In the means to accomplish the third object, the variable gain amplifier varies the signal amplitude for drive adjustment on the basis of the control signal. The adder-subtracter serves to suppress the change of the output voltage with the variation of the gain. The control signal source controls the gain of the variable gain amplifier and also controls the voltage output of the signal processor. These means can provide the signal processor having the operating point at which the input-output relationship can be held even with the gain varied.

In the means to accomplish the fourth object, the switch is switched on the basis of the periodically generated signal, such as the blanking signal, to switch the input signal level to the dc level on the basis of the dc level control signal to add the dc component only for the period of switching during the blanking. The dc component controller newly controls the level of the dc component (added dc component) of the signal for which the switching has been made. These means can make effective use of the signal input dynamic range of the signal processor.

In the means to accomplish the fifth object, the three variable gain amplifiers are used for the drive adjustment to vary the respective signal amplitudes on the basis of the control signals. The gain controller controls the three variable gain amplifiers not to prevent the circuit operation without a change of the brightness. These means can provide the signal processor which does not change the brightness and is hard to lose the white balance when the color temperature is varied.

Figure 1:
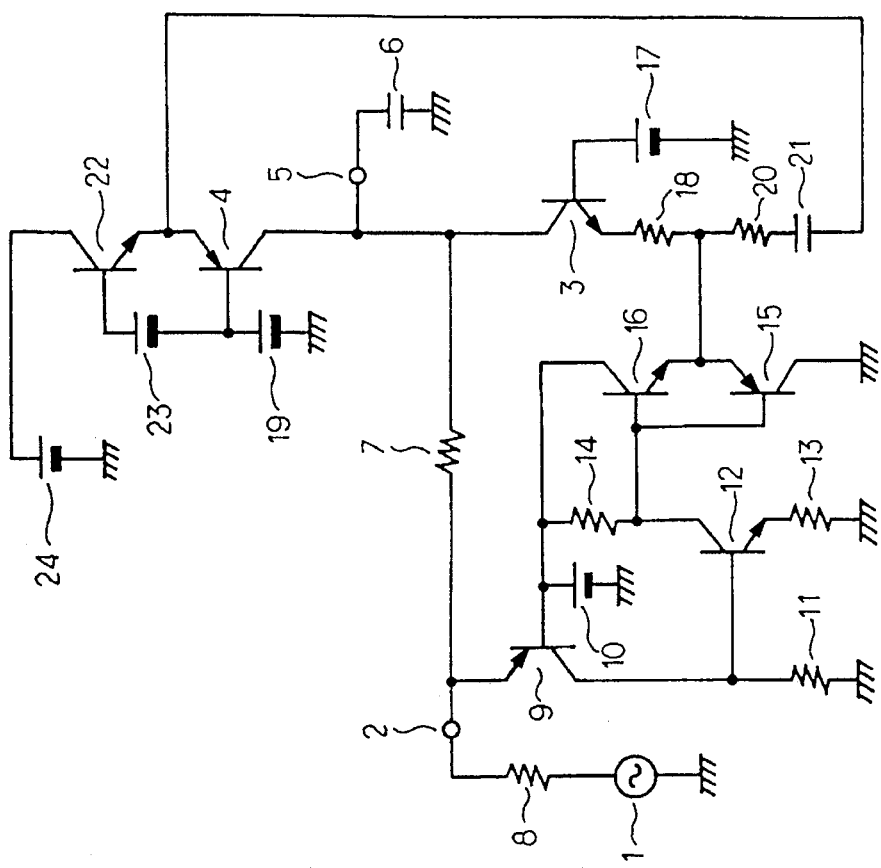
FIG. 1 is a circuit diagram illustrating a basic embodiment of the present invention for a wideband amplifier.

FIG. 1 depicts a circuit diagram illustrating a basic embodiment of the present invention for a wideband amplifier. In FIG. 1, a signal can be amplified as described below.

A voltage signal of a signal source 1 is converted to a current signal through an input impedance 8 before the current signal flows into an input pin 2 of an amplifier circuit comprising a transistor 9 and associated elements. As the amplifier circuit has a very high current gain, the input current signal is converted to an amplified voltage signal through a feedback impedance 7 before the amplified voltage signal appears across a capacitive load 6 through an output pin 5.

Also, the output voltage signal is converted to a feedback current signal through the feedback impedance 7. The feedback current signal is subtracted from the input current signal by the grounded-base transistor 9. The difference signal is converted to an error voltage signal through an impeder 11. The error voltage signal is inverted and amplified in a grounded-emitter transistor 12 before being applied to transistors 15 and 16 forming a single-ended push-pull circuit (hereinafter referred to as the SEPP).

The error voltage signal is voltage-amplified through grounded base transistors 3 and 4 forming a complementary push-pull circuit before being fed out. The impedances 8, 7, 11, 13, and 14 forming the circuit and the series compound impedance of input impedances 18, 20, and 21 of the grounded-base circuit can be formed of compound impedances of passive elements.

For example, to make a peaking characteristic at high frequencies of the amplifier circuit, the feedback impedance 7 can be formed of a series compound impedance of a resistor and a coil. To improve a transient response delay of the amplifier circuit due to an effect of a thermal time constant of the transistors, the feedback impedance 7 can be formed of a network containing a parallel compound impedance of a resistor and a capacitor.

In turn, the following describes the above-mentioned elements shown in FIG. 1 for accomplishing the present invention. The capacitor 21 serving as an input impedance for the grounded-base circuit can be also recognized as a peaking capacitor. In a previous technique, cut-off of the transistor 4 connected with the capacitor 21 prevents the output signal from having a high amplitude, wide band characteristic.

However, the present embodiment has a transistor 22 used for forming a push-pull grounded-base circuit to enhance a charge and discharge of the peaking capacitor 21 irrespective of the cut-off of the transistor 4. Biases to be set for the transistors 4 and 22 by a voltage source 23 should be preferably of class AL which cannot cut off the transistor 4, with a low-frequency signal input thereto in view of circuit operation.

However, the biases can be set to class B or C only if a plate of a power source 24 is connected with a collector of the power source 24 through a resistor to form a current path of the feedback impedance 7 through which a bias current flows into an emitter of the transistor 9. Also, the transistors 15 and 16 forming the SEPP serve for enhancing the charge and discharge of the peaking capacitor 21. The bias condition can be set in the same way as the transistors 4 and 22.

In turn, one end of the feedback impedance 7 is connected with the emitter of the transistor 9 which is a low impedance pin having a signal voltage amplitude suppressed. The end transmits the feedback signal as current signal as described above. The low impedance pin transmits the feedback signal as current signal as described above can prevent the signal current from flowing into parasitic capacitors of the end and the elements connected therewith.

Therefore, transmitting the feedback signal as a current signal can prevent the effect of the parasitic capacitors from deteriorating the frequency response of the feedback network. This means that the amplifier circuit can have a high output power in a wide frequency range. Further, as the low impedance pin has a time constant lowered, the feedback impedance 7 can be set high enough to suppress a load effect on the above-mentioned amplifier circuit.

The other pin of the feedback impedance 7 is connected with an output signal detector pin (output pin 5) having a high impedance which is a connection point of collectors of the transistors 3 and 4. With the parallel connection of the feedback impedance 7, an impedance of the output signal detector can be decreased. As a result, a time constant of the output signal detector can be suppressed to make the amplifier circuit have a frequency band of its open loop gain extended so that a frequency response of the closed loop gain can be made more flat.

The wideband amplifier in the basic embodiment of the present invention has been described by reference to FIG. 1. The following describes in detail other embodiments having means used to accomplish the present invention. Components and parts in the other figures identical with those in FIG. 1 are indicated by the same numbers as in FIG. 1.

Figure 3:
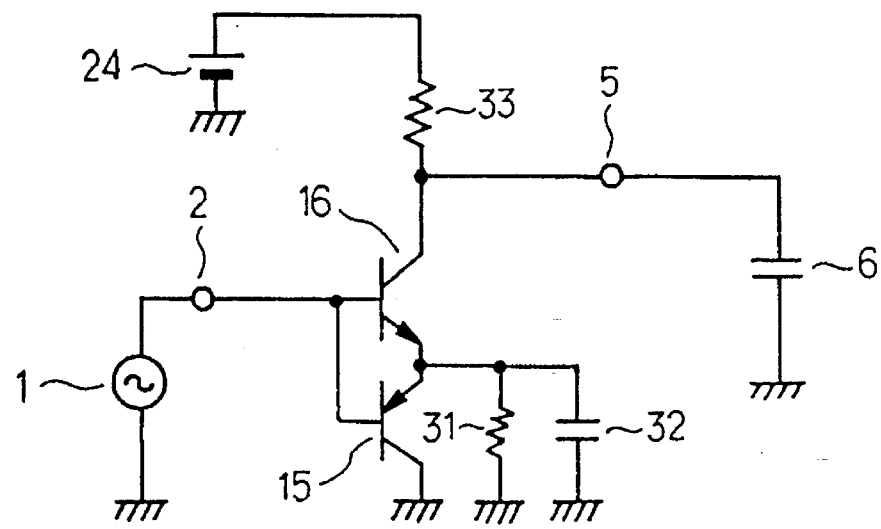
FIG. 3 is a circuit diagram illustrating an embodiment of the present invention.

First of all, FIG. 3 depicts a circuit diagram illustrating an embodiment of the present invention having the least number of component elements with use of the first means described above. In FIG. 3, a dc gain is determined in terms of a ratio of an emitter resistor 31 to an output resistor 33. A high-frequency gain is determined in terms of a ratio of a capacitance of a peaking capacitor 32 to that of the capacitive load 6. If an amplitude or a frequency of a signal input from the signal source 1 to the input pin 2 is too high, the cut-off of the transistor 16 prevents the peaking capacitor 32 from charging and discharging as described above.

In particular, if a bias current for the transistor 16 is suppressed to make lower power consumption of the amplifier circuit, the cut-off of the transistor 16 is made larger. In the embodiment, the addition of the transistor 15 enhances the charge and discharge of the peaking capacitor 32 so that application of the emitter peaking can be made stronger to make the amplifier circuit provide higher output power and wider frequency band.

In FIG. 3, the transistor 16 is set at a class AB bias at which a bias current can be made to flow at no input signal. The transistor 15 is set at class C bias at which current cannot be made to flow unless the signal amplitude is higher than a certain level. If the biases are in a range capable of enhancing the charge and discharge of the peaking capacitor 32, however, a desired bias voltage or current set circuit can be added between the bases of the transistors 15 and 16. The peaking capacitor 32 can have a desired series resistor or network inserted or added thereto to suppress too high peaking effect, thereby stabilizing the effect.

Further, to make the output power higher and the frequency band wider, the transistor 16 can have a grounded-base circuit at its collector to form a cascade construction. The output pin 5 can have an SEPP or emitter follower in front thereof.

Figure 47:
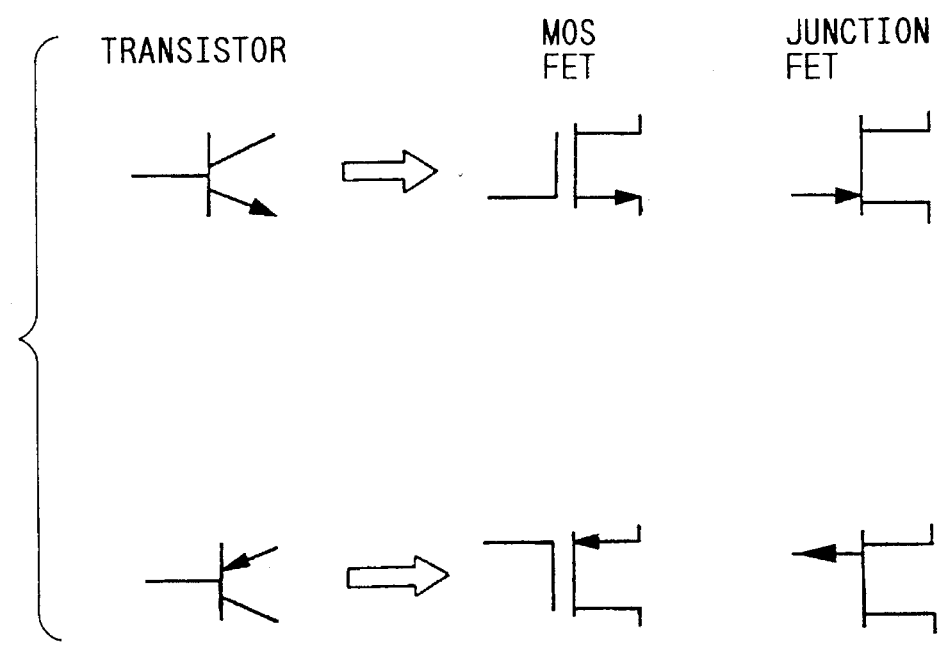
FIG. 47 is a correspondence of types of transistors to those of a field-effect transistor.

In FIG. 3, it is evident that the transistors can be replaced by field-effect transistors (FETs) of MOS or junction type. FIG. 47 depicts symbols for the types of transistors and field-effect transistors.

Figure 4:
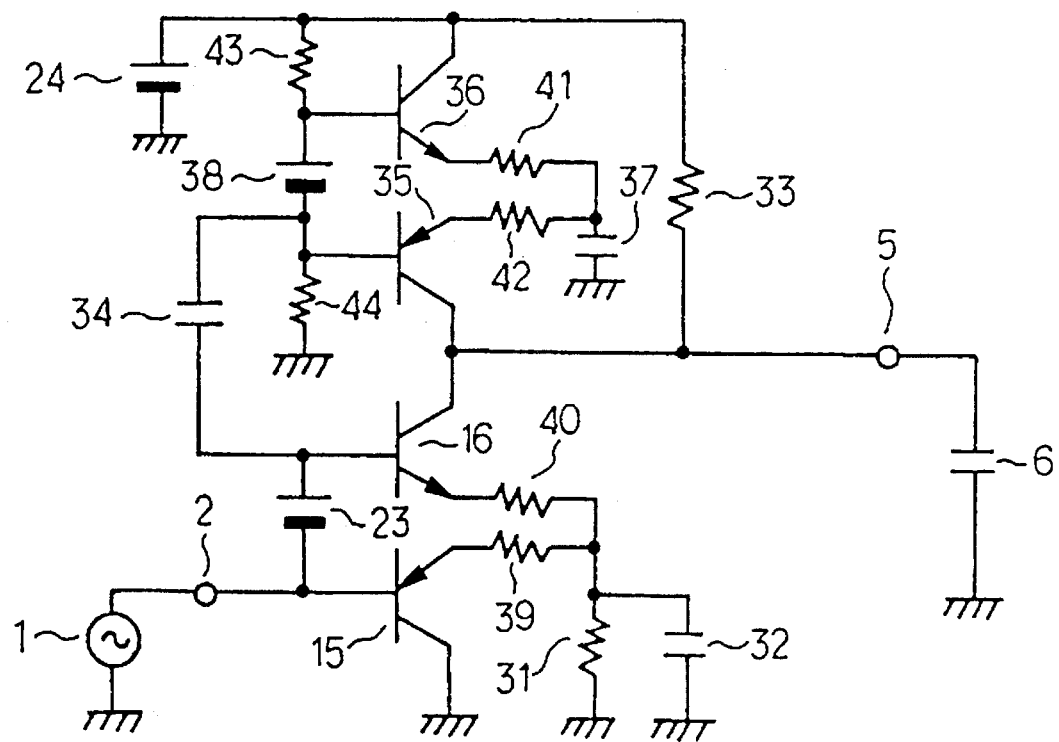
FIG. 4 is a circuit diagram illustrating still another embodiment of the present invention.

In turn, FIG. 4 depicts a circuit diagram illustrating still another embodiment of the present invention having the above-described first means used to increase symmetry of a transient response of the amplifier circuit. In FIG. 4, an SEPP comprising transistors 35 and 36 having a peaking capacitor 37 loaded thereon is driven through a coupling capacitor 34 to form a push-pull amplifier circuit.

The output pin 5 can have a signal current from a collector of the transistor 35. It is thus possible to shorten a rise time of the output voltage and a fall time as well. Emitter resistors 39 to 42 for the transistors serve to suppress instability of the SEPPs due to the capacitive loads of the peaking capacitors 32 and 37. The emitter resistors 39 to 42 also serve to set bias currents for the transistors with use of voltages of bias voltage circuits 23 and 38.

Therefore, the emitter resistors 39 to 42 can be short-circuited to eliminate or inserted in series to the bases of the respective transistors. Similarly, the bias voltage circuits 23 and 38 can be short-circuited to eliminate, and the emitter of the transistor 35 can be connected to a positive electrode of the power source 24 through a resistor to set its bias. With the bias current for the transistor 35 kept, a negative feedback path can be added as shown in FIG. 1 to stabilize the output voltage. This allows the output impedance resistor 33 to be eliminated to reduce the circuit scale and load capacity.

The amplifier circuit in FIG. 4 can be cascade-constructed and can have an SEPP or emitter follower circuit added in front of the output pin 5 as in the embodiment shown in FIG. 3. One end of the coupling capacitor 34 connected with the base of the transistor 16 can be connected to the emitter of the transistor 16 to provide a similar effect.

Figure 5:
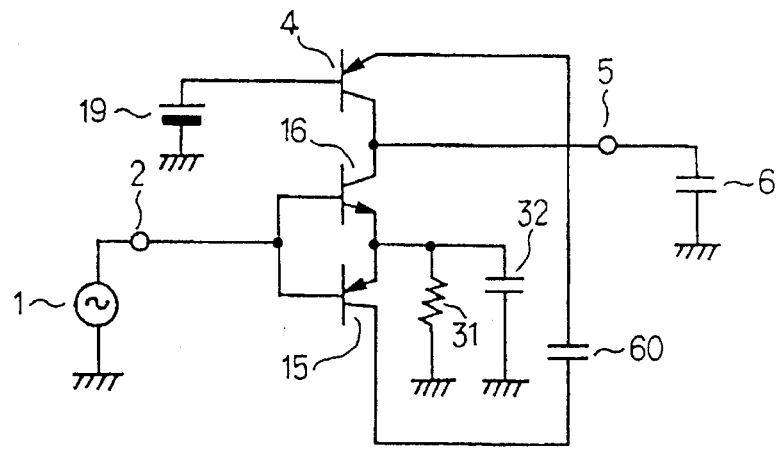
FIG. 5 is a circuit diagrams illustrating another basic embodiment of the present invention.
Figure 6:
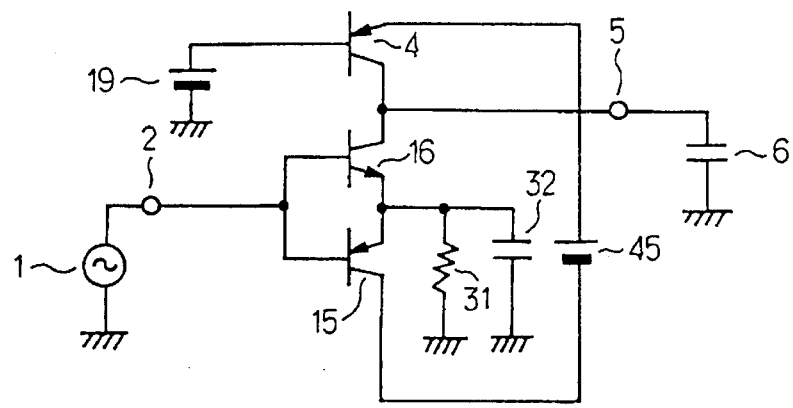
FIG. 6 is a circuit diagrams illustrating still another basic embodiment of the present invention.
Figure 7:
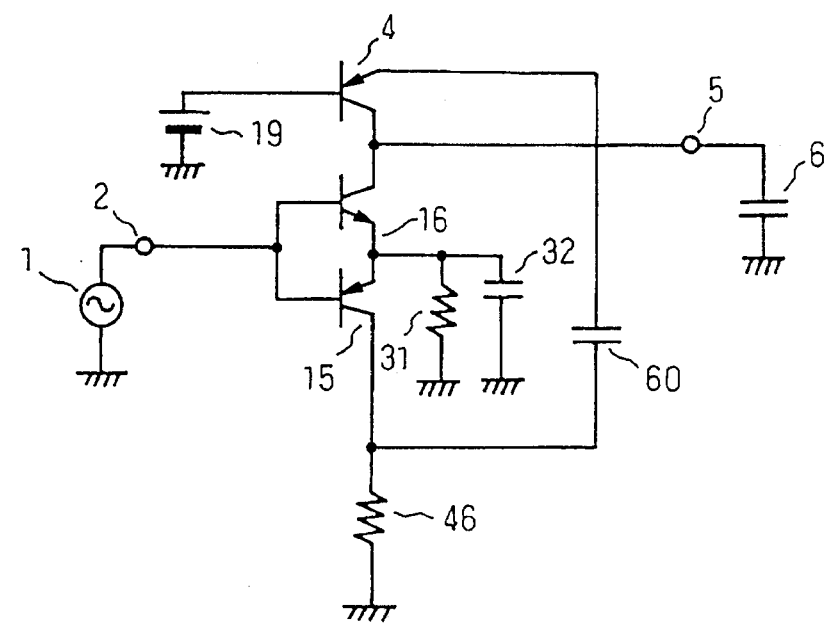
FIG. 7 is a circuit diagrams illustrating still another basic embodiment of the present invention.
Figure 8:
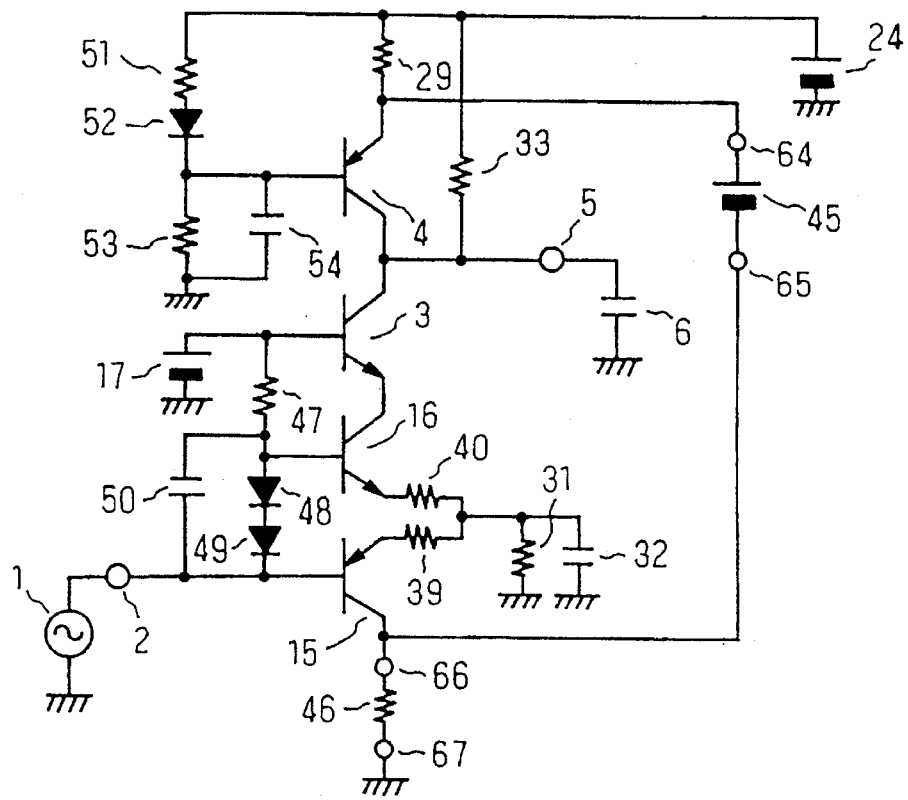
FIG. 8 is a circuit diagram illustrating a practical embodiment of the present invention.
Figure 9A:
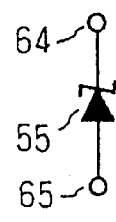
FIGS. 9(a), 9(b), 9(c), and 9(d) are circuit diagrams illustrating some elements and circuits available in the embodiments of the present invention.
Figure 9B:
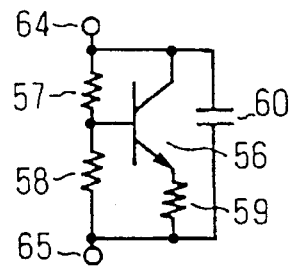
Figure 9C:
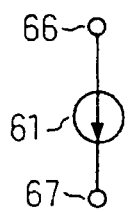
Figure 9D:
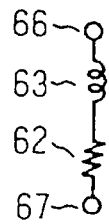

In turn, FIGS. 5, 6, and 7 depict circuit diagrams illustrating basic embodiments of the present invention to reduce a number of circuit elements for accomplishing the above-described first means. FIG. 8 depicts a circuit diagram illustrating a practical amplifier circuit of these basic embodiments.

In FIG. 8, a signal current flowing into a collector of the transistor 15 forming the SEPP is not directly discarded to the ground, but is made to flow to the output pin 5 through the grounded-base transistor 4. This makes the amplifier circuit push-pull. Such a construction can increase symmetry of a transient response of the amplifier circuit without connection of an additional transistor to form the SEPP.

Also, in FIG. 8, the input signal should drive only the single SEPP so that the characteristic deterioration of the input signal due to an internal impedance of the signal source 1 can be decreased. A bypass capacitor 50 is used to decrease a drive impedance of the transistor 16. A bias resistor 47 and diodes 48 and 49 are used to set biases for the transistors 15 and 16.

Therefore, the network formed of the diodes 48 and 49 can have further additional diodes or can be short-circuited to eliminate. The transistor 3, like the transistor 4, is grounded-base to form a cascade circuit together with the transistor 16. Bias resistors 51, 53 and 29, a temperature compensation diode 52 are to set a bias current for the transistor 4. A capacitor 54 is to decrease a ground impedance of the transistor 4.

The impeder 46 and the regulated voltage circuit 45 used to make the signal current flowing into the collector of the transistor 15 flow into an emitter of the transistor 4 can be replaced by the respective elements or circuits shown in FIGS. 9(*a*), 9(*b*), 9(*c*), and 9(*d*).

The regulated voltage circuit 45 can be replaced by an alternative zener diode 55 shown in FIG. 9(*a*) or an alternative voltage regulator circuit formed of a transistor 56 shown in FIG. 9(*b*). The regulated voltage circuit 45, further, can be replaced only by the bypass capacitor 60 shown in FIG. 9(*b*) or by a single element, such as resistor or battery. Similarly, the impeder 46 can be replaced by an alternative current regulator circuit 61 shown in FIG. 9(*c*) or an alternative series compound impeder formed of a coil 63 and an impeder 62 shown in FIG. 9(*d*). The impedance network shown in FIG. 9(*d*) can increase a peaking effect at a desired frequency.

Figure 10:
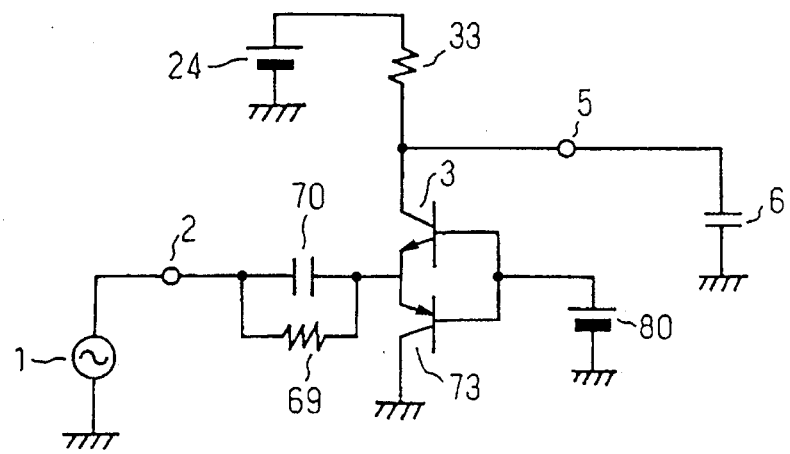
FIG. 10 is a skeleton illustrating still another embodiment of the present invention.
Figure 11:
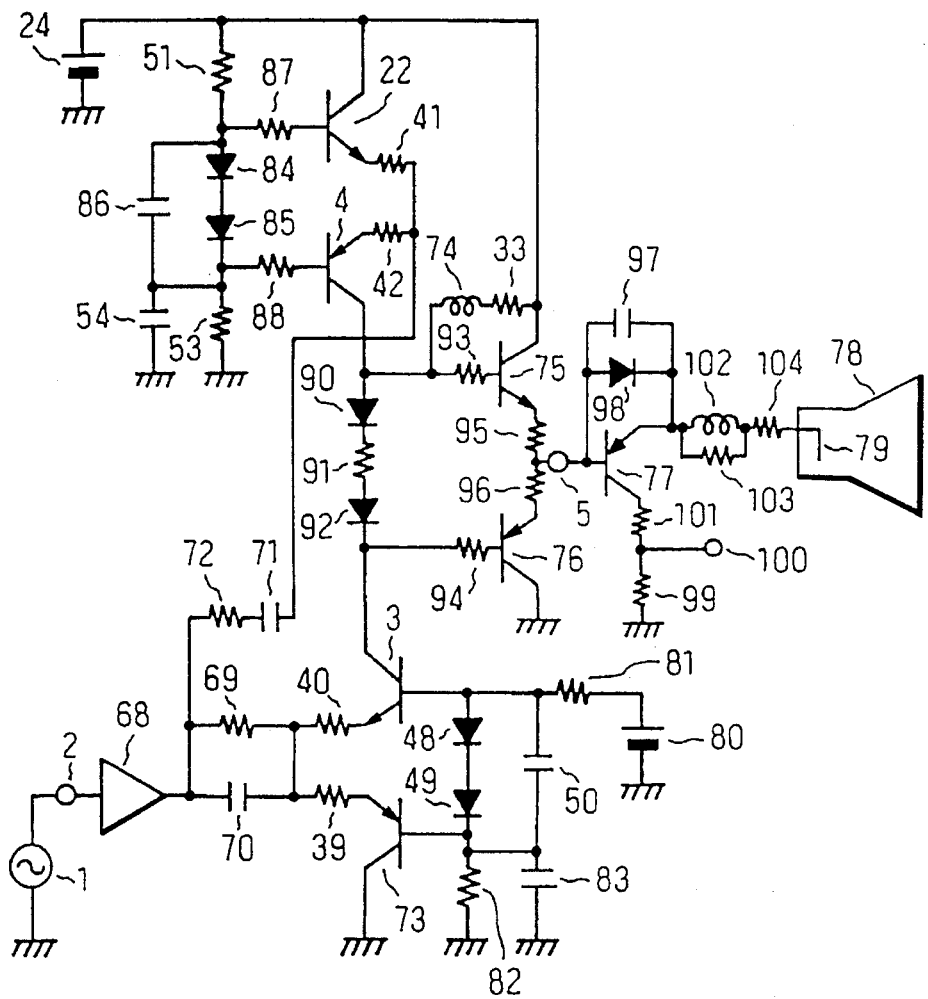
FIG. 11 is a circuit diagram illustrating a practical embodiment of the present invention.

In turn, FIG. 10 depicts a circuit diagram (skeleton) illustrating a basic embodiment of the present invention for driving a picture tube with use of the above-described first means. In FIG. 10, respective emitters and bases of a pair of complementary base-grounded transistors 3 and 73 are connected to one another, to form a push-pull Class B amplifier circuit. If a signal fed to the emitters of the transistors 3 and 73 is larger than the voltage of the positive polarity terminal of the power source 80 plus a base-emitter cutin voltage of about 0.7 V, for example, of the transistor 73, the transistor 73 is turned on and discharges a charge from a capacitor 70, and if the signal is smaller than the voltage of the positive polarity terminal of the power source 80 minus a base-emitter cut in voltage of about 0.7 V, for example, of the transistor 3, the transistor 3 is turned on and discharges a charge from the capacitor 70. This structure can retain superior high-frequency characteristics inherent in the base-ground transistors 3 and 73 even if amplitudes of signals become large. FIG. 11 depicts a circuit diagram illustrating a practical amplifier circuit of the basic embodiment. In FIG. 11, an output signal amplified through a voltage buffer 68, a grounded-base circuit, and an SEPP is applied to the picture tube 78 through a cathode current detector circuit.

In the amplification process, in general, the voltage buffer 68 and the grounded-base circuit make effective use of characteristics of active elements so that a better frequency response can be easily obtained. A fabrication cost of the amplifier circuit therefore can be easily reduced. Operation of the embodiment in FIG. 11 is described below. An input signal is passed through the voltage buffer 68 formed of an emitter follower circuit and a low output impedance circuit, such as an SEPP. A signal output of the voltage buffer 68 is applied to a parallel compound impeder formed of a series compound impeder of an impeder 72 and a peaking capacitor 71, an impeder 69, and a peaking capacitor 70.

The other ends of the compound impeders are connected to the emitters of the respective grounded-base transistors 4 and 3. The signal voltage is converted to current. The current flows into the output resistor 33 connected in series with a peaking coil 74 before being fed out as a voltage signal amplified in a wide band. In amplification, even if cut-off of the transistors 3 and 4 is frequently repeated as the bias current is reduced for low power consumption, an effect of the push-pull operation of additional transistors 73 and 22 can enhance charge and discharge of the peaking capacitors 70 and 71.

Bias conditions for the transistors 22 and 4 and 3 and 73 are set in terms of the emitter resistors 39 to 42 for the transistors and temperature compensation diodes 48 and 49 and 84 and 85, respectively. Capacitors 50 and 83 and 86 and 54 are bypass capacitors for decreasing impedances at ac grounding points. Similarly, bias conditions for transistors 75 and 76 are set in terms of a bias impeder 91 and emitter impeders 95 to 96 and temperature compensation diodes 90 and 92, respectively.

If used for the picture tube drive circuit, the above-mentioned emitter impeders 95 to 96 serve also as protection elements against discharge in the picture tube 78. The above-mentioned cathode current detector circuit formed of a transistor 77 can detect a pin current of a cathode 79 corresponding to a brightness to control an intensity of the picture tube 78. The transistor 77 is an emitter follower circuit to send the above-mentioned output signal to the picture tube 78 and at the same time, convert the cathode current flowing into an emitter thereof to voltage through a detection resistor 99 connected with a collector thereof before feeding the voltage out to a detection output pin 100.

A capacitor 97 is a bypass capacitor for compensating an asymmetry of a transient response of the emitter follower circuit formed of the transistor 77. A diode 98 is a protection element for securing a reverse voltage endurance for the transistor 77. An impeder 101 is inserted in series between the a parasitic capacitance of the transistor 77 and the ground to prevent a load capacity of the amplifier circuit from increasing. A coil 102 and a damping resistor 103 are elements for dc peaking. An impeder 104 is a protection circuit for the amplifier circuit against discharge in the picture tube.

Figure 12:
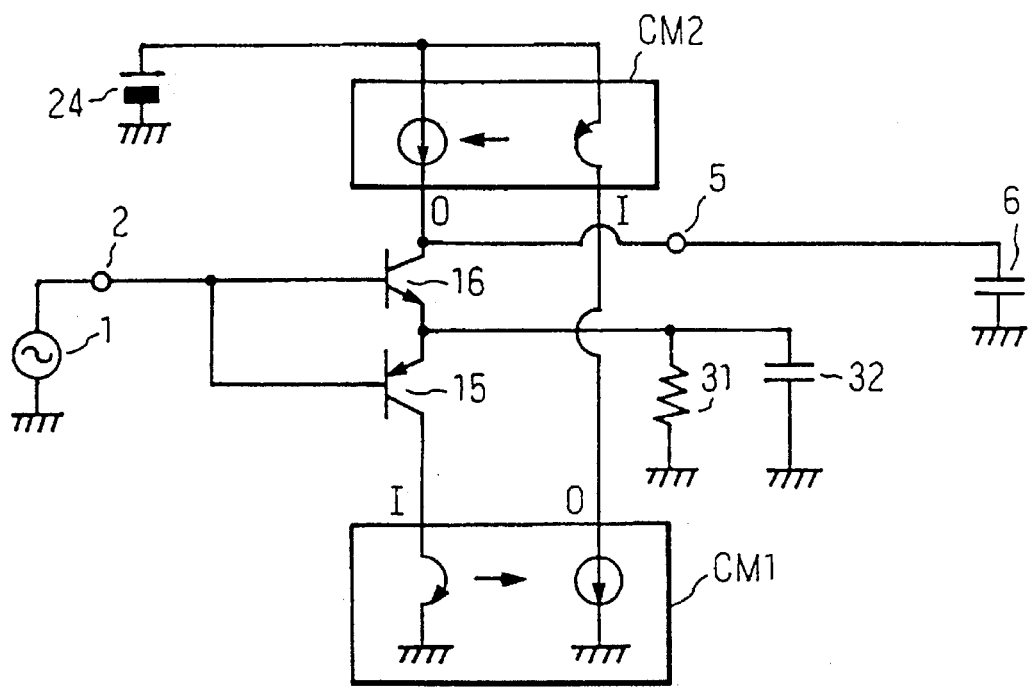
FIG. 12 illustrates still another embodiment of the present invention.
Figure 13:
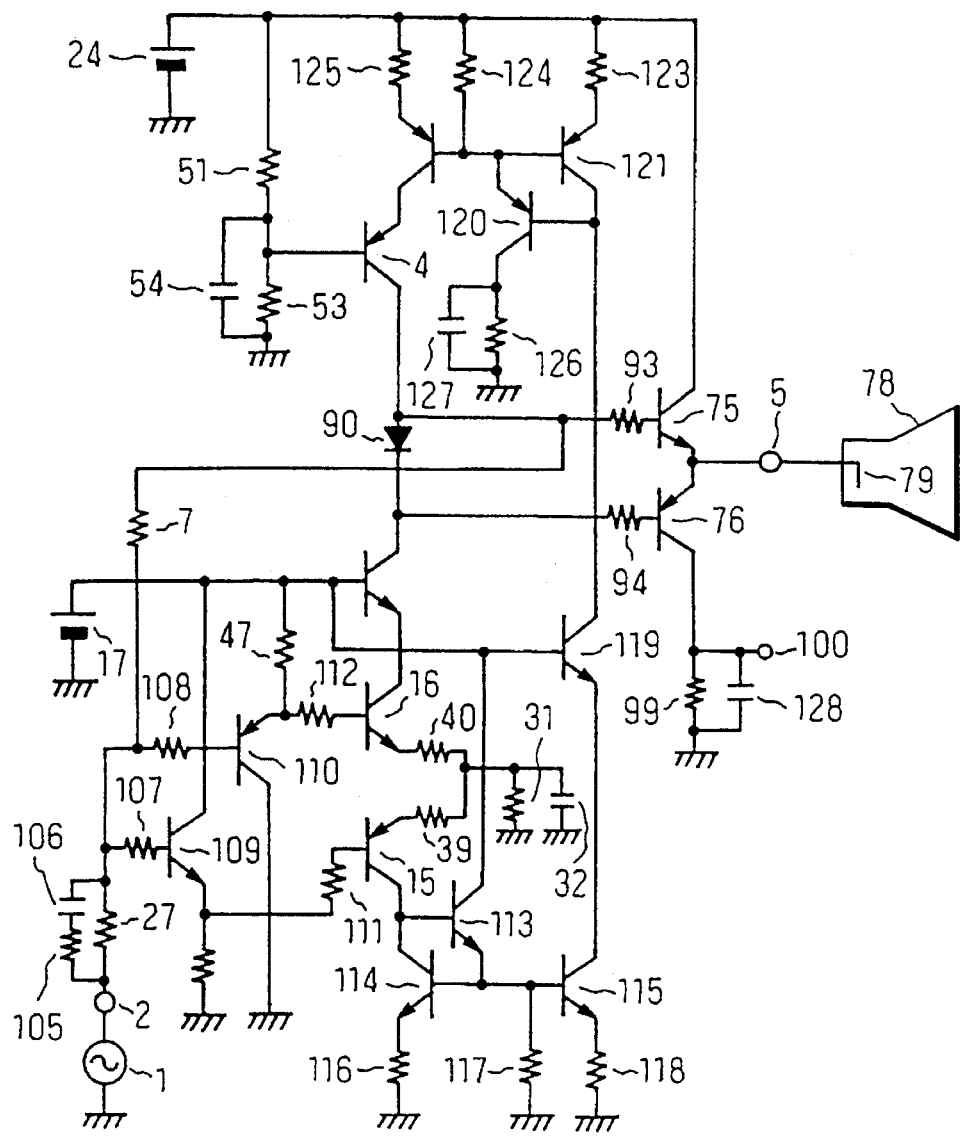
FIG. 13 is a circuit diagram illustrating a practical embodiment of the present invention.

In turn, FIG. 12 depicts a skeleton illustrating still another embodiment of the present invention for driving the picture tube with use of the above-described first means. FIG. 13 depicts a circuit diagram illustrating a practical amplifier circuit of the embodiment. In FIG. 13, as easily understandably shown in FIG. 12, current mirror circuits CM1 and CM2 are used to supply both components of charge and discharge currents flowing into a peaking capacitor to a load.

In FIG. 13, an signal input from the signal source 1 is applied to transistors 15 and 16 forming a SEPP through transistors 109 and 110 forming an emitter follower circuit. The transistors 15 and 16 which are reverse in polarity to each other serve also as a bias voltage source for the transistors 15 and 16. A compound circuit with the SEPP formed of the transistors 15 and 16 is referred to as the "diamond circuit" and is often used for many purposes.

The above-mentioned charge and discharge current flowing into the peaking capacitor 32 contains a current component flowing into the transistor 15. The current component is fed to bases of the transistors 75 and 76 forming the SEPP through the current mirror circuit formed of transistors 113, 114, and 115 and through the current mirror circuit formed of transistors 120, 121, and 122 on the positive electrode side of the power source 24. The above-mentioned charge and discharge current also contains a current component flowing into the transistor 16. This current component is fed to the bases of the transistors 75 and 76 complementarily to a collector current of the transistor 122. A voltage at an output pin 5 can be stabilized as controlled by a negative feedback of a base voltage of the transistor 75 through the feedback impedance 7 and an input impeder 27.

With the current mirror circuits described above, a transient response characteristic of the output voltage can be improved in a wide frequency range in which a collector current of the transistor 15 flows. Increase of a power consumption due to flow of the above-mentioned charge and discharge current into the transistor 121 can be suppressed by properly setting ratios of an impeder 116 to an impeder 118 and an impeder 123 to an impeder 125 for determining the respecting ratios of the input currents to the output currents of the above-mentioned current mirror circuits.

To decrease a power consumption of the transistor 120, a resistor 126 is connected with a collector thereof. To prevent a mirror effect from adversely affect a base side of the transistor 120, a bypass capacitor 127 is connected in parallel with the resistor 126. The grounded-base transistors 3 and 4 and a grounded-base transistor 119 form respective cascade circuits with the respective preceding stages to suppress the mirror effects.

The cathode current can be detected from a collector current of the transistor 76 biased to class AB by the diode 90 at pin 100 through the detection resistor 99. A capacitor 128 is a bypass capacitor like the capacitor 127. A series compound circuit of a resistor 105 and a capacitor 106 is added in parallel with the above-mentioned to extend the frequency band of the amplifier circuit. In FIG. 8, base resistors 93 and 94, 107 and 108, and 111 and 112 for the respective transistors are stabilizing resistance to parasitic oscillations.

Each of the embodiments of the present invention described so far has the push-pull circuit to enhance the charge and discharge of the peaking capacitors, thereby accomplishing the wideband signal amplifier circuit. However, the elements themselves are involved in series resonances if the peaking capacitors are used at frequencies as high as up to 100 MHz or if their capacitances have to be increased for use in a capacitive load drive circuit of high gain. The signal waveform is abruptly distorted because of sudden change of the frequency response around the resonant frequency.

FIGS. 14(a), 14(b), 14(c), and 14(d) depict circuit diagrams illustrating embodiments of capacitors suitable as the peaking capacitors of the present invention. The circuit shown in FIG. 14(a) has a parallel compound capacitor between pins 129 and 130 for use as the above-mentioned peaking capacitor. The parallel compound capacitor has a plurality of capacitors 131 to 133 of small capacitances connected in parallel to resonate at high series resonant frequencies.

Figure 14A:
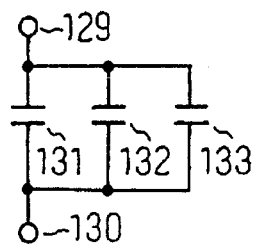
FIGS. 14(a), 14(b), 14(c), and 14(d) are circuit diagrams illustrating embodiments of peaking capacitors for use in the wideband amplifier circuit of the present invention.
Figure 14B:
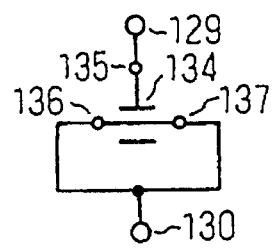

The circuit shown in FIG. 14(b) has a through-hole capacitor 134 having a mounting metal thereof connected with the pin 129 and having lead wire pins 136 and 137 thereof short-circuited together and connected with the pin 130 for use as the above-mentioned peaking capacitor. The through-hole capacitor is a capacitor having the lead wire made passed through a pipe thereof to have a capacitance between the lead wire and the pipe.

In general, the through-hole capacitor has a feature that the series resonant frequency can be made very high as the lead wire is reduced. The series resonant frequency can be made further high as the lead wire is shortened as shown. Note that either of the lead wire pin side or the mounting metal side can be made the ac grounding side.

Further, the circuit shown in FIG. 14(b) can be made to have a parallel compound capacitor as shown in FIG. 14(a) to make the series resonant frequency still further high, like the circuits in FIGS. 14(c) and 14(d), which will be described below. Alternatively, the through-hole capacitor can be replaced by a three-electrode capacitor. The three-electrode capacitor, like the through-hole capacitor, should be short-circuited between its conducting pins to form a two-electrode circuit. The two-electrode circuit can be used as the peaking capacitor to make the resonant frequency higher.

Figure 14C:
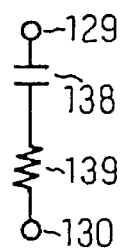

In turn, to make the peaking capacitor effective also around the series resonant frequency, as shown in FIG. 14(c), a series resistor 139 can be inserted to suppress an affect due to the resonance. To make effective the peaking at further higher frequency, as shown in FIG. 14(d), a capacitor 142 having higher resonant frequency than a capacitor 140 can be added in parallel.

Figure 14D:
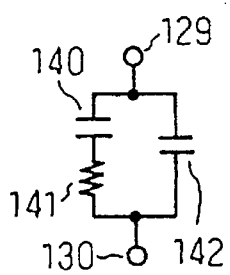

Further, the circuit in FIG. 14(c) or 14(d) or a capacitor is connected between one of the two conducting pins of the through-hole capacitor and a pin other than the two conducting pins, and a capacitance between the other pin of the two pins and a pin other than the two conducting pins can be used as the peaking capacitor, thereby providing the same effect as above.

Figure 15:
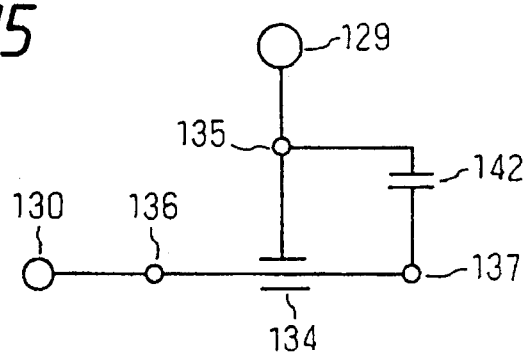
FIG. 15 is a circuit diagram illustrating an embodiment of another peaking capacitor for use in the wideband amplifier circuit of the present invention.
Figure 16:
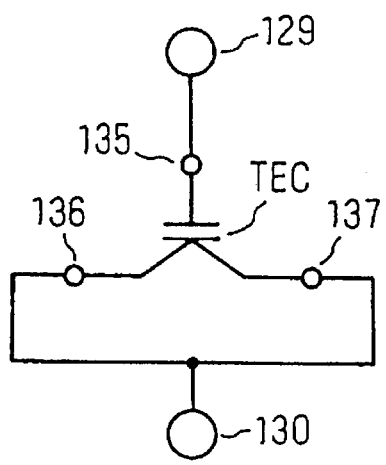
FIG. 16 is a circuit diagram illustrating an embodiment of still another peaking capacitor for use in the wideband amplifier circuit of the present invention.

FIG. 15 depicts a circuit diagram illustrating an embodiment of the peaking capacitor in such a circuit construction as described above. FIG. 16 depicts a circuit diagram illustrating another embodiment of the peaking capacitor. In FIG. 16, TEC indicates the three-electrode capacitor.

Figure 17:
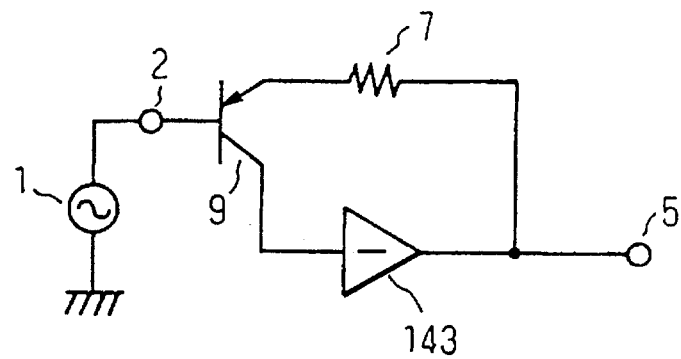
FIG. 17 is a circuit diagram illustrating an embodiment of the present invention.

In turn, FIG. 17 depicts a circuit diagram illustrating an embodiment of the present invention capable of feeding back an output signal as a current signal in a wide frequency range, with the above-mentioned second means used to connect a feedback impeder with a low impedance pin of an active element.

In FIG. 17, a feedback impeder 7 is connected with an emitter of the transistor 9. A wideband, positive-phase, current signal can be taken out of a collector of the transistor 9. Such a low impedance of an emitter of the transistor 9 can suppress increase of a time constant due to various parasitic capacitors.

A signal input from a pin 2 to a base of the transistor 9 is subtracted from the fed-back wideband current signal. A difference of reverse phase can be taken out of the collector of the transistor 9. The compound signal obtained from the collector of the transistor 9 is amplified by an inverted amplifier 143 before being fed out of a pin 5.

In particular, if the output of the inverted amplifier 143 is made of a dynamic load type comprising only a push-pull circuit of a complementary active element without output resistor, the embodiment is preferable. For the dynamic load type can make higher the impedance at the output point having the feedback impedance 7 connected therewith to make the bandwidth further wider, as will be described later.

Figure 18:
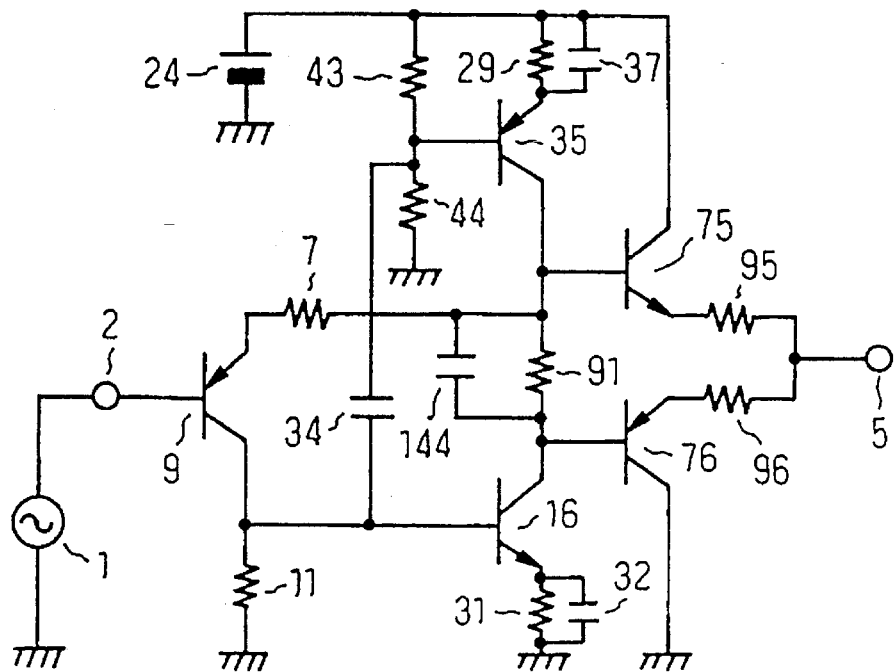
FIG. 18 is a circuit diagram illustrating a practical embodiment of the present invention.

In turn, FIG. 18 depicts a circuit diagram illustrating an embodiment of the present invention in which the above-mentioned second means shown in FIG. 17 is accomplished with use of the inverted amplifier having the push-pull circuit. In FIG. 18, the inverted amplifier is an emitter-based circuit formed of transistors 16 and 35, the bases of which are connected together through the coupling capacitor 34. A signal output of the inverted amplifier is fed out of a pin 5 through a SEPP formed of transistors 75 and 76.

A negative feedback is made through the feedback impedance 7 to stabilize the output. In FIG. 18, a connection point of the feedback impedance 7 for detection of the output voltage is made at a collector of the transistor 35 to make the bandwidth wider, as will be described later. Alternatively, the connection point can be made at an emitter of the transistor 75 or the pin 5 if the output voltage appears.

An additional signal current enhancing impeder can be inserted between an emitter of the transistor 9 and a point, like an ac grounding point, other than the above-mentioned connection point of the feedback impedance 7 for detection of the output voltage to increase the voltage gain of the entire circuit. A bypass capacitor 144 can feed the signal current, not through a bias impeder 91, to intensely drive the transistors 75 and 76.

Figure 19:
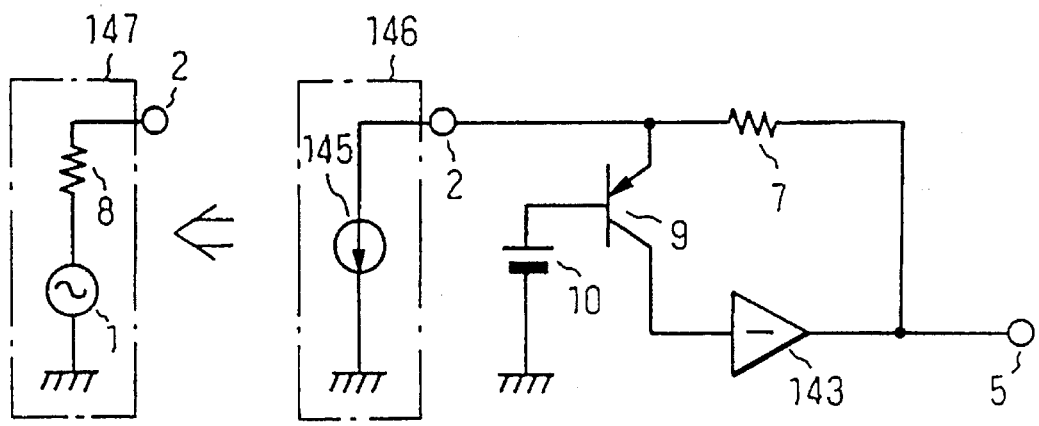
FIG. 19 is a circuit diagram illustrating another embodiment of the present invention.

In turn, FIG. 19 depicts a circuit diagram illustrating an embodiment of the present invention in which the above-mentioned second means is used to make the frequency band further wider. In FIG. 19, a low impedance pin of an active element 9 having the feedback impedance 7 connected therewith has a current signal input thereto through a pin 2 from a signal current source 145. With the current input type, a feature of short time constant at the above-mentioned low impedance pin can make wider also a frequency bandwidth in the signal input path.

Further, a grounded-base type of the transistor 9 in FIG. 19 can suppress an effect due to the mirror effect at the input pin 2. A signal source 146 having a signal current source 145 used therein, as shown in FIG. 19, can be replaced by a signal source 147 having the signal source 1 used therein by taking a signal impedance into account or by serial insertion of the input impeder 8 for voltage-current conversion. The inverted amplifier 143 can be made of a desired type of circuit.

Figure 20:
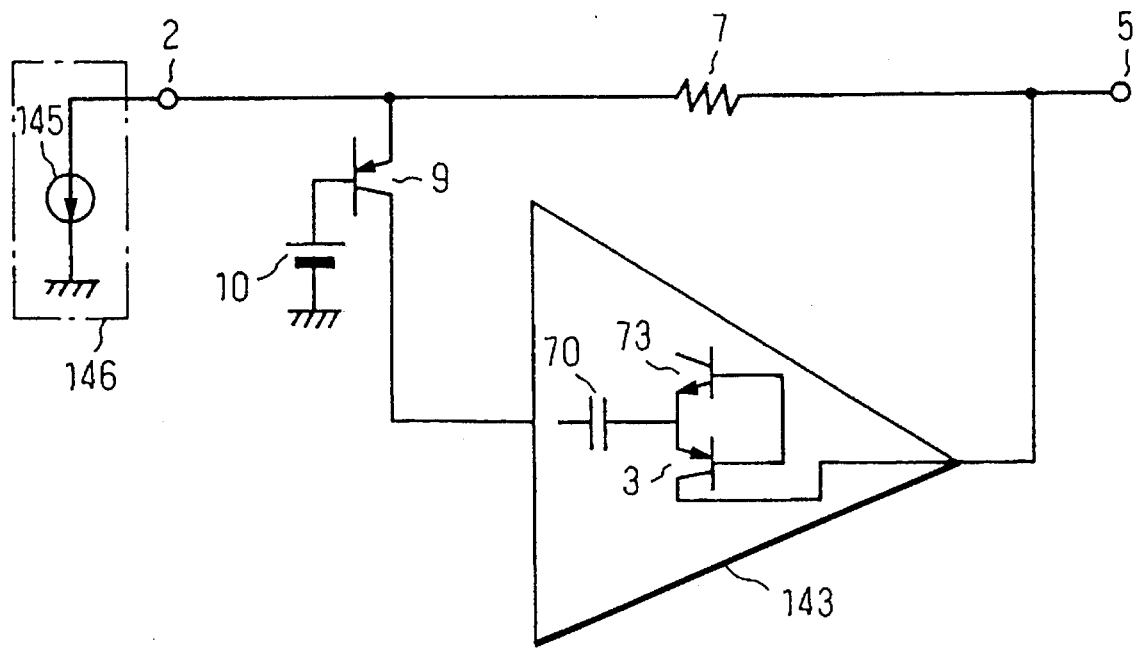
FIG. 20 illustrates another embodiment of the present invention.
Figure 21:
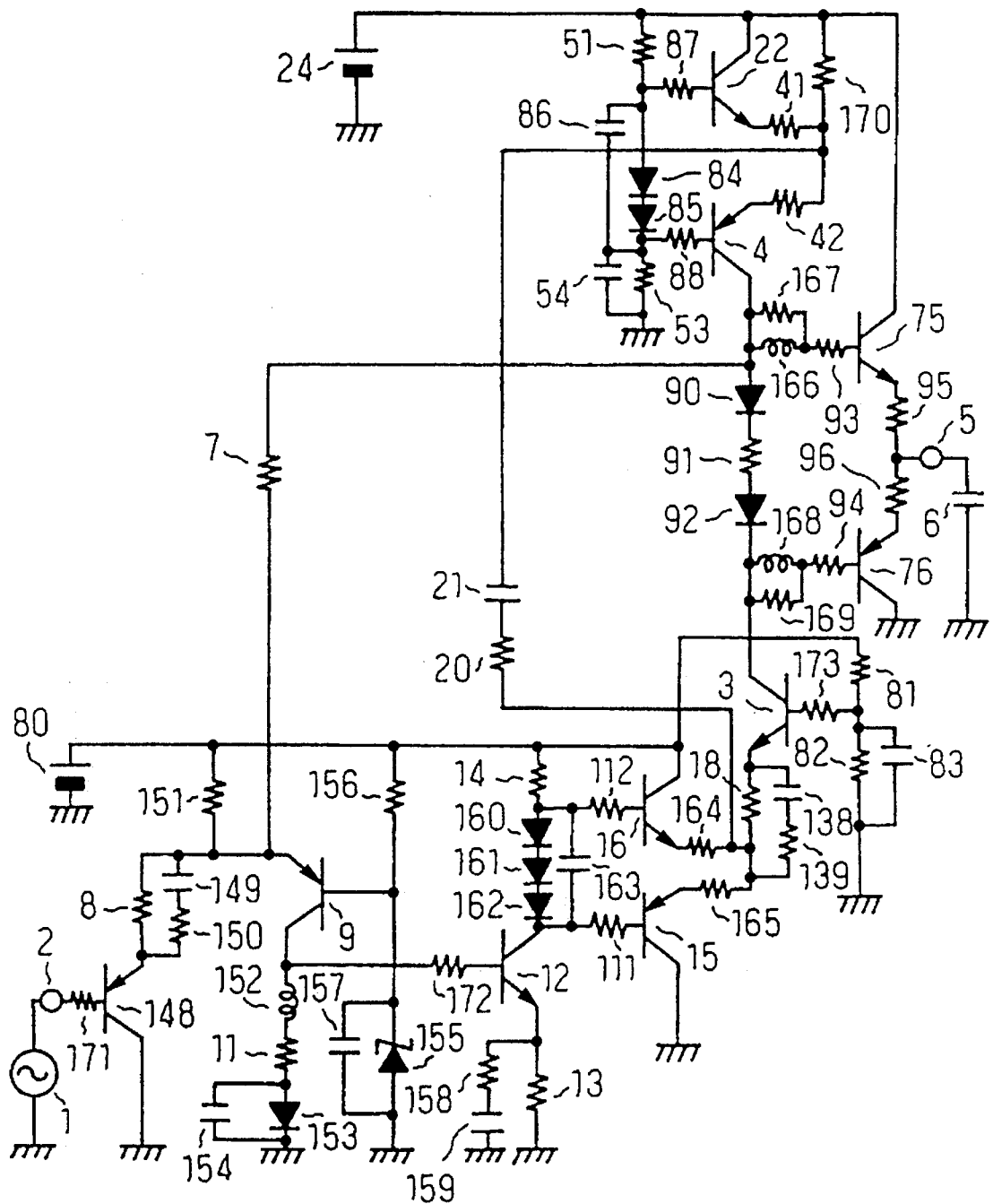
FIG. 21 is a circuit diagram illustrating a practical embodiment of the present invention.

In turn, FIG. 20 depicts a skeleton illustrating an embodiment of the present invention in which the frequency band is further wider with various peakings provided in the embodiment shown in FIG. 19. FIG. 21 depicts a circuit diagram illustrating a practical circuit of the embodiment. In FIG. 20, the inverted amplifier 143 is formed of the circuit shown in FIG. 10.

In FIG. 21, like the operation of the embodiment in FIG. 1, an input signal is converted to current through a transistor 148 and the input impeder 8 before being amplified and inversely converted to voltage by a negative feedback action of a succeeding amplifier stage through the feedback impedance 7.

The following describes the peakings shown in the figure. A capacitor 149 and a resistor 150 enhance high-frequency components in the above-mentioned current conversion. A coil 152 is a parallel peaking element for suppressing a frequency band deterioration due to parasitic capacitors of the transistors 9 and 12. Also, the capacitors 21 and 138 and a capacitor 159 are peaking capacitors. Coils 166 and 168 and damping resistors 167 and 169 are serial peaking elements for suppressing a frequency band deterioration due to parasitic capacitors of the transistors 75 and 76.

The following describes bias diodes in the figure. A diode 153 applies a bias to the transistor 12 and at the same time, suppresses a resistance of the impeder 11 together with a bypass capacitor 154 to reduce its time constant, thereby providing an effect of a wider frequency band. A zener diode ac-grounds the base of the transistor 9 in an interaction with a bypass capacitor 157. Diodes 160 to 162 biases the transistors 15 and 16 to class AB in an interaction with a bypass capacitor 163.

The transistors 15 and 16 forming the SEPP can have a bias current sufficient to make switching of the both transistors higher to increase the drive powers for the succeeding grounded base transistors 3 and 4. The diodes 84 and 85 and a bias resistor 170 bias the transistor 4 to class AB and the transistor 22 to class C.

As described above, the grounded-base transistor 22 enhances charge and discharge of the capacitor 21, thereby providing intense peaking. The bypass capacitors 54 and 86 ac-grounds the transistors 4 and 22. The diodes 90 and 92 and the bias resistor 91, as described above, bias the transistors 75 and 76 to class AB.

Figure 22:
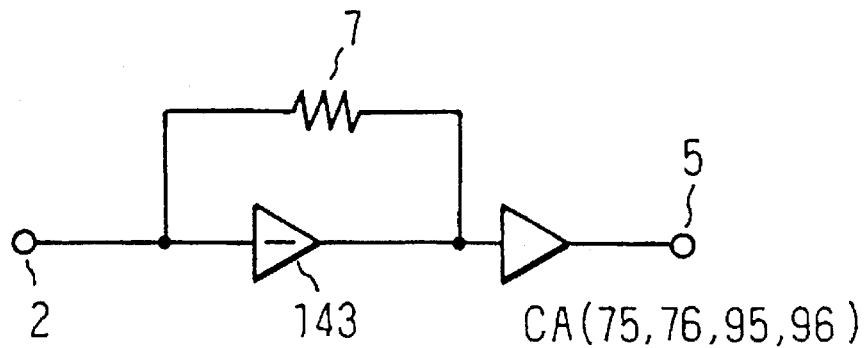
FIG. 22 illustrates another embodiment of the present invention.
Figure 23:
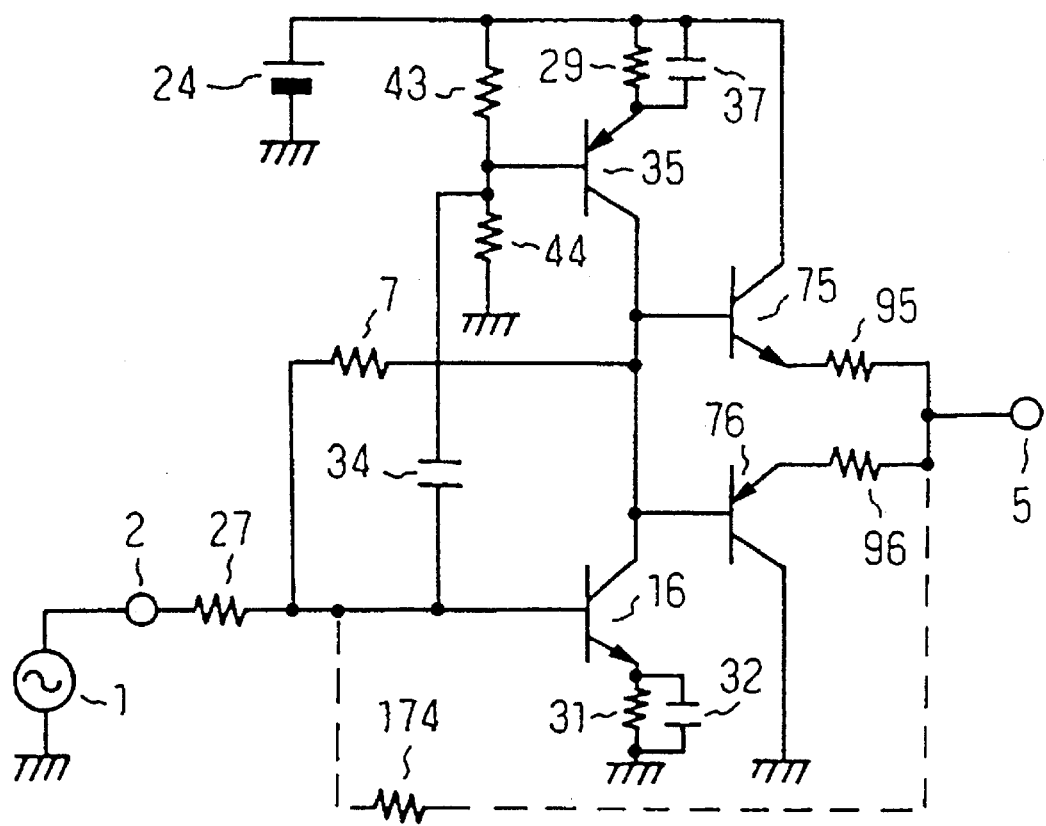
FIG. 23 is a circuit diagram illustrating a practical embodiment of the present invention.

In turn, FIG. 22 depicts a skeleton illustrating an embodiment of the above-mentioned third means in which a feedback impeder is connected to an output signal detector having a high impedance. FIG. 23 depicts a circuit diagram illustrating a practical circuit of the embodiment. In FIG. 22, CA indicates an impedance conversion amplifier formed of the transistors 75 and 76 and the resistors 95 and 96 in FIG. 23.

In FIG. 23, the feedback impedance 7 is connected at an interconnection point of the collectors of the transistors 16 and 35 having the high impedances to decrease the output impedance at the pin 5 through the SEPP formed of the transistors 75 and 76.

The previous amplifier circuits, as shown by a broken line in FIG. 23, usually exclude the feedback impedance 7 and have a feedback impeder 174 connected with the output pin 5 of low impedance to suppress a load effect of the feedback impedance 7. However, if the high-impedance output point is left as in the previous amplifier circuits, the frequency response of open loop gain of the amplifier circuit is increased too high at low frequencies by a very high time constant at the output point as shown by a solid curve 175 in FIG. 24(a).

Figure 24A:
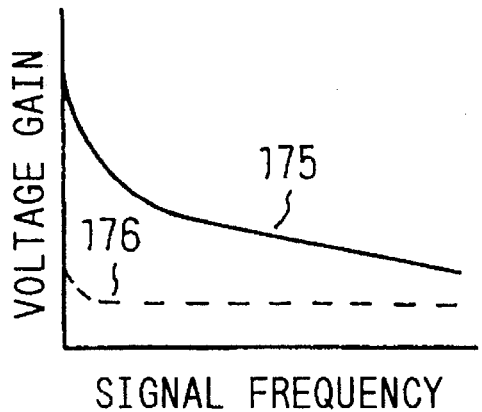
FIGS. 24(a) and 24(b) are characteristic curves illustrating effects of an embodiment of the present invention.

If the difference of the open loop gain is too much as such, the increase of the closed loop gain at low frequencies cannot be suppressed, as shown by a broken curve 176 in FIG. 24(a), however negative feedback is provided to make the gain flat. However, the embodiment of the present invention can properly reduce the time constant at the output point with the feedback impeder connected at the output point of high impedance. The frequency response of the open loop gain can be suppressed to a necessarily lowest gain at low frequencies as shown by a solid curve 177 in FIG. 24(b).

Figure 24B:
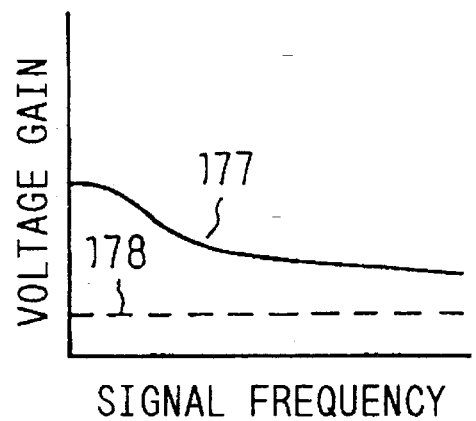

Therefore, the gain can be made further flat with the negative feedback so that frequency response of the closed loop gain can be made flat as shown by a broken line in FIG. 24(b), thereby widening the frequency band of the amplifier circuit.

In FIG. 23, the SEPP formed of the transistors 75 and 76 is used to decrease the output impedance at the pin 5. Instead of the SEPP, the present invention can use a buffer amplifier, such as an emitter follower having a current amplification capability. Further, the output point having the high impedance before connection of the feedback impeder can be directly connected to the output pin 5 without the buffer amplifier. In this case, the output impedance of the amplifier circuit can be decreased by the negative feedback action.

Figure 25:
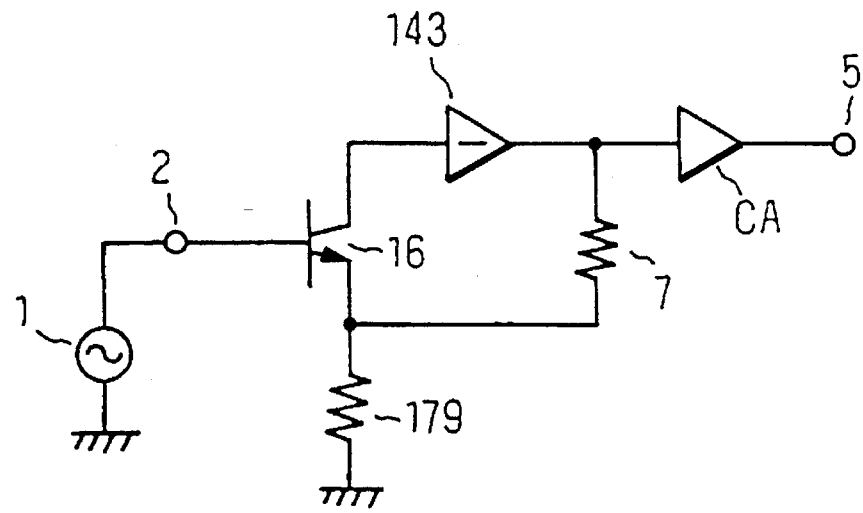
FIG. 25 illustrates another embodiment the present invention.
Figure 26:
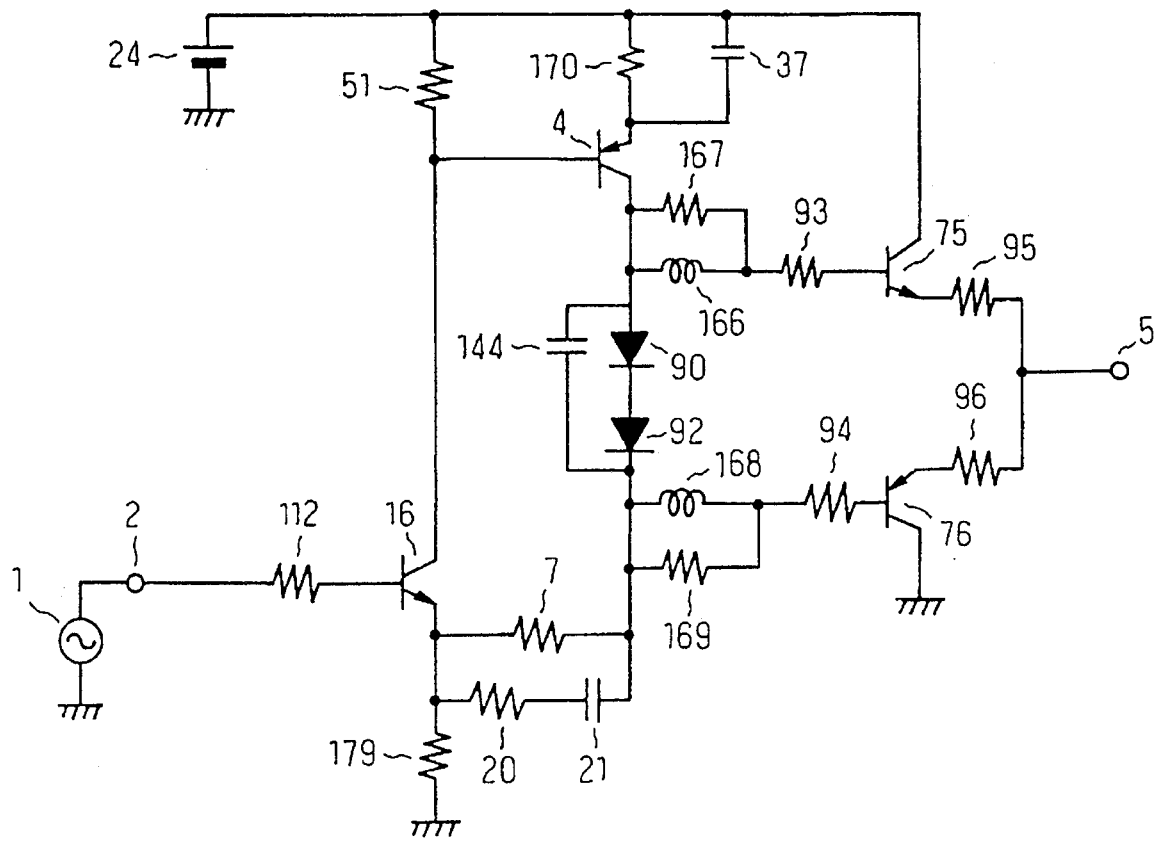
FIG. 26 is a circuit diagram illustrating a practical amplifier circuit of the embodiment.

Such embodiments having the feedback impeder connected to the output signal detector having the high impedance, also, have been illustrated in FIGS. 13, 18, and 21. FIG. 25 depicts a skeleton illustrating an embodiment of the positive-phase amplifier of the present invention having the peaking intensified. FIG. 26 depicts a circuit diagram illustrating a practical amplifier circuit of the embodiment. In FIG. 25, CA indicates an impedance conversion amplifier, and 143 is the inverted amplifier.

In FIG. 26, a series feedback is made to the emitter of the transistor 16 through the feedback impedance 7 so that the input impedance of the amplifier circuit can be made higher. The capacitor 21 can limit the frequency band to stabilize the feedback.

The dc gain of this embodiment is determined in terms of a resistance ratio of a resistor 179 to the feedback impedance 27. The capacitor 37 and the coils 166 and 168, as mentioned above, are used for peaking.

Figure 27:
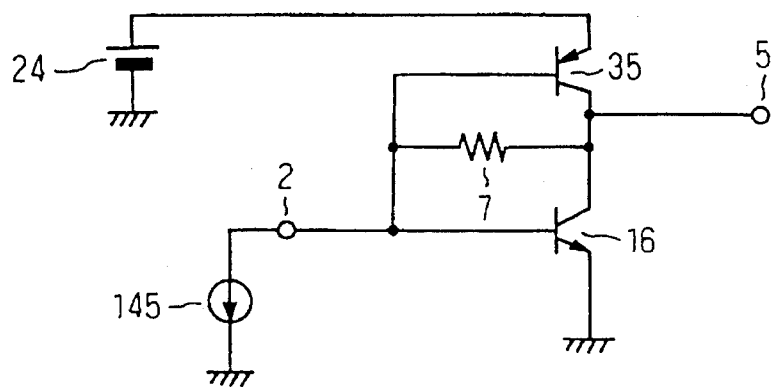
FIG. 27 illustrates another embodiment of the present invention.
Figure 28:
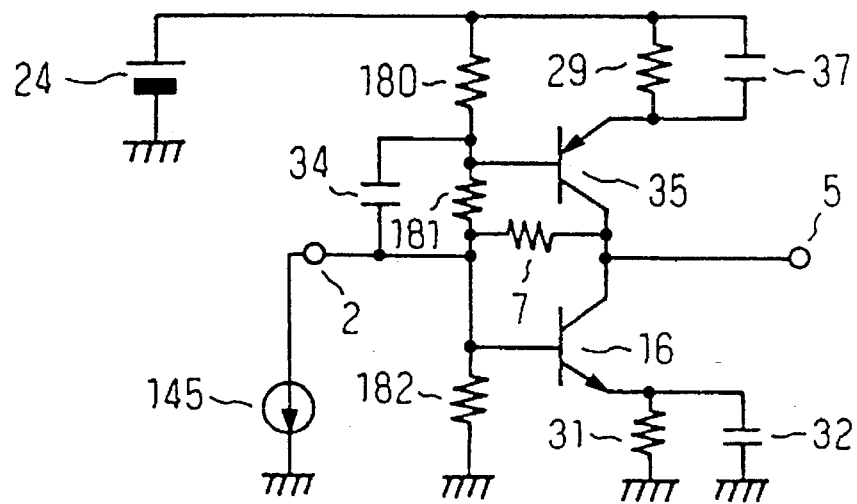
FIG. 28 is a circuit diagram illustrating a practical embodiment of the present invention.
Figure 29:
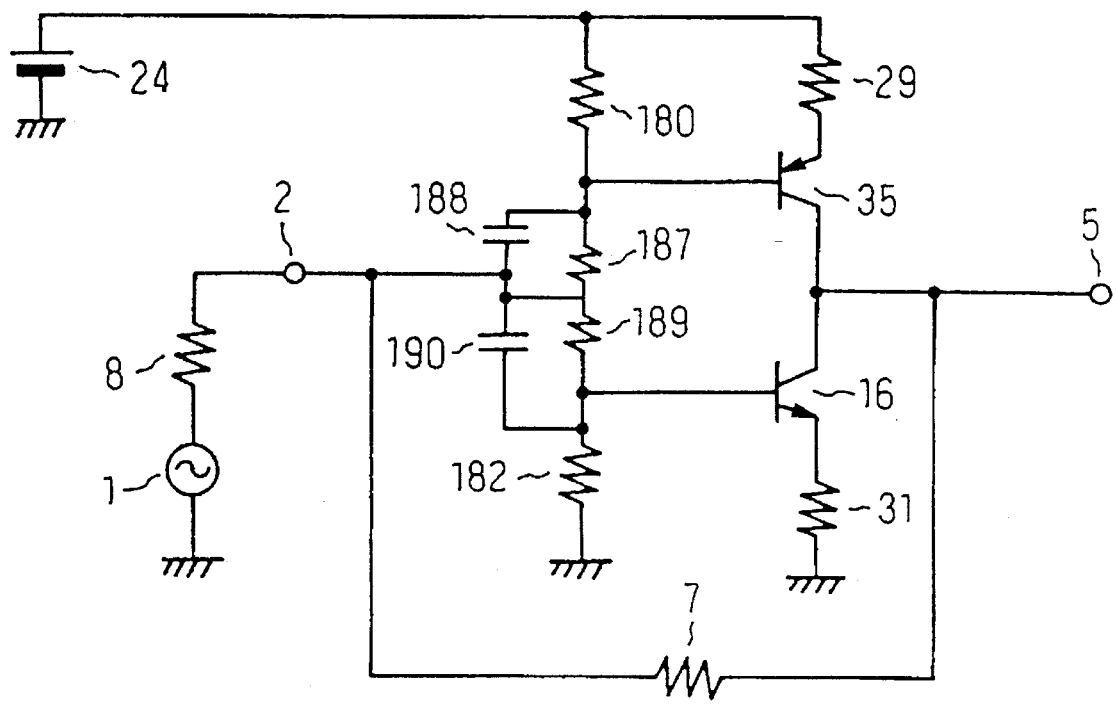
FIG. 29 illustrates still another embodiment of the present invention.
Figure 30:
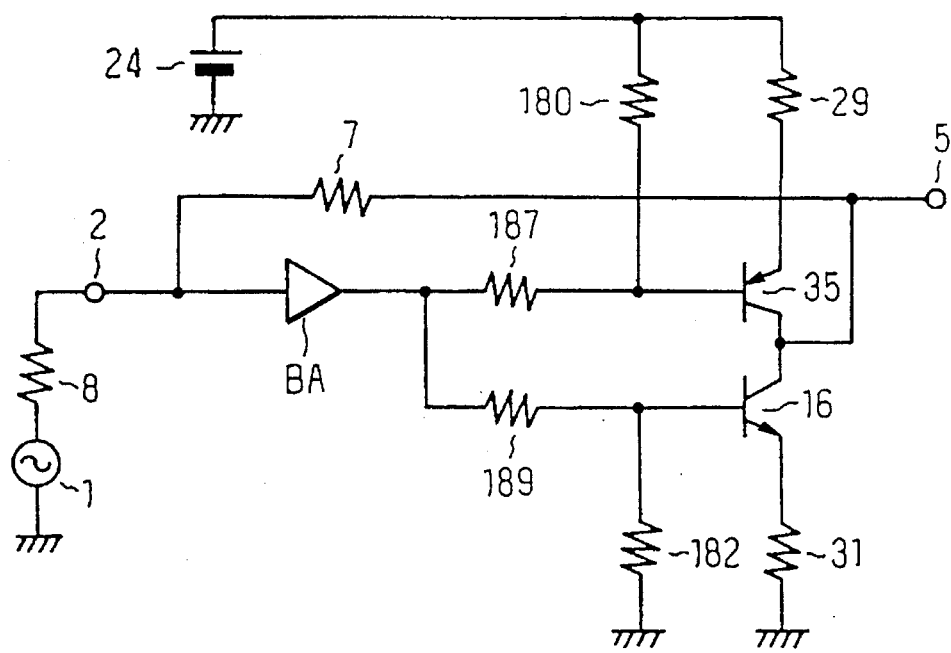
FIG. 30 illustrates still another embodiment of the present invention.
Figure 31:
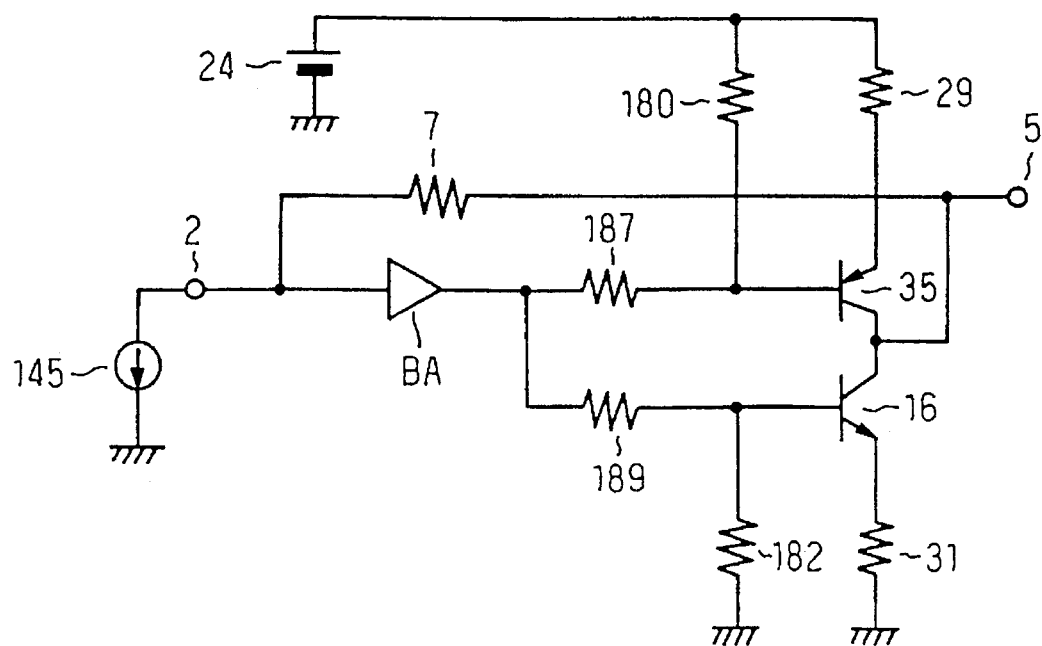
FIG. 31 illustrates still another embodiment of the present invention.
Figure 32:
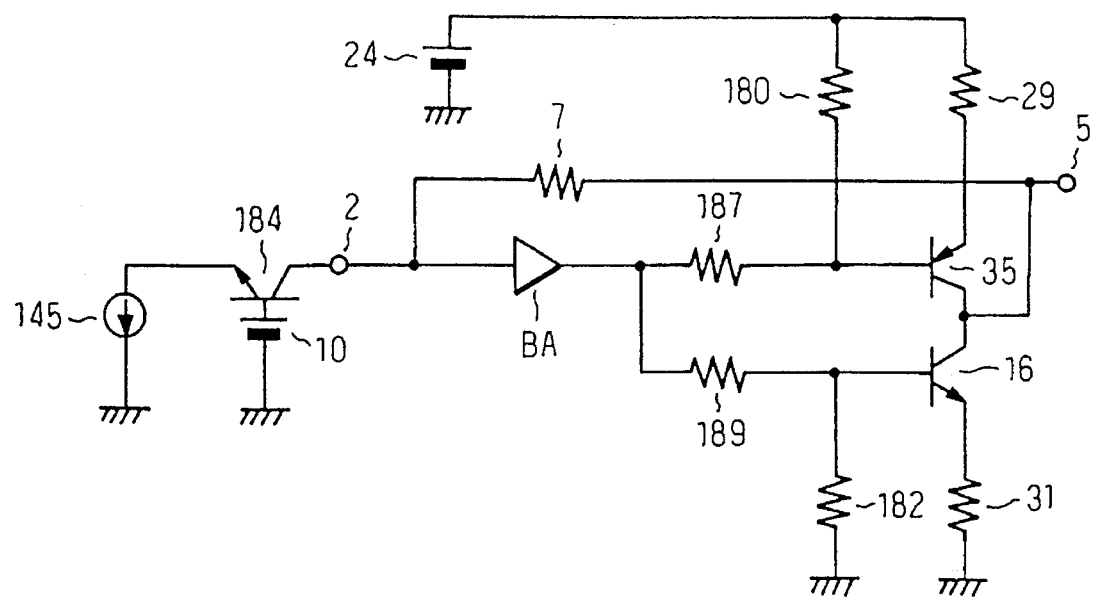
FIG. 32 illustrates still another embodiment of the present invention.

In turn, FIG. 27 depicts a skeleton illustrating an embodiment of the present invention in which a current signal is sent in a push-pull form from the dc region to have a wider frequency band with a less number of component elements used. FIG. 28 depicts a circuit diagram illustrating a practical circuit of the embodiment.

In FIG. 28, a signal voltage appearing at the input pin 2 is applied to the base of the transistor 16 from the dc region and at the same time, is applied to the base of the transistor 35 through an impeder 181. With use of only the two output transistors 16 and 35, the push-pull operation can be made.

In the embodiment, it can be assumed that the current component of the input signal is shunted to the respective bases of the transistors 16 and 35 through an impedance network. Further, a high frequency component of the signal voltage appearing at the input pin 2 is made to pass through the coupling capacitor 34 to enhance the dc component before being applied to the base of the transistor 35.

The base drive voltages for the output transistors 16 and 35 are not amplitude-limited unlike the voltage input signal. Therefore, the gain frequency band of the open loop gain of the amplifier circuit can be widen. As a result, the current signal from the signal current source 145 is converted to voltage in a wide frequency band through the feedback impedance 7 before fed out to the output pin 5. The capacitors 32 and 37 are peaking elements, but can be eliminated. Also, the coupling capacitor 34 can be eliminated, with the effect of the present invention kept.

Figure 33:
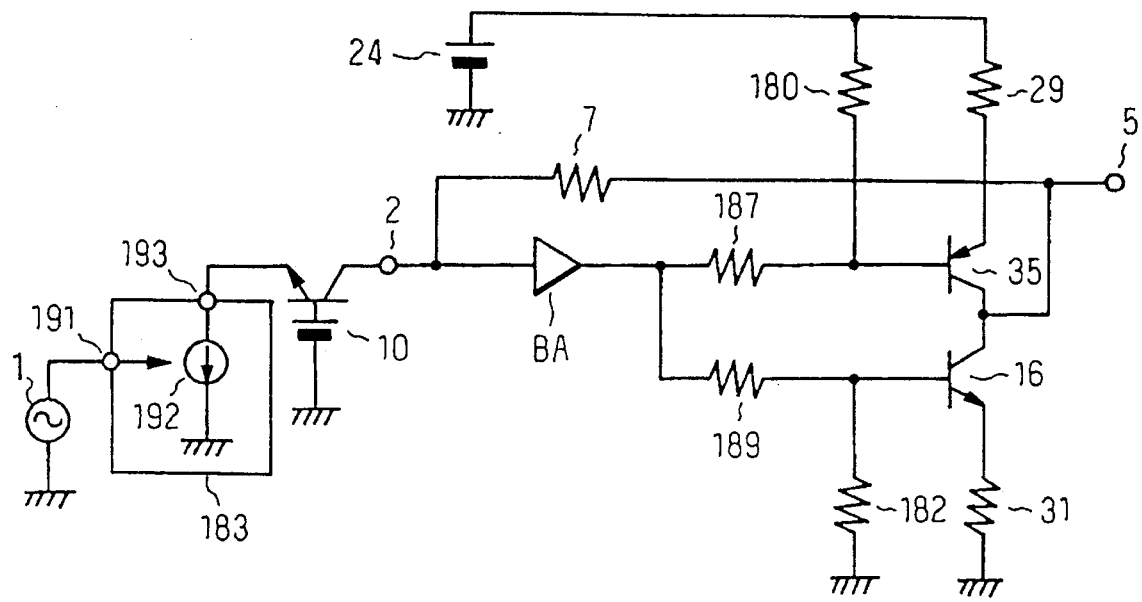
FIG. 33 illustrates still another embodiment of the present invention.
Figure 34:
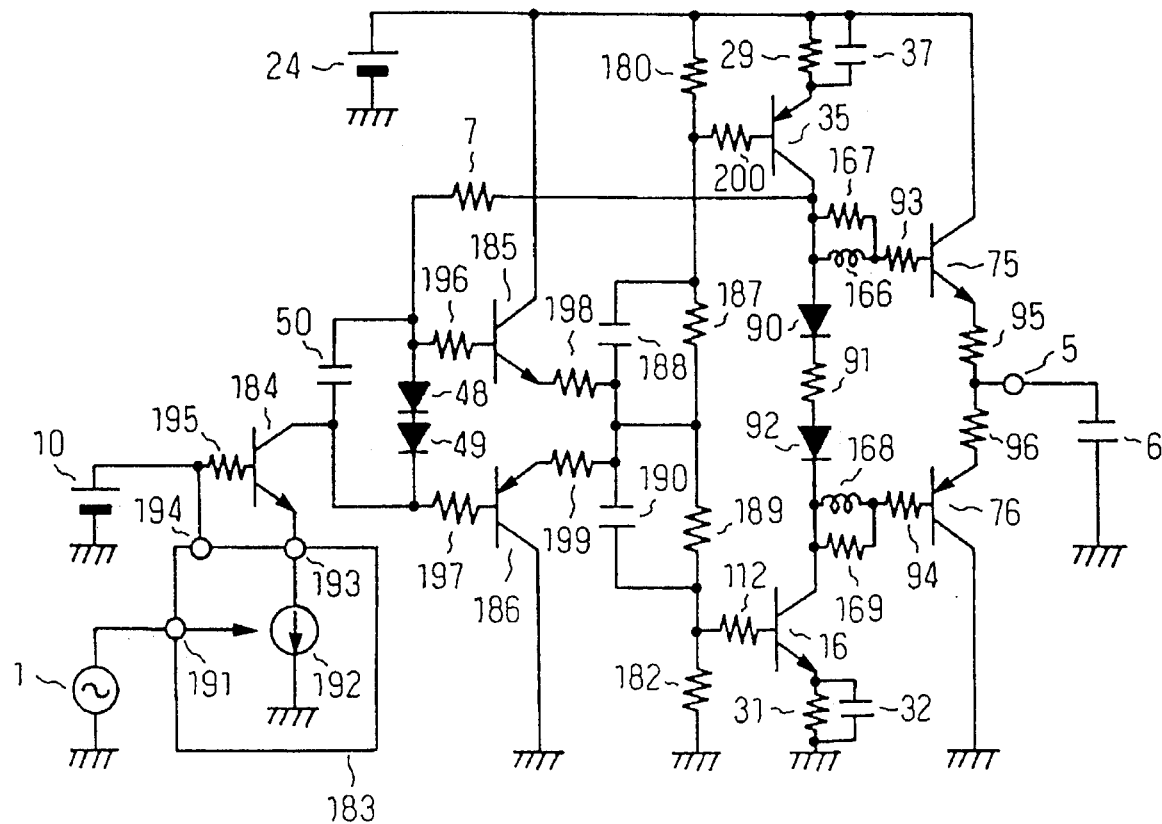
FIG. 34 is a circuit diagram illustrating a practical embodiment of the present invention.

Further, as shown in FIG. 19, the signal current source 145 can be replaced by a signal voltage source connected in series with the input impedance. FIGS. 29, 30, 31, 32, and 33 depict skeletons illustrating a practical embodiments of the present invention in which a current signal is efficiently sent in a push-pull form from the dc region to high frequency region to have a wider frequency band. FIG. 34 depicts a circuit diagram illustrating a practical circuit of the embodiments. In FIG. 33, 183 indicates an integrated circuit.

In FIG. 34, a voltage signal input to a pin 191 of the integrated circuit 183 with a power source 10 being relatively low is converted to current signal before the current signal is input the amplifier circuit section through a grounded-base transistor 184 with a high power source voltage. Insertion of the transistor 184 before the high voltage section, therefore, protects the semiconductor integrated circuit 183 from being destructed by higher voltage than a withstand voltage thereof, the integrated circuit 183 being easily capable of accomplishing the wide frequency band.

In the amplifier circuit stage, like FIG. 28, the above-mentioned current signal is converted to output voltage signal through the feedback impedance 7. In conversion, a SEPP formed of transistors 185 and 186 is used so that the current signal should not be consumed as the base drive currents for the output transistors 16 and 35 which increase with frequency, but can be efficiently fed to the feedback impedance 7.

In order to set the biases for the above-mentioned SEPP, the diodes 48 and 49 and resistor 198 and 199 are used. Also, the capacitor 50 is used to bypass the above-mentioned signal current to stabilize the bias voltages. The voltage output of the SEPP formed of transistors 185 and 186 is divided through impeders 180 and 187 and impeders 182 and 189 to obtain respective base drive voltages for the output transistors 16 and 35.

Bypass capacitors 188 and 199 enhance the respective base drive voltages at high frequencies. Resistors 195, 196, 197, 112, 200, 93, and 94 inserted in series with the respective bases of the transistors are stabilizing resistors for preventing oscillation.

Figure 35:
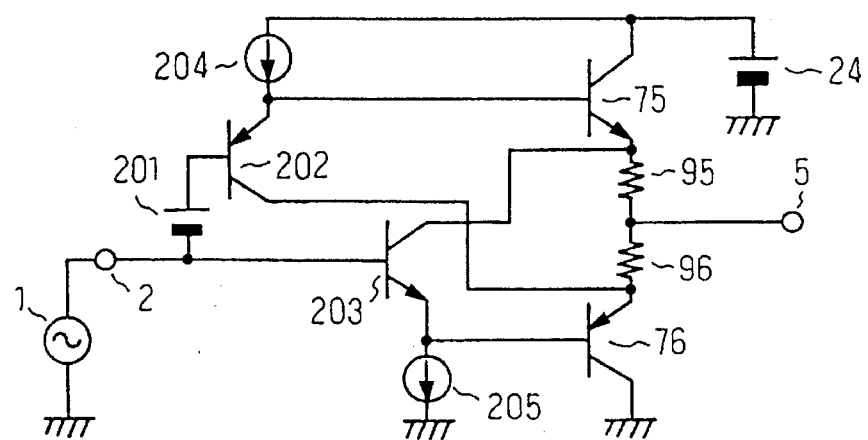
FIG. 35 illustrates still another embodiment of the present invention.

In turn, FIG. 35 depicts a circuit diagram illustrating an embodiment of the diamond circuit shown in FIG. 13 for use with a wideband signal. Transistors 202 and 203 in the figure form an emitter follower circuit for driving the succeeding SEPP formed of the transistors 75 and 76. The transistors 202 and 203 serve also to set biases for the transistors 75 and 76.

In the previous diamond circuit, a sum of parasitic capacitances between the respective bases and collectors of the transistors 109 and 110 forming the preceding emitter follower circuit shown in FIG. 13 is an input capacitance. This is too high to obtain a high input impedance essentially needed for the buffer amplifier at high frequencies.

In particular, if the preceding stage for the diamond circuit is of dynamic load type or a similar circuit of relatively high output impedance, the diamond circuit has a too heavy load to often secure a sufficiently wide frequency band. In the embodiment shown in FIG. 35, the collectors of the transistors 202 and 203 forming the preceding emitter follower circuit are connected to the outputs of the succeeding SEPP. This secures the high input impedance essentially needed for the buffer amplifier at high frequencies.

That is, the collectors of the transistors forming the preceding emitter follower circuit have signals virtually equal to the signals input to the bases applied thereto. This suppresses the currents flowing into the parasitic capacitances between the respective bases and collectors, thereby reducing the input capacitances.

The embodiment shown in FIG. 35 has a feature that a bias voltage source 201 and the emitter resistors 95 and 96 serve to bias the succeeding SEPP to class A or AB to make sufficient bias currents flow into the transistors 75 and 76 of the SEPP, thereby providing a high-speed, wideband frequency response.

Alternatively, a polarity of the bias voltage source 201 is inverted to bias the succeeding SEPP to class C to reduce power consumption of the amplifier circuit. To increase and stabilize accuracy of setting the biases, the transistors 202 and 203 should be preferably biased by current-regulated sources 204 and 205. Alternatively, the current-regulated sources 204 and 205 can be replaced by resistors or similar impeders.

In addition, an additional protection diode can be inserted in parallel between the base and the emitter of each of the transistors 75 and 76 and 202 and 203 so that a voltage exceeding a reverse withstanding voltage cannot be applied between them in event of a high amplitude operation, electrostatic discharge, or discharge in a load picture tube.

Figure 36:
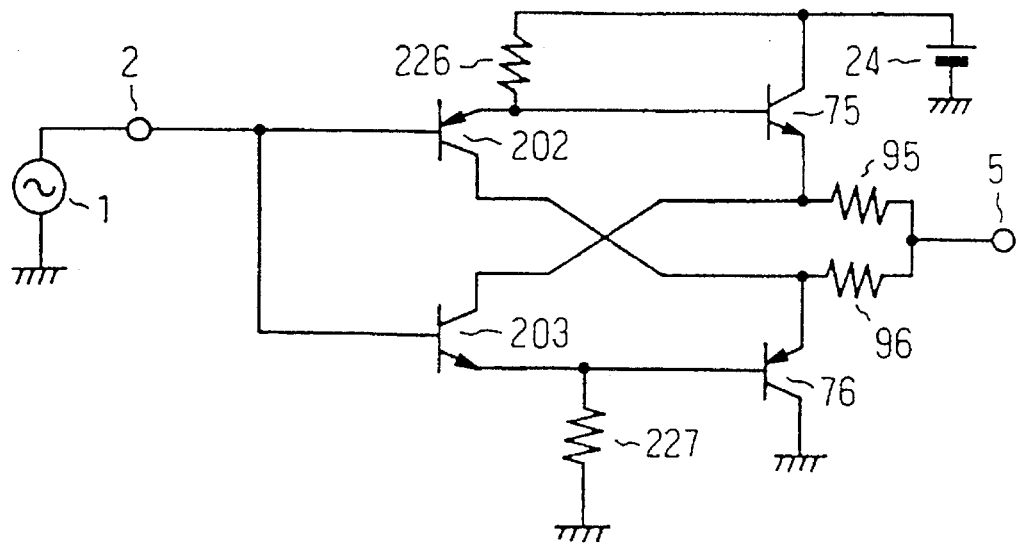
FIG. 36 illustrates still another embodiment of the present invention.

FIG. 36 depicts a version of the embodiment in FIG. 35. In turn, FIG. 37 depicts a circuit diagram illustrating an embodiment of the diamond circuit used for the buffer amplifier in the final stage of the amplifier circuit.

Figure 37:
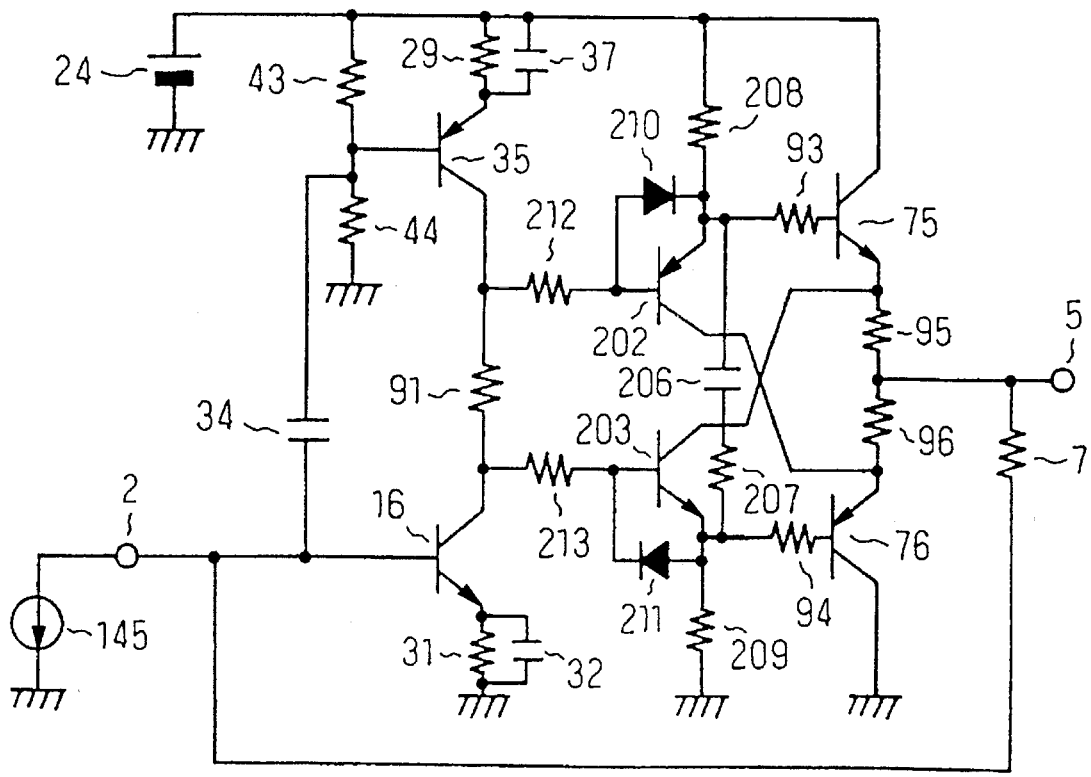
FIG. 37 illustrates a practical embodiment of the present invention.

In FIG. 37, also, with a negative feedback of the circuit, a current signal input to the input pin 2 is converted to an output signal through the feedback impedance 7. In FIG. 37, also, the collectors of the transistors 202 and 203 forming the preceding emitter follower circuit are connected to the respective emitters of the transistors 75 and 76 which are the outputs of the succeeding SEPP. This secures the high input impedance essentially needed for the buffer amplifier at high frequencies.

The embodiment shown in FIG. 37 has a feature that the emitters of the transistors 202 and 203 are connected together through a capacitor 206 to increase drive powers for the transistors 75 and 76 forming the succeeding SEPP.

Both bases of the transistors 75 and 76 are driven by the respective transistors 203 and 202 at the times of rise and fall of the output voltage signal.

A stabilizing resistor 20 is connected in series with a capacitor 206 to couple the emitters of the transistors 202 and 203 together, thereby preventing the transistors 202 and 203 from oscillating. Also, base resistors 212 and 213 can prevent the transistors 202 and 203 from oscillating. Diodes 210 and 211, as in the embodiment in FIG. 35, are used to protect the transistors 202 and 203. The bias resistor 91 for the transistors 75 and 76 forming the succeeding SEPP can be replaced by a voltage regulating element, such as a diode, or a circuit or can have an additional bypass capacitor connected in parallel therewith.

Figure 38:
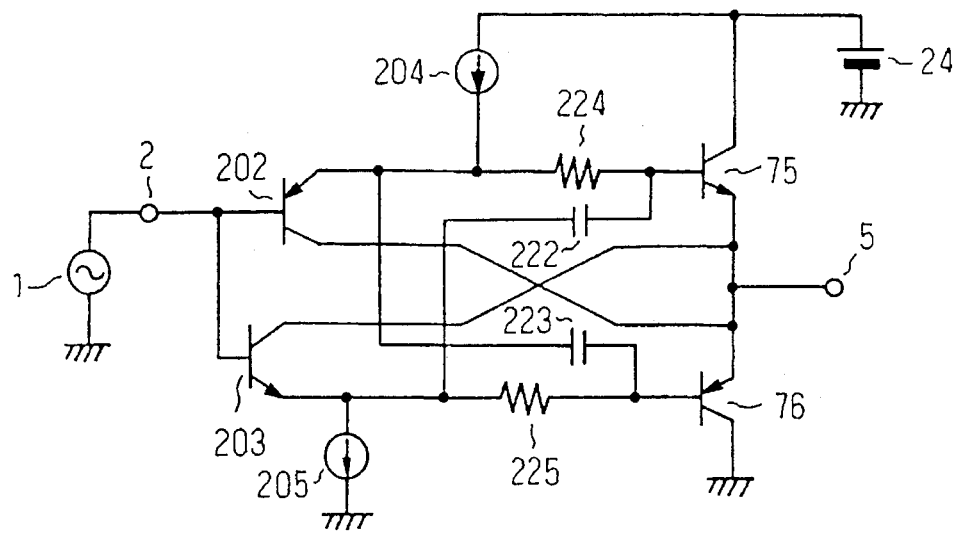
FIG. 38 is a circuit diagram illustrating another embodiment of the present invention.

FIG. 38 depicts a circuit diagram illustrating a skeleton of the embodiment in FIG. 37. In turn, FIG. 39 depicts a circuit diagram illustrating another embodiment of the diamond circuit of the present invention for further wider frequency band.

Figure 39:
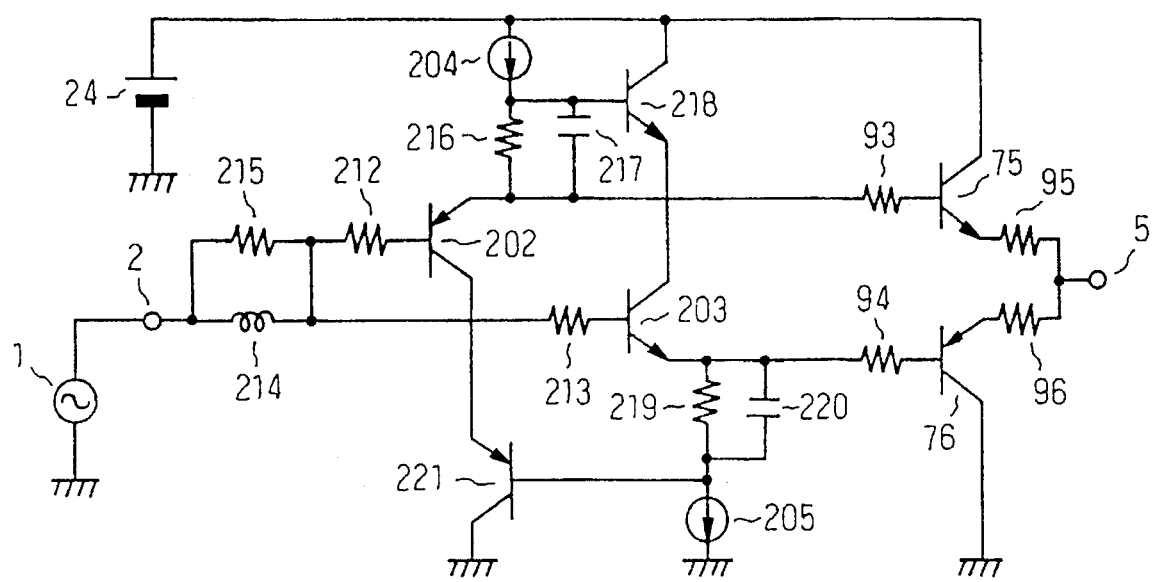
FIG. 39 is a circuit diagram illustrating a practical embodiment of the present invention.

In FIG. 39, the bases of the transistors 202 and 203 forming the preceding emitter follower circuit can be connected together without a bias voltage source. A number of elements connected to the input pin of the diamond circuit, therefore, can be reduced to a fewest limit. This can secure the high input impedance essentially needed for the buffer amplifier.

In addition, the embodiment uses a single peaking circuit formed of a coil 214 and a damping resistor 215 to make the frequency band further wider. The collectors of the transistors 202 and 203 forming the preceding emitter follower circuit have signals virtually equal to the input signals applied thereto through bypass capacitors 220 and a transistor and a bypass capacitor 217 and a transistor 218. This increases the input impedance.

In that case, currents of current sources 204 and 205 are made to flow to bias impeders 216 and 219 to set bias voltages between the bases and the collectors of the transistors 202 and 203, respectively. This can not only prevent the transistors 202 and 203 from saturating, but also reduces parasitic capacitances themselves and make transient frequencies higher. The current sources 204 and 205 can be replaced by any of the elements or circuits, such as resistors, that can make only the bias currents flow.

Also, the bias impeders 216 and 219 can be replaced by any of the elements or circuits, such as diodes or voltage source circuits, that can generate only the bias voltages. The bases of the transistors 75 and 76 forming the succeeding SEPP can be connected to bases of the transistors 218 and 221, respectively, to set the bias currents for the transistors 75 and 76 to desired values.

Figure 40:
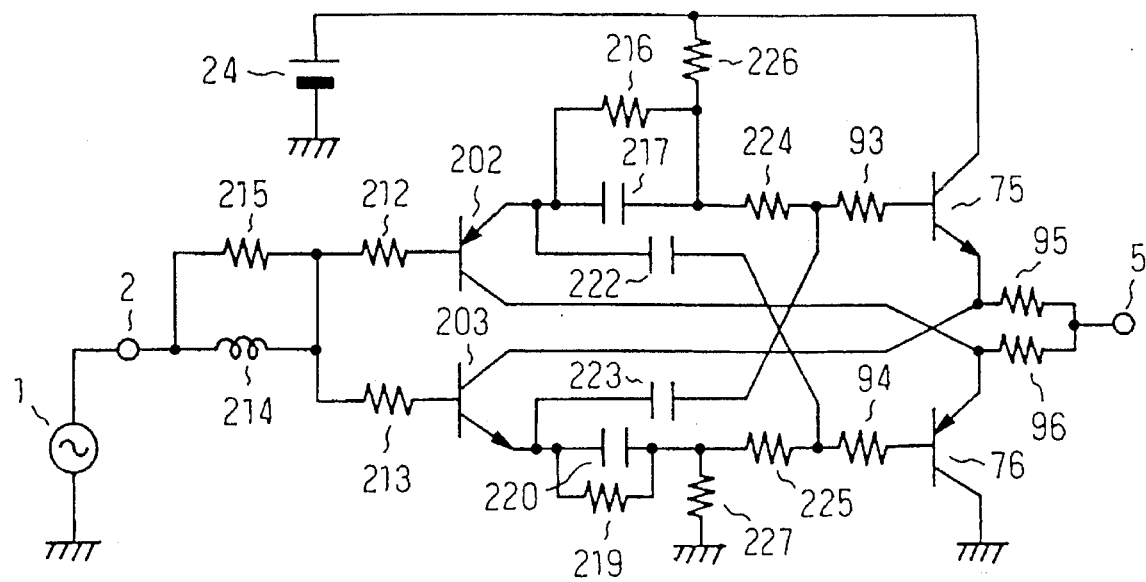
FIG. 40 is a circuit diagram illustrating a practical embodiment of the present invention.

FIG. 40 depicts a circuit diagram illustrating another embodiment of the diamond circuit of the present invention for further wider frequency band. This embodiment has the emitters of the transistors forming the preceding emitter follower circuit connected to the bases of the elements of the same polarities forming the succeeding SEPP, respectively, to increase the drive power for the load.

The emitters of the transistors 202 and 203 forming the preceding emitter follower circuit in FIG. 40 connected to the transistors 76 and 75 of the same polarities through coupling capacitors 222 and 223, respectively. The base resistors 93 and 94, as described above, are of relatively low values as stabilizing resistors.

The emitter currents of the above-mentioned two pairs of cascade-connected transistors 202 and 76 and 203 and 75 can be increased forward at the times of rise and fall of the signal voltages, respectively, to increase the drive force for the load to a highest limit.

Coupling between the emitters of the transistors 202 and 203 can be made by interpolation of dc transmission impeders 224 and 225 without preventing the succeeding stage from keeping the drive power. This embodiment, like the one in FIG. 39, can reduce the number of elements connected to the input pin to a fewest limit so that the high input impedance essentially needed for the buffer amplifier can be secured.

Note that the bias impeders 216 and 226 and 219 and 227 are used to set the bias currents for the transistors 75 and 76 and to set the collector bias voltages for the transistors 202 and 203, respectively. Also, note that the bypass capacitors 217 and 220 can be eliminated.

Figure 41:
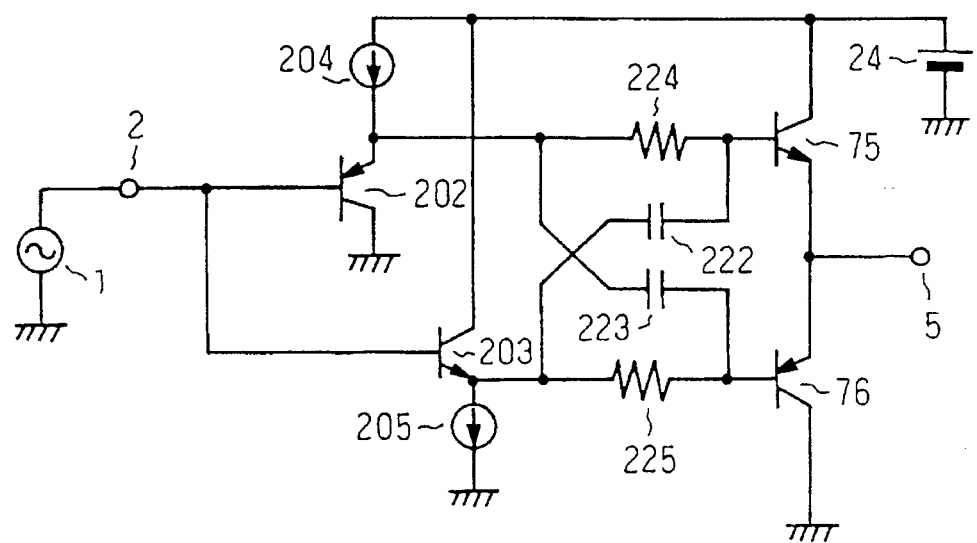
FIG. 41 illustrates still another embodiment of the present invention.
Figure 42:
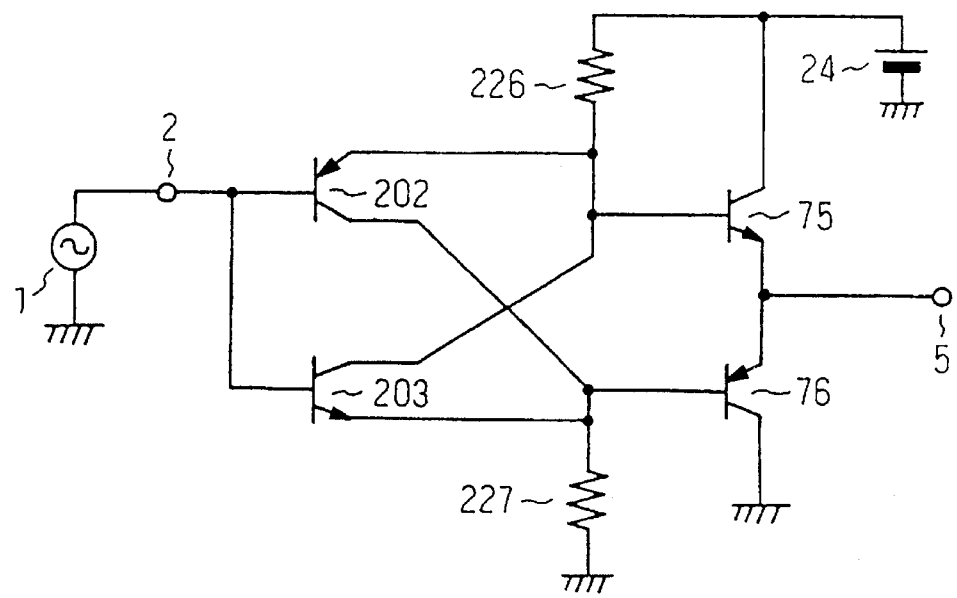
FIG. 42 illustrates still another embodiment of the present invention.

Further, note that in FIG. 40, even if the collector of transistor 202 is disconnected from the emitter of the transistor 76, but connected to an ac grounding point, such as a grounding point, and even if the collector of transistor 203 is disconnected from the emitter of the transistor 75, but connected to an ac grounding point, such as a positive electrode of the power source 24, the above-mentioned high-speed effect can be secured. FIG. 41 depicts a circuit diagram illustrating such an embodiment. FIG. 42 depicts a circuit diagram illustrating a skeleton of the embodiment in FIG. 39.

Figure 45:
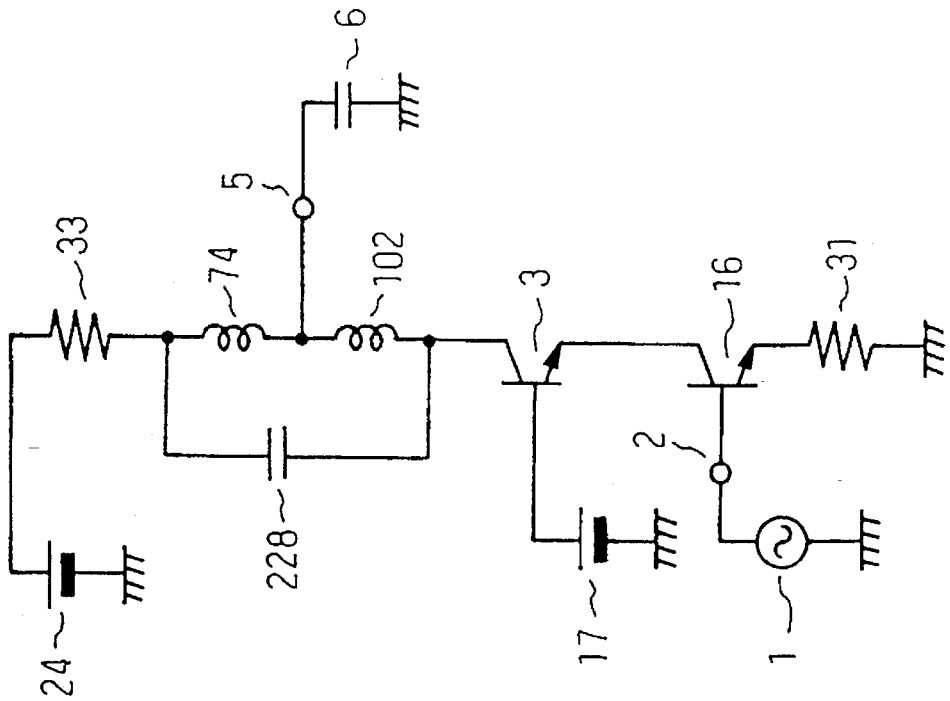
FIG. 45 is a circuit diagram illustrating an embodiment of the present invention.
Figure 44:
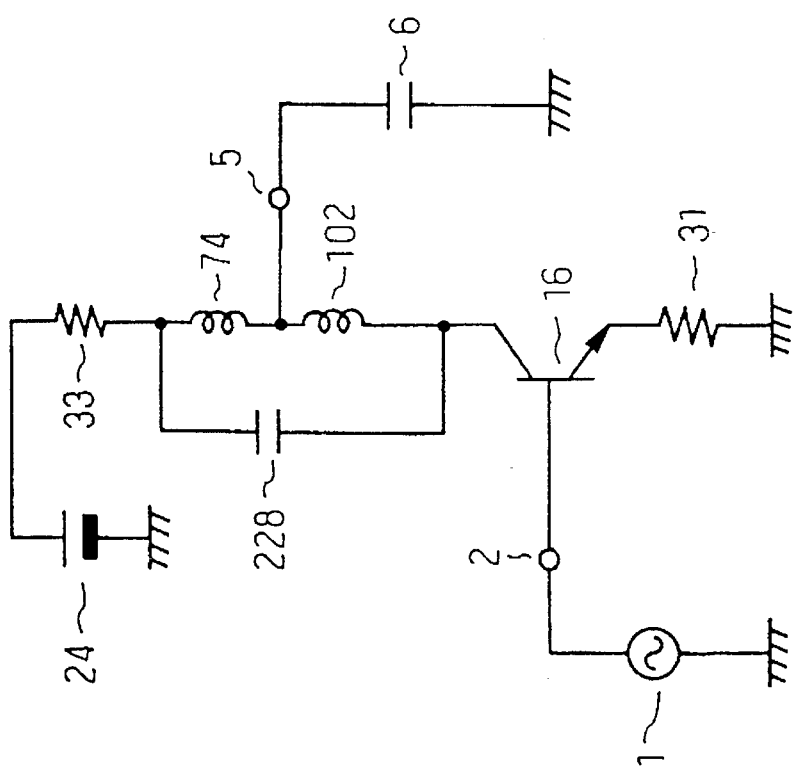
FIG. 44 is a circuit diagram illustrating an embodiment of the present invention.

Finally, FIGS. 44 and 45 depict circuit diagrams illustrating still another embodiment of the present invention having a serial parallel peaking circuit of coils used therein. This embodiment has a feature that the damping made with the additional resistor consuming power in the usual way is made with an existing output resistor through a capacitor for a wide frequency band.

Figure 43:
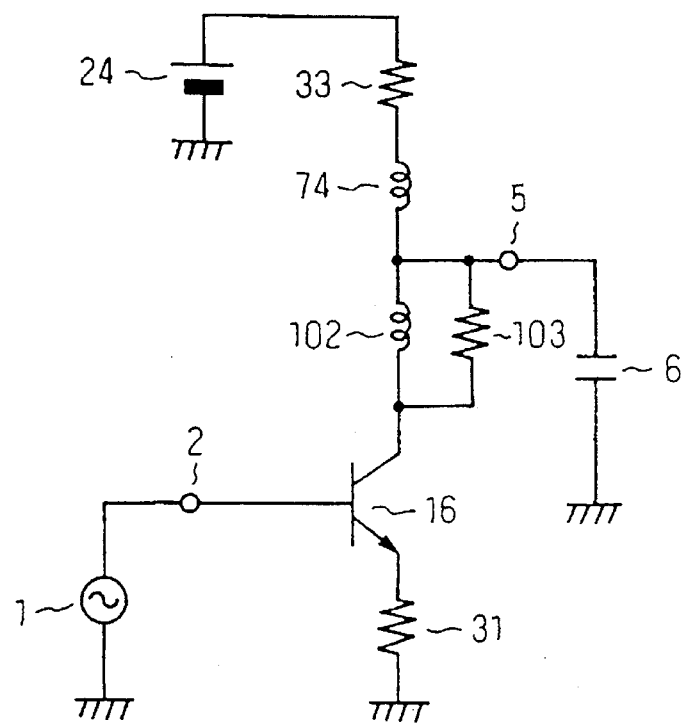
FIG. 43 is a circuit diagram illustrating a prior grounded emitter amplifier circuit.

FIG. 43 depicts a circuit diagram illustrating a usual grounded emitter amplifier circuit. The output frequency band of this grounded-emitter amplifier circuit is limited as being inversely proportional to an output-side time constant obtained in terms of a capacitance on the collector side of the transistor 16 including the output resistor 33 and the capacitive load 6. To extend the output frequency band, the usual arts generally have a parallel peaking coil 74 resonating with the above-mentioned collector-side capacitance and a series peaking coil 102 causing a series resonance inserted as shown in the figure.

Alternatively, the series peaking coil 102 can be disconnected from the circuit shown once, and the collector of the transistor 16 can be connected with an end of the coil 74 to which the output resistor 33 is not connected before the series peaking coil 102 can be inserted in series between the collector of the transistor 16 and the output pin 5. To make the frequency response of the amplifier circuit flat, an inductance of the coil 74 should be adjusted only as the output resistor 33 can damp the resonance with the coil 74 in itself. However, the damping resistor 103 has to be added in parallel for the coil 102.

However, if we have to make the frequency response flat and widen the frequency band as well, the resistor 103 consumes the resonance energy to lower the Q factor of the resonance. This results in that the output frequency band cannot be sufficiently widened. The embodiment of the present invention shown in FIG. 44 has the parallel peaking coil 74 and the series peaking coil 102 connected together in series connected in parallel with a coupling capacitor 228 between the other ends of the coils 74 and 102 which are not connected together.

The embodiment can have a wider frequency band as the existing output resistor 33 cannot only have the signal current output of the transistor 16 made to flow through the capacitor 228, but also serve to damp the above-mentioned series resonance. Alternatively, as in FIG. 43, the series peaking coil 102 can be disconnected from the circuit shown once, and the collector of the transistor 16 can be connected with an end of the coil 74 to which the output resistor 33 is not connected before the series peaking coil 102 can be inserted in series between the collector of the transistor 16 and the output pin 5.

In this case, also, the embodiment can have the parallel peaking coil 74 and the series peaking coil 102 connected together in series connected in parallel with a coupling capacitor 228 between the other ends of the coils 74 and 102 which are not connected together, thereby providing the same effect as described above.

In addition to the circuit construction in FIG. 44, an additional series peaking coils can be inserted in series between the connection point of the coils 74 and 102 and the output pin 5. This corresponds to dividing a series peaking coil, thus allowing optimization of the peaking corresponding to a ratio of the parasitic capacitance on the collector side of the transistor 16 to the load capacitance.

Alternatively, as in FIG. 45, the grounded-base transistor 3 having the base ac-grounded and the emitter having a signal input can be inserted behind the transistor 16 to provide the same effect.

Figure 46:
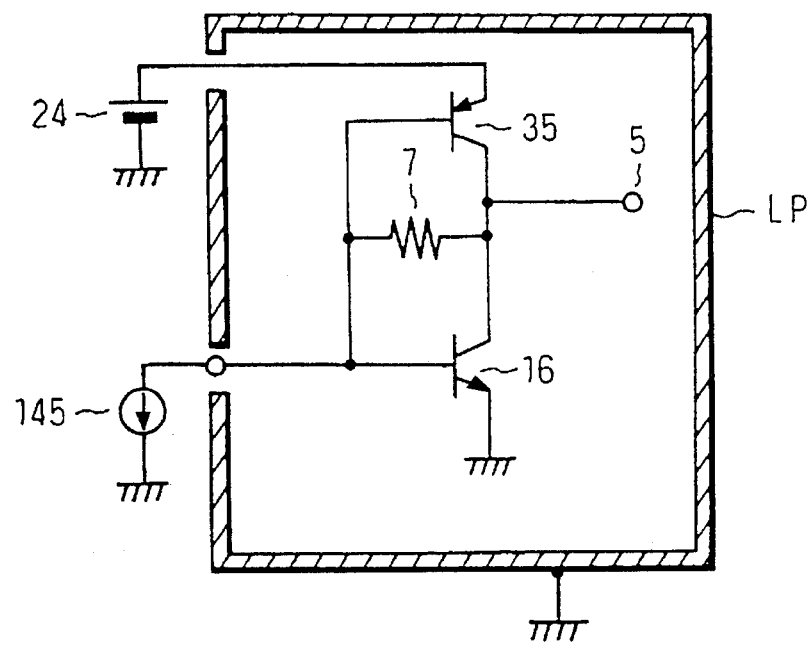
FIG. 46 is a circuit diagram illustrating another embodiment of the present invention.

FIG. 46 depicts a circuit diagram illustrating a version of the embodiment in FIG. 27 in which the wideband signal amplifier circuit is shielded by a conductor plate LP to suppress undesired radiation from the wideband signal amplifier circuit.

The transistors used as the active elements in the embodiments described so far can be replaced by semiconductor elements, such as FETs, vacuum tubes, or similar desired active elements. Also, the polarities of the active elements, the voltage sources, and the current sources can be inverted.

The picture tube used as the load can be replaced by a monochrome display, a projection type display, a monochrome picture tube for use in an oscilloscope, a color picture tube having a plurality of drive electrodes for use in a color display or the like, a plasma display plate, a liquid crystal display plate, or similar display devices.

The drive electrodes can include the cathode, grids, an anode, and any other types of electrode to which the signal is input. The embodiments of the present invention can be applied to the ordinary wideband signal amplifier circuit for driving any of desired loads and the picture tube as well and to any of the other signal processing circuits for processing signals.

Figure 48:
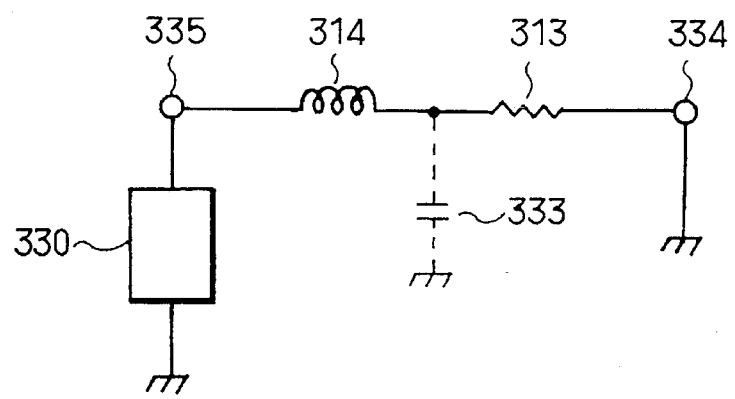
FIG. 48 is a circuit diagram illustrating a wideband amplifier as an embodiment of the present invention.
Figure 49:
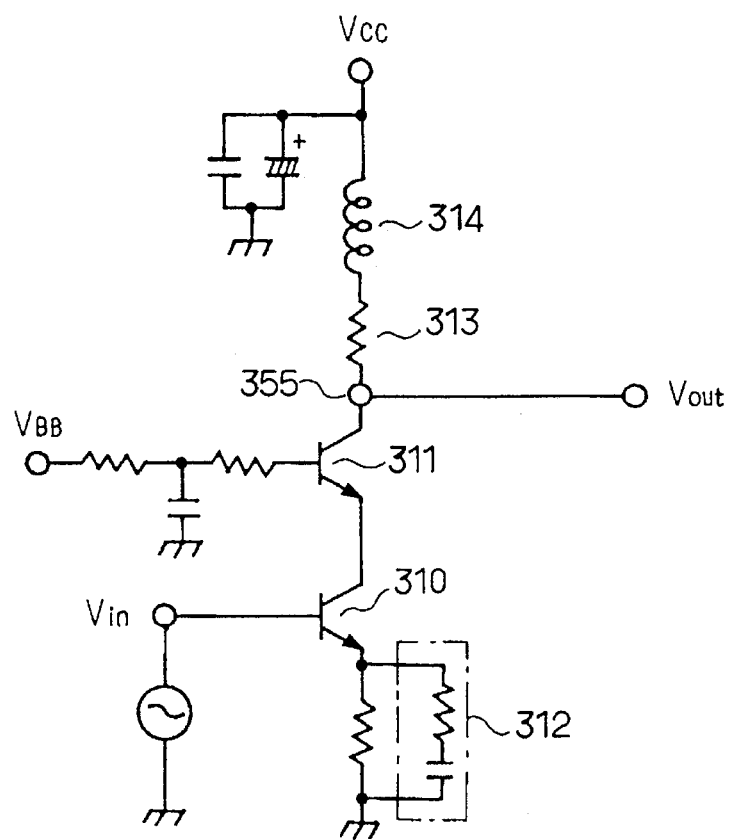
FIG. 49 is a circuit diagram illustrating a prior amplifier used for the picture tube drive circuit.
Figure 50:
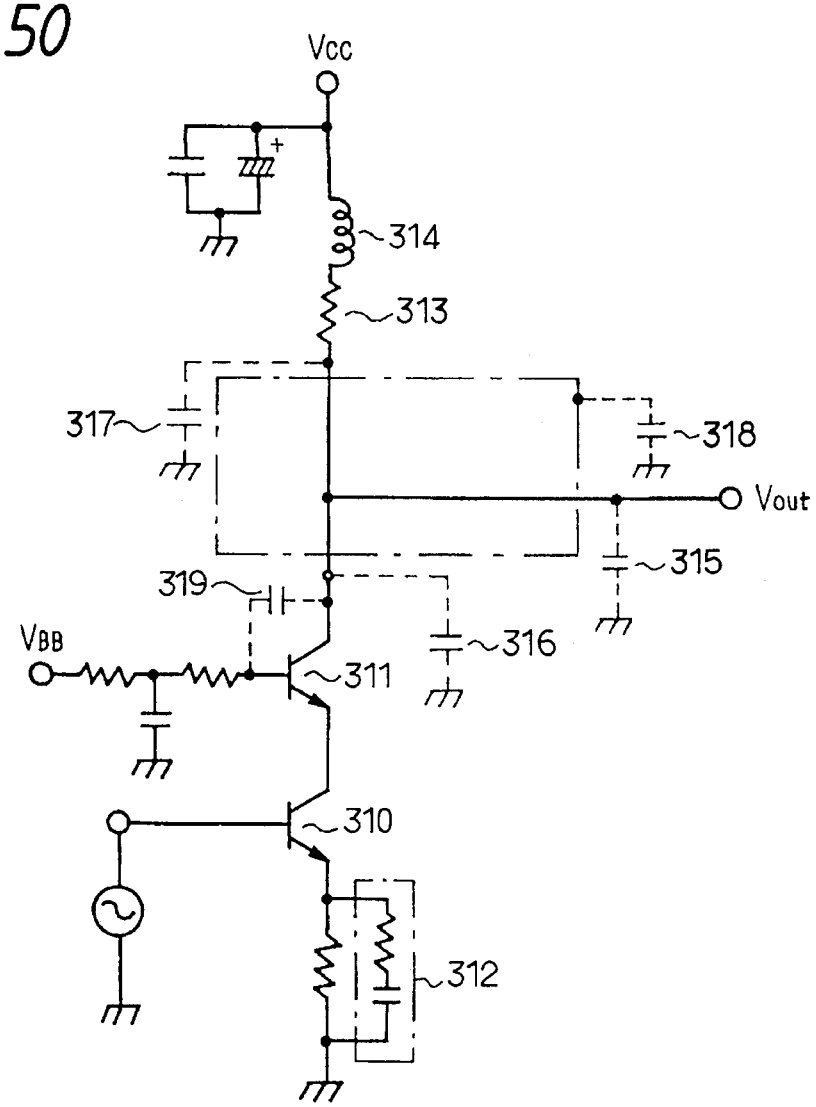
FIG. 50 is an equivalent circuit diagram illustrating an prior amplifier in FIG. 49.

FIG. 48 depicts a circuit diagram illustrating the wideband amplifier as an embodiment of the present invention. This embodiment has a parallel peaking coil 314 for improving a high frequency response of the amplifier therein having one end connected with an output pin 335 of an amplifier section 330. The other end of the parallel peaking coil 314 is connected with one end of an output resistor 313. The other end 334 of the output resistor 313 is ac-grounded. This is alternatively achieved by suspending the other end 334 of the output resistor 313 with a resistor and by decreasing the impedance with a bypass capacitor. Alternatively, all the polarities of the elements can be inverted, and the other end 334 of the output resistor 313 can be grounded.

Figure 51:
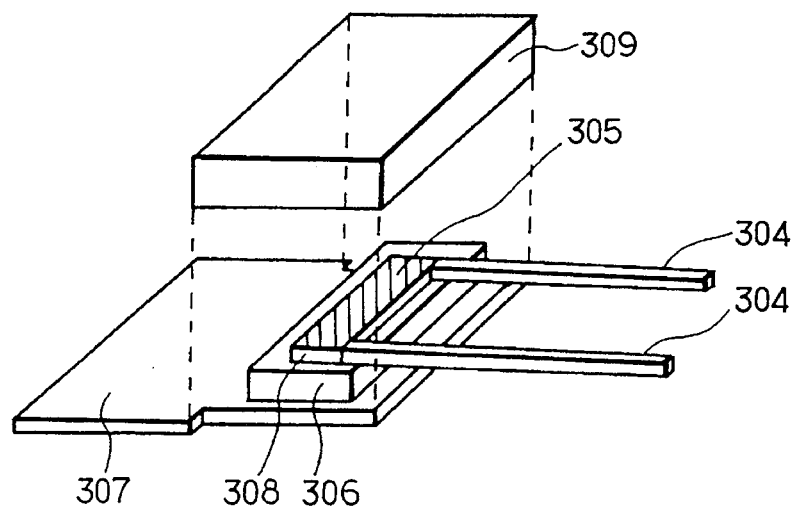
FIG. 51 is a perspective view illustrating a structure of a high power, metal-film resistor used for an output resistor in FIG. 48.

In turn, structure and principles of the wideband amplifier in FIG. 48 is described below by reference to FIGS. 51 and 52. The output resistor 313 used in FIG. 48 is, for example, a high power, metal-coated resistor as shown in FIG. 51. The high power, metal-coated resistor is heat-radiated by a heatdissipating plate 307 to make its shape and size as small as a small-size power transistor. The heat-dissipating plate for the high-power, metal-coated resistor is closely attached to a chassis in the display so that the amplifier can be made smaller and easily shielded. This can prevent undesired radiation from the display.

The high-power, metal-coated resistor is formed of two lead frames 304 of copper and solder plating, a resistor 308 of nickel-chromium, a protection film of epoxy resin for the resistor 308, a substrate 306 of aluminum, the heat-dissipating plate 307 of copper and nickel plating, and an enclosure 309 of heat-resisting epoxy resin. The heat-dissipating plate 307 is usually grounded to cause very high parasitic capacitance to the resistor 313. Even if the heat-dissipating plate 307 is not grounded by an insulator, it causes high parasitic capacitance as its area is too large.

Figure 52A:
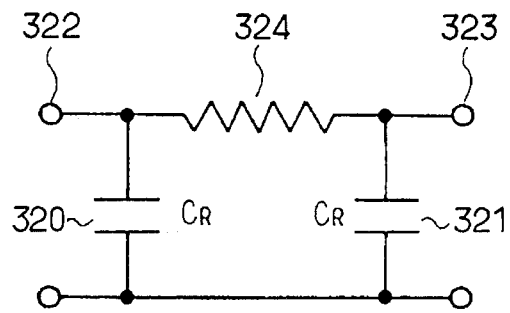
FIGS. 52(a) and 52(b) are equivalent circuit diagrams illustrating the output resistor in FIG. 48.
Figure 52B:
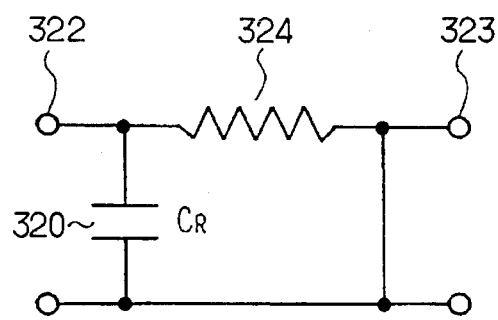

FIG. 52(a) depicts an equivalent circuit diagram illustrating the high-power, metal-coated resistor. In FIG. 52(a), the two lead frames 304 correspond to pins 322 and 323. The resistor 308 corresponds to a resistor 324. The electrostatic capacitance (parasitic capacitance) of the resistor 308 corresponds to capacitors 320 and 321. A total electrostatic capacitance of the resistor 308, therefore, can be seen as the sum of capacitances of the capacitors 320 and 321, or $2C_R$. FIG. 52(b) depicts an equivalent circuit diagram illustrating the resistor 324 with its one end 323 ac-grounded. In FIG. 52(b), the two lead frames 304 correspond to pins 322 and 323. The resistor 308 corresponds to a resistor 324. The electrostatic capacitance (parasitic capacitance) of the resistor 308 is only that of the capacitor 320. The electrostatic capacitance of the resistor 308, therefore, is only the capacitance of the capacitor 320 or $C_R$. Thus, with one of the two ends of the resistor ac-grounded, the original parasitic capacitor of the resistor can be reduced.

The structure and principles described above can make the amplifier have further wider frequency band and lower power consumption.

The embodiment uses the high-power, metal-coated resistor as an example. The high-power, metal-coated resistor can be replaced by any of usual metal-coated resistors, cement resistors, resistor networks, chip resistors, and thick-film resistors, with one end thereof ac-grounded to reduce the parasitic capacitance.

Figure 53:
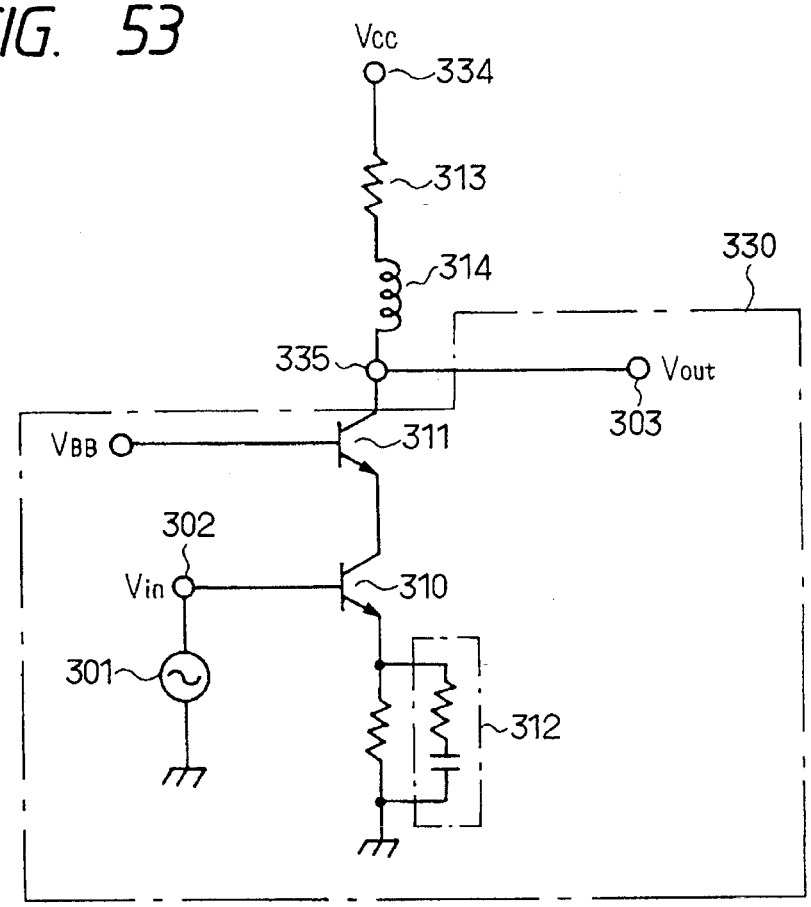
FIG. 53 is a circuit diagram illustrating a detailed circuit construction of the embodiment in FIG. 48.

FIG. 53 depicts a circuit diagram illustrating a detailed circuit construction of the embodiment in FIG. 48. The embodiment has a signal source 301 connected with an input pin 302 of the amplifier. The input pin 302 is connected with an input of a cascade amplifier formed of a grounded-emitter transistor 310 and a grounded-base transistor 311. An emitter of the transistor 310 is connected with an emitter peaking circuit 312 for improving a high-frequency response of the amplifier.

Also, a collector of the transistor 311 is connected through a pin 335 with one end of the parallel peaking coil 314 for improving the high-frequency response of the amplifier. The other end is connected with one end of the output resistor 313. The other end 334 of the output resistor 313 is connected with a power source and ac-grounded. The collector of the transistor 311 is branched through the pin 335 before being connected to an output pin 303.

The circuit construction described above can reduce the parasitic capacitance due to the output resistor 313 so that the amplifier can have further wider frequency band and lower power consumption.

Figure 54:
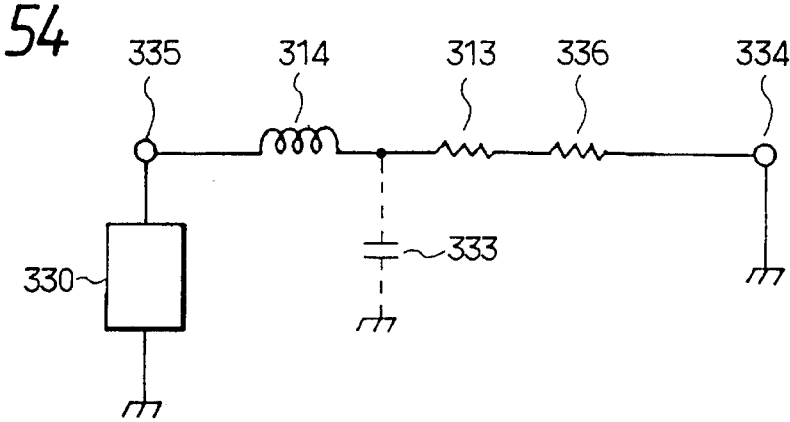
FIG. 54 is a circuit diagram illustrating a wideband amplifier as another embodiment of the present invention.

FIG. 54 depicts a circuit diagram illustrating the wideband amplifier as another embodiment of the present invention. This embodiment, as shown in FIG. 54, has an additional output resistor 336 inserted between the output resistor 313 and the pin 334 to connect the output resistor 336 in series with the output resistor 313 in the construction shown in FIG. 48.

Figure 55A:
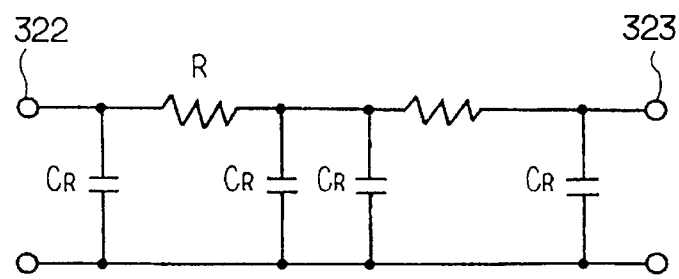
FIGS. 55(a), 55(b), and 55(c) are equivalent circuit diagrams illustrating the two resistors connected in series in FIG. 54.
Figure 55B:
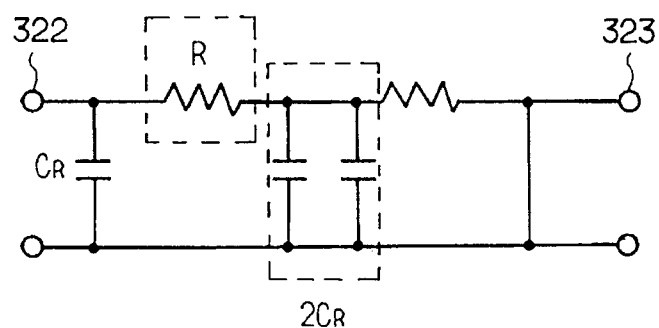
Figure 55C:
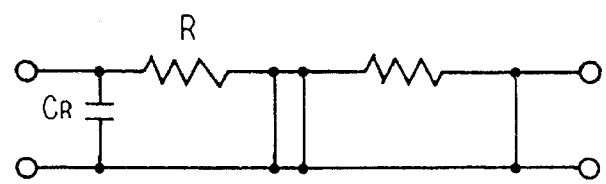

FIG. 55(*a*) depicts an equivalent circuit diagram illustrating the wideband amplifier with the two resistors connected in series as described above. In this case, a total parasitic capacitance of the resistors is $4C_R$. FIG. 55(*b*) depicts an equivalent circuit diagram illustrating the wideband amplifier with the pin 323 for the one resistor ac-grounded. In this case, a total parasitic capacitance of the resistors is theoretically $3C_R$. However, R and $2C_R$ enclosed by broken lines cancel each other. As a result, the equivalent circuit becomes the one as shown in FIG. 55(*c*). Thus, a total parasitic capacitance of the resistors becomes $C_R$, or one fourth of the first one. If a plurality of resistors are connected in series, therefore, the parasitic capacitance can be reduced to less than ¼ at maximum for the entire resistance of both resistors.

Note that in that case, it is often advantageous to connect a resistor of least resistance on the side of the amplifier 330.

Figure 56:
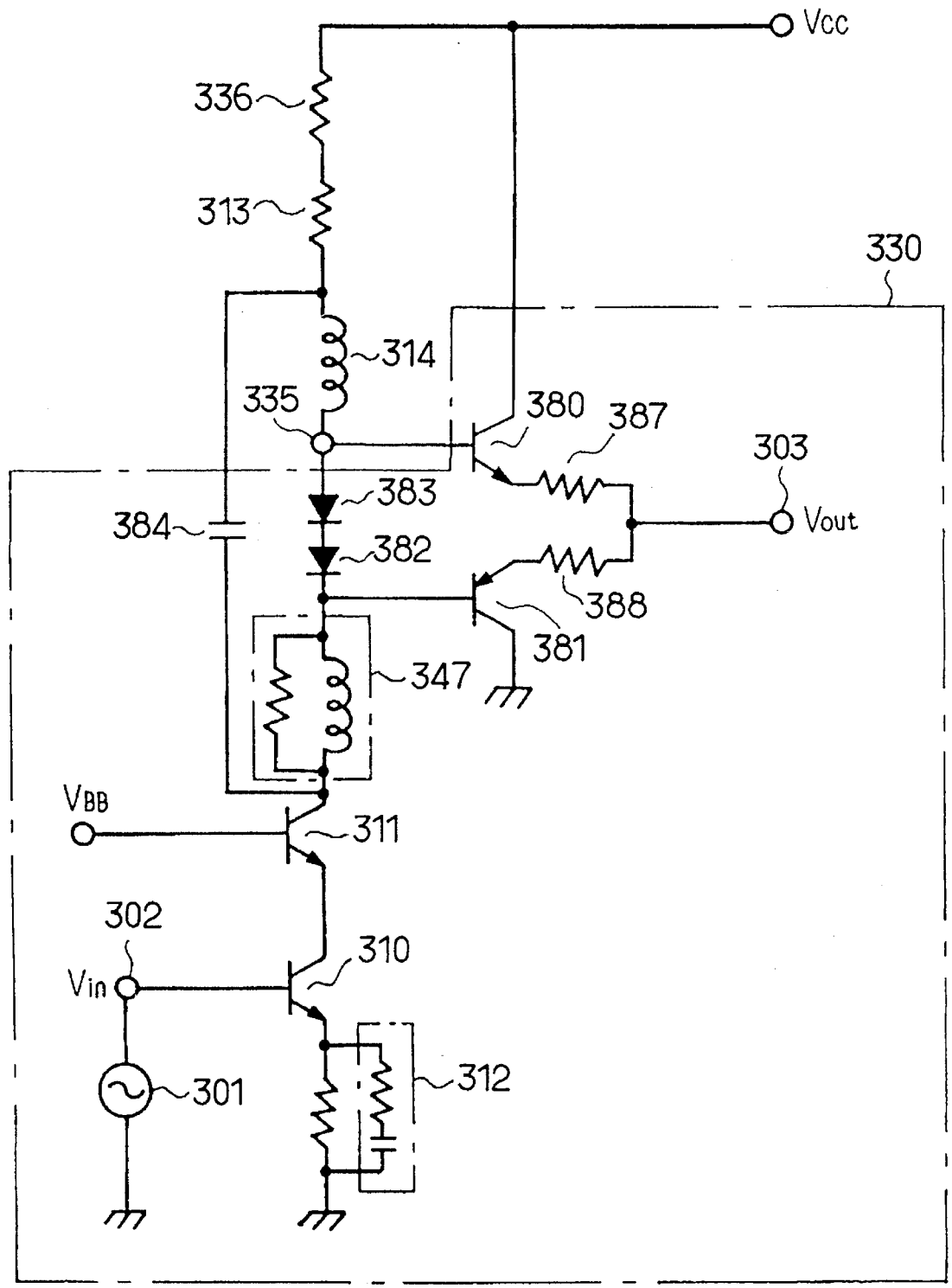
FIG. 56 is a circuit diagram illustrating a detailed circuit construction of the embodiment in FIG. 54.

FIG. 56 depicts a circuit diagram illustrating a detailed circuit construction of the embodiment in FIG. 54. In FIG. 56, the signal source 301 is connected with the input pin 302 of the amplifier. The input pin 302 is connected with the input of the cascade amplifier formed of the grounded-emitter transistor 310 and the grounded-base transistor 311. The emitter of the transistor 310 is connected with the emitter peaking circuit 312 for improving the high-frequency response of the amplifier.

Also, the collector of the transistor 311 is connected with one end of a series peaking coil 347 for improving the high-frequency response of the amplifier.

The other end of the series peaking coil 347 is connected with a base of a transistor 381. Also, the other end of the series peaking coil 347 is connected with a cathode of diodes 382 and 383 connected in series for biasing. A base of a transistor 380 is connected with an anode of the diodes 382 and 383 through the pin 335. The transistors 380 and 381 form a SEPP. The amplifier is designed to provide stable characteristics irrespective of a capacitance of the load to be connected to the output pin 303.

In turn, the anode of the series-connected diodes 382 and 383 is connected through the pin 335 with one end of the parallel peaking coil 314 for improving the high-frequency response of the amplifier. The other end of the parallel peaking coil 314 is connected with one end of the series-connected output resistors 313 and 336. The other end of series-connected output resistors 313 and 336 is connected with the power source $V_{CC}$ and ac-grounded.

Further, the collector of the transistor 311 is connected with one end of a capacitor 384 for improving the high-frequency response of the amplifier. The other end of capacitor 384 is connected with the end of the parallel peaking coil 314 and with the end of the series-connected output resistors 313 and 336. The other end of series-connected output resistors 313 and 336 is connected with the power source $V_{CC}$ and ac-grounded. Emitters of the transistors 380 and 381 are connected with bias resistors 387 and 388, respectively. Both other ends of the bias resistors 387 and 388 are connected with the output pin 303 of the amplifier.

The circuit construction described above can reduce the parasitic capacitance due to the output resistors 313 and 336 so that the amplifier can have further wider frequency band and lower power consumption.

Figure 57:
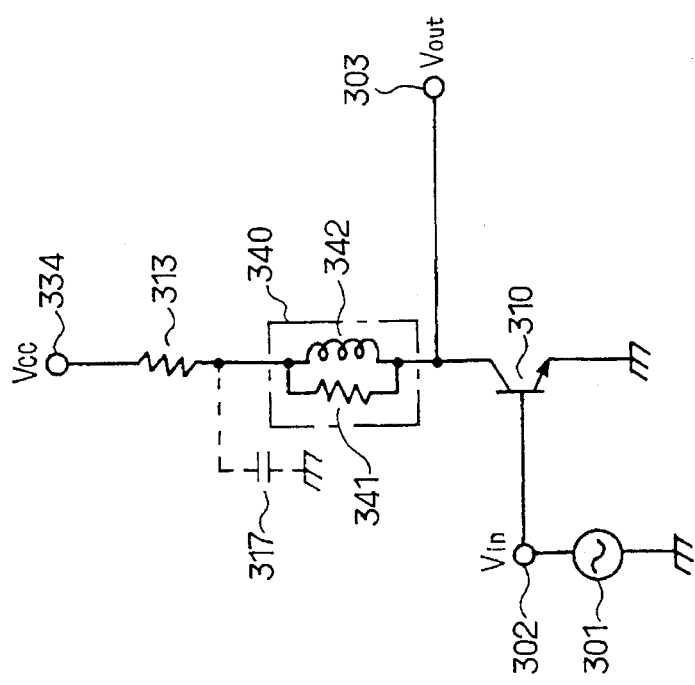
FIG. 57 is a circuit diagram illustrating a wideband amplifier as another embodiment of the present invention.

FIG. 57 depicts a circuit diagram illustrating the wideband amplifier as still another embodiment of the present invention. In FIG. 57, the signal source 301 is connected with the input pin 302 of the amplifier. The input pin 302 is connected with an input of the grounded-emitter transistor 310. A collector of transistor 310 is connected with one end of a constant-resistor circuit 340. The other end of the constant-resistor circuit 340 is connected with one end of the output resistor 313. The constant-resistor circuit 340 is formed of a resistor 341 and a coil 342. A resistance of the resistor 341 is made equal to that of the output resistor 313. The other end 334 of the output resistor 313 is connected with the power source $V_{CC}$. The output resistor 313 has a parasitic capacitance 317 thereon. This embodiment has the constant-resistor circuit 340 put in to cancel the parasitic capacitance 317 on the output resistor 313. Let R denote the resistance of the output resistor 313, $C_R$ be the capacitance on the output resistor 313, R be the resistance of the resistor 341 forming the constant-resistor circuit 340, and L be an inductance of the coil 342. There is given a relationship between the resistance R of the resistor 341 and the inductance L of the coil 342 as in Eq. (3) below.

$$L = C_R \times R^2 \qquad (3)$$

The inductance L of the coil 342 can be selected to hold for Eq. (3). This can cancel the parasitic capacitance 317 on the output resistor 313.

The circuit in FIG. 57 is effective to cancel the parasitic capacitance $C_R$ which is increased with use of one or few high-power resistors becoming likely a large size and occupying likely a large area.

It should be understood that the constant-resistor circuit 340 is not limited to the form shown in FIG. 57.

The embodiment described above in FIG. 57 can make the amplifier have further wider frequency band and lower power consumption.

Figure 58:
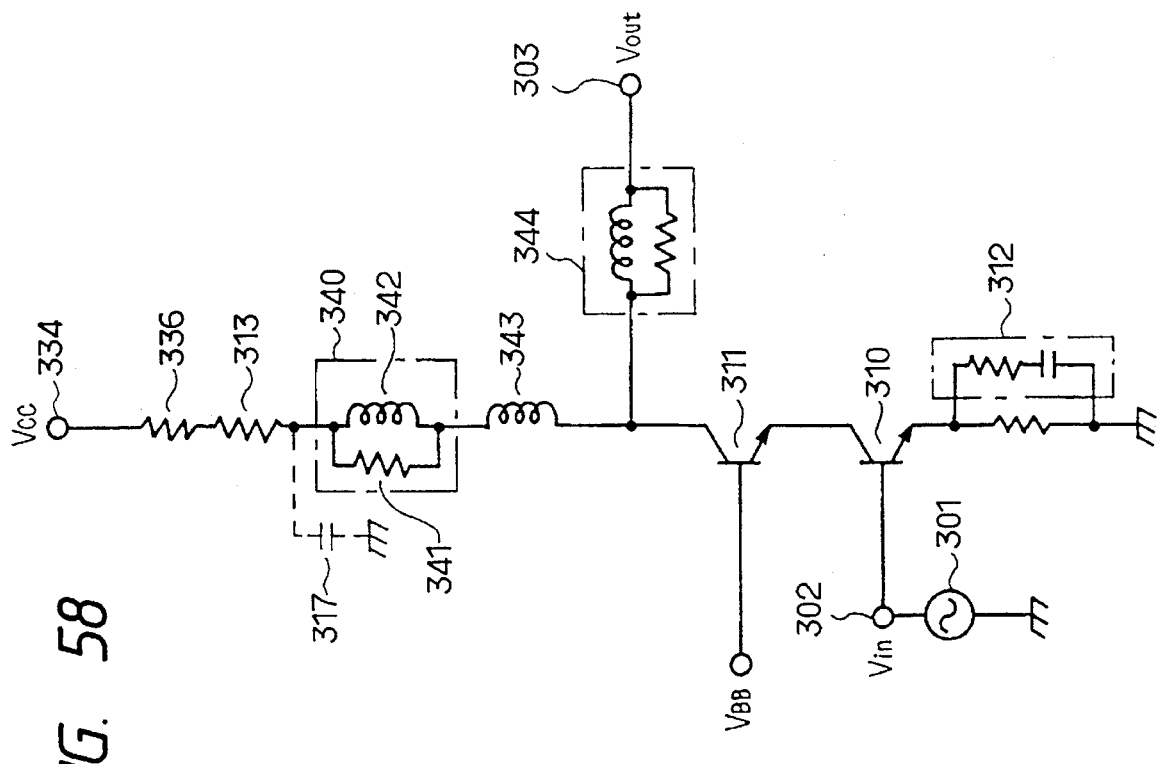
FIG. 58 is a circuit diagram illustrating a wideband amplifier as another embodiment of the present invention.

FIG. 58 depicts a circuit diagram illustrating the wideband amplifier as still another embodiment of the present invention. This embodiment makes the wideband amplifier in FIG. 57 have further higher power and wider frequency band. In FIG. 58, the signal source 301 is connected with the input pin 302 of the amplifier. The input pin 302 is connected with the input of the cascade amplifier formed of the grounded-emitter transistor 310 and the grounded-base transistor 311. The emitter of the transistor 310 is connected with the emitter peaking circuit 312 for improving the high-frequency response of the amplifier.

Also, the collector of the transistor 311 is connected with one end of a parallel peaking coil 343 for improving the high-frequency response of the amplifier. The other end of the parallel peaking coil 343 is connected with one end of the constant-resistor circuit 340 formed of the resistor 341 and the coil 342. The other end of the constant-resistor circuit 340 is connected with one end of the series-connected output resistors 313 and 336. The other end of series-connected output resistors 313 and 336 is connected with the power source $V_{CC}$ and ac-grounded. The other end of series-connected output resistors 313 and 336 is connected with the power source 334. The collector of the transistor 311 is branched through a series peaking circuit 344 for improving the high-frequency response of the amplifier before being connected to the output pin 303 of the amplifier.

The output resistors 313 and 336 has the parasitic capacitance 317 thereon. However, as the output resistors 313 and 336 are connected in series, the parasitic capacitance can be reduced to less than ¼ at maximum for the entire resistance of both resistors as described above. The inductance L of the coil 342 can be selected to hold for Eq. (3) to cancel the parasitic capacitance 317 on the output resistor 313 as described above.

The circuit construction described above can reduce the parasitic capacitance due to the output resistors 313 and 336 so that the amplifier can have further higher power and wider frequency band and lower power consumption.

If inductance of the parallel peaking coil 343 is to high, or if the collector current of the amplifier is too high, the parasitic capacitance of the parallel peaking coil 343 may be ignored. In such an event, the constant-resistor circuit 340 should be exchanged with the parallel peaking coil 343. This can cancel both the parasitic capacitance on one end of the parallel peaking coil 343 and the parasitic capacitance 317 on the output resistor 313 and 336.

Figure 59:
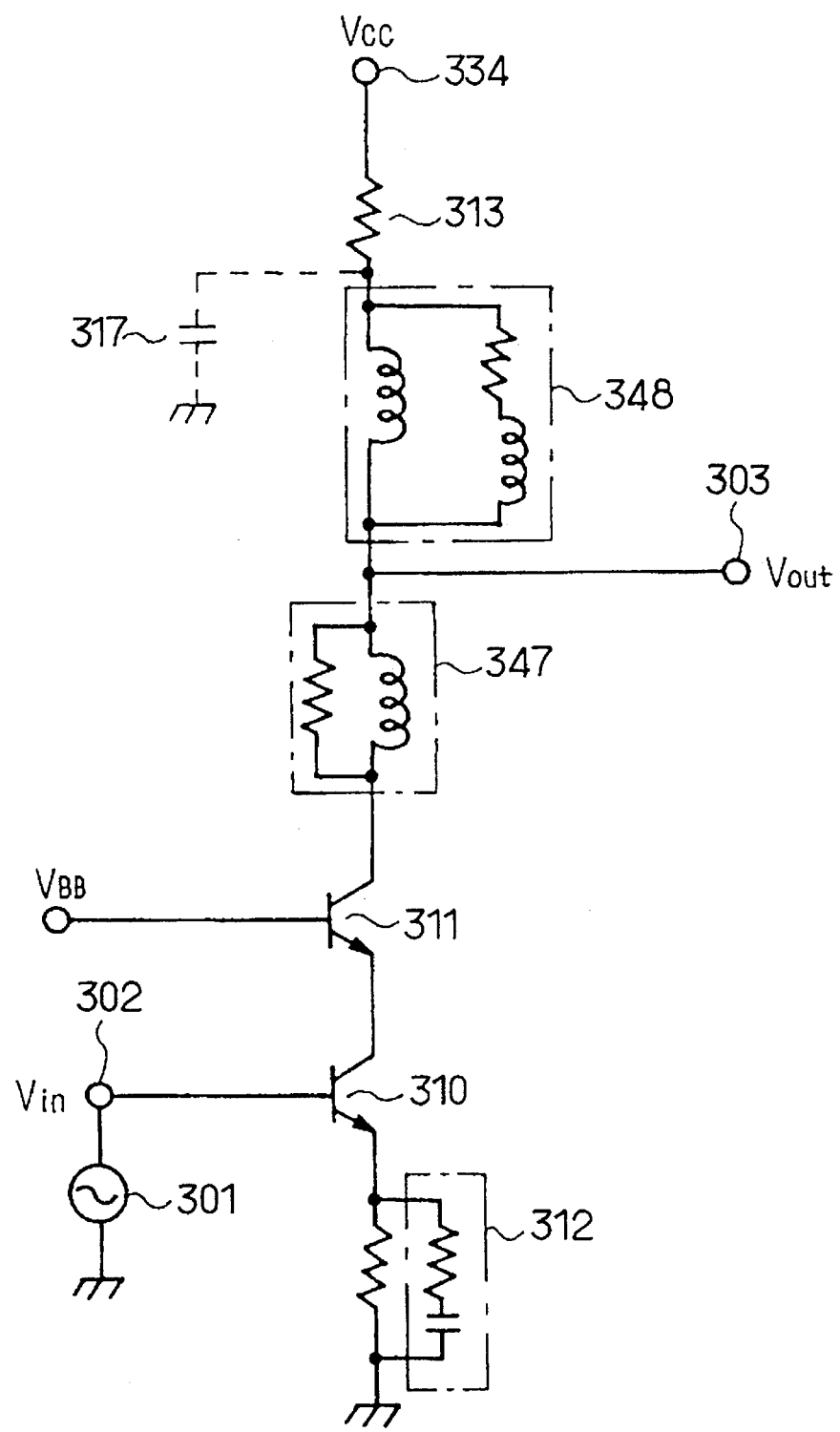
FIG. 59 is a circuit diagram illustrating a wideband amplifier as another embodiment of the present invention.

FIG. 59 depicts a circuit diagram illustrating the wideband amplifier as still another embodiment of the present invention. This embodiment has operational principles similar to those of the one in FIG. 58. The parallel peaking coil 343 and the constant-resistor circuit 340 in the embodiment in FIG. 58 are integrated to a constant-resistor peaking circuit 348 of a coil, a resistor and a coil.

One end of the constant-resistor peaking circuit 348 is connected with the output resistor 313. The other end of the constant-resistor peaking circuit 348 is connected to the collector of the transistor 311. One end of the series peaking coil 347 is connected with the collector of the transistor 311. The other end of the series peaking coil 347 is connected with both the constant-resistor peaking circuit 348 and the output pin 303.

The above-described construction described above can reduce the parasitic capacitance 17 due to the output resistor 313. A current flowing through the constant-resistor peaking circuit 348 is shunted into a high-frequency current flowing into the coil and a low-frequency current flowing into the resistor and the coil. Therefore, the resistor can be made smaller, the coil can be made thinner. Also, the parasitic capacitance on the resistor and the coil can be reduced.

The embodiment described above in FIG. 59 can make the amplifier have further wider frequency band and lower power consumption.

Figure 60:
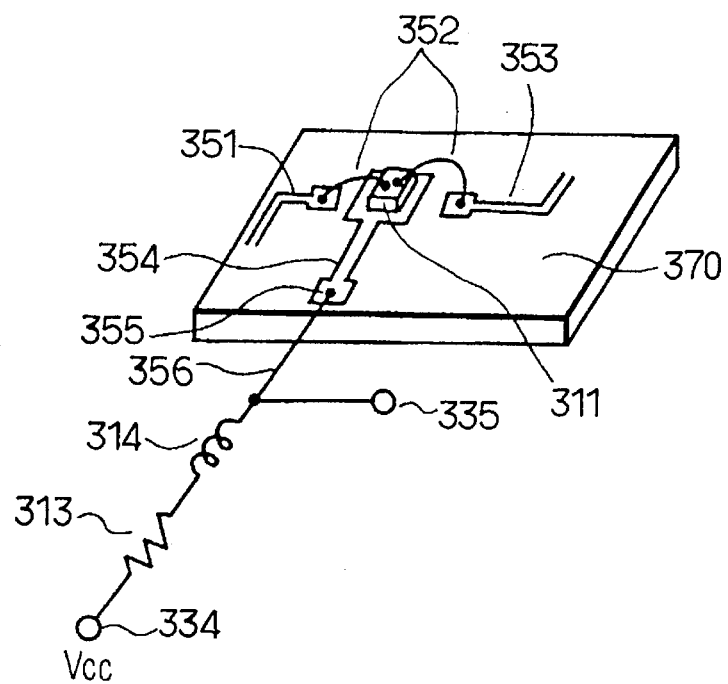
FIG. 60 is a perspective view illustrating an output resistor mounted for a wideband amplifier as another embodiment of the present invention.

In turn, FIG. 60 depicts a circuit diagram illustrating the wideband amplifier as still another embodiment of the present invention. This embodiment has the wideband amplifier made of a hybrid IC. The output transistor, as shown in the figure, is made to form a bear chip before being mounted on a ceramic board.

Figure 61:
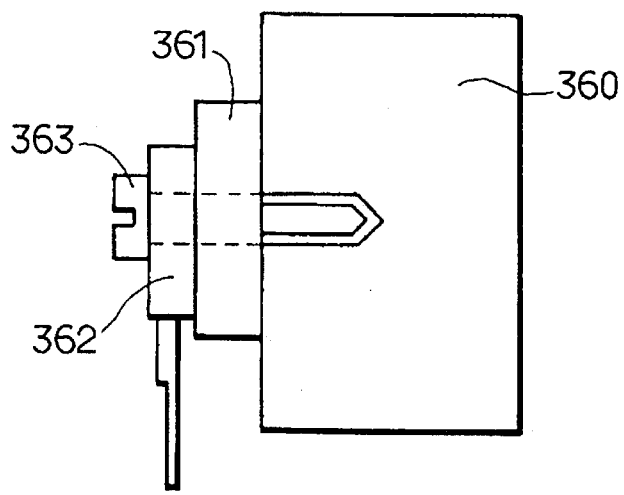
FIG. 61 is a cross-sectioned view illustrating structure of an output transistor of a prior wideband amplifier for use in a picture tube drive circuit.

First, FIG. 61 depicts a cross-sectioned view diagram illustrating structure of an output transistor of a usual wideband amplifier for use in a picture tube drive circuit. The output transistor of a usual wideband amplifier, as shown in the figure, usually has a heat-dissipating plate installed thereon. In the figure are indicated the heat-dissipating plate 360, an insulator 361, such as boronniteride, the output transistor 362, and a screw 363. The heat-dissipating plate 360 is often grounded. Some packages for the output transistor 362 have a lead frame connected with a collector thereof exposed on a side opposite to a side printed with a type of the output transistor 362. For the reason, it is often to use a package having the insulator 361, such as boron-niteride, put therein to reduce parasitic capacitance on the output transistor 362 and having the screw 363 made of an insulator, such as plastic.

However, even if we use the package having the insulator 361, such as boronniteride, put therein in and having the screw 363 made of an insulator, such as plastic, it is limited to reduce the parasitic capacitances on the lead frame of the output transistor 362 and the heat-dissipating plate 360. The lead frame of the output transistor 362 is often soldered on a bottom inside the chip for use as a collector pin.

In this embodiment, as shown in FIG. 60, the output transistor is made to form the bear chip so that the area of the lead frame can be minimized.

The structure shown in FIG. 60 is described below. For the output transistor 311, there are provided a base printed pattern 351, a bonding wire 352, an emitter printed pattern 353, a collector printed pattern 354, and a ceramic substrate 370. An output line of the output transistor 311 has a lead wire pad 355 connected thereto. The lead wire pad 355 is connected to one end of the parallel peaking coil 314 through a lead wire 356 as short as possible. The other end of the parallel peaking coil 314 is connected with one end of the output resistor 313. The other end of the output resistor 313 is ac-grounded. The lead wire 356 is branched to the output pin 335.

With the output transistor made to form the bear chip as such, the area of the lead frame can be minimized. Thus, the structure in FIG. 60 can reduce far more parasitic capacitance than the one in FIG. 61 and can make the amplifier have further higher power and wider frequency band and lower power consumption.

Note that forming the bear chip should not be limited to the transistors, but applicable to active elements, such as FETs, passive elements, such as capacitors, resistors, and coils, and non-linear elements, such as diodes. As for an element which cannot be formed into a chip or a signal wire which likely has parasitic capacitance, these should not be made to form a chip, but in package as usual before being connected with any of the elements which can be made to form a chip. That is, the signal line should be structured of chips of small-size elements and usual packages in a hybrid form.

Figure 62:
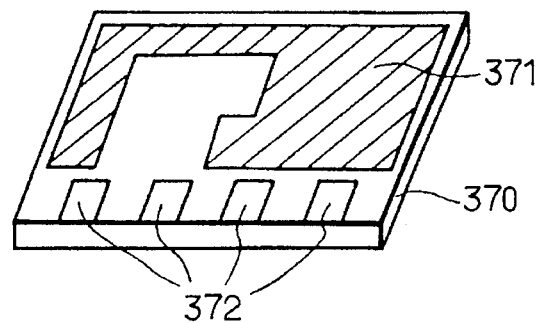
FIG. 62 is a perspective rear view illustrating a wideband amplifier of a hybrid IC on a ceramic substrate as another embodiment of the present invention.

In turn, FIG. 62 depicts a rear view illustrating the wideband amplifier on a ceramic substrate as still another embodiment of the present invention with the wideband amplifier formed of an hybrid IC. In FIG. 62 are shown the ceramic substrate 370, a ground pattern 371, and lead wire pads 372. Some of the lead wire pads 371 are connected with the ground pattern 371 on the rear side.

A rear side of a usual ceramic substrate is described below with the amplifier made of a hybrid IC by reference to FIG. 63 before the embodiment in FIG. 62 is described.

Figure 63:
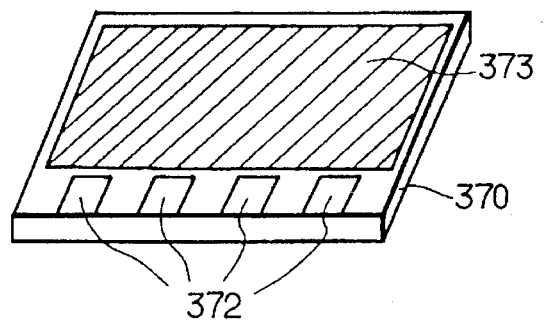
FIG. 63 is a perspective rear view illustrating a prior wideband amplifier of a hybrid IC on a ceramic substrate.

If the ceramic substrate usually has a heat-dissipating plate provided on the rear side thereof with the amplifier made of a hybrid IC, for example, the substrate has the ground pattern on a wide area of one side as shown in FIG. 63. That is, the ceramic substrate 370 has a ground pattern 373 on a wide area of the rear side thereof to strengthen soldering and has the lead wire pads 372 provided on the rear side.

However, the ground pattern on the wide area of the substrate will cause, for example, parasitic capacitance to increase on the output line of the amplifier, resulting in deterioration of the frequency response of the amplifier.

To prevent such a problem, as shown in FIG. 62, this embodiment has the ground pattern for the output line partly peeled off as long as the soldering strength for the heat-dissipating plate can be secured, thereby reducing the parasitic capacitance. As a result, such peeling can prevent the frequency response of the amplifier from deteriorating.

If it is required to prevent solder from dispersing over the parts from which the ground pattern is peeled off, an insulator should be coated on those parts. Although most of the rear side of the ceramic substrate 370 is usually for the ground pattern, even small parts can be used for a power source pattern, such as $V_{CC}$, and an open pattern.

Figure 64:
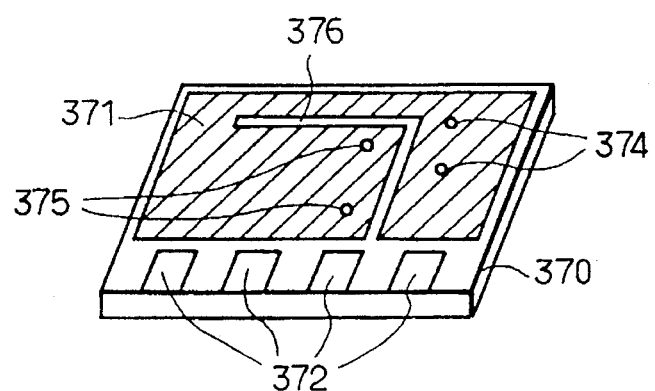
FIG. 64 is a perspective rear view illustrating a wideband amplifier of a hybrid Ic on a ceramic substrate as another embodiment of the present invention.

In turn, FIG. 64 depicts a rear view illustrating the wideband amplifier as still another embodiment of the present invention. This embodiment has the ground pattern for the output line peeled off to reduce parasitic capacitance. Also, the embodiment has the ground pattern for a high-frequency circuit separated from the one for a low-frequency circuit to stabilize the circuit operation.

The embodiment, as shown in FIG. 64, has dc or low-frequency ground through-holes 374 and high-frequency or high-signal circuit ground through-holes 374 as well as the ceramic substrate 370, the ground pattern 371 and the lead wire pads 372. The dc or low-frequency ground through-holes 374 and the high-frequency or high-signal circuit ground through-holes 374 are separated from each other by a groove 376 to separate the signal current paths for stable circuit operation. If the head-dissipating plate is provided, also, the signal currents can be kept in the ground pattern of low impedance for securing circuit stability. Further, the dc or low-frequency ground through-holes 374 and high-frequency or high-signal circuit ground through-holes 374 can be completely isolated from each other.

Figure 65:
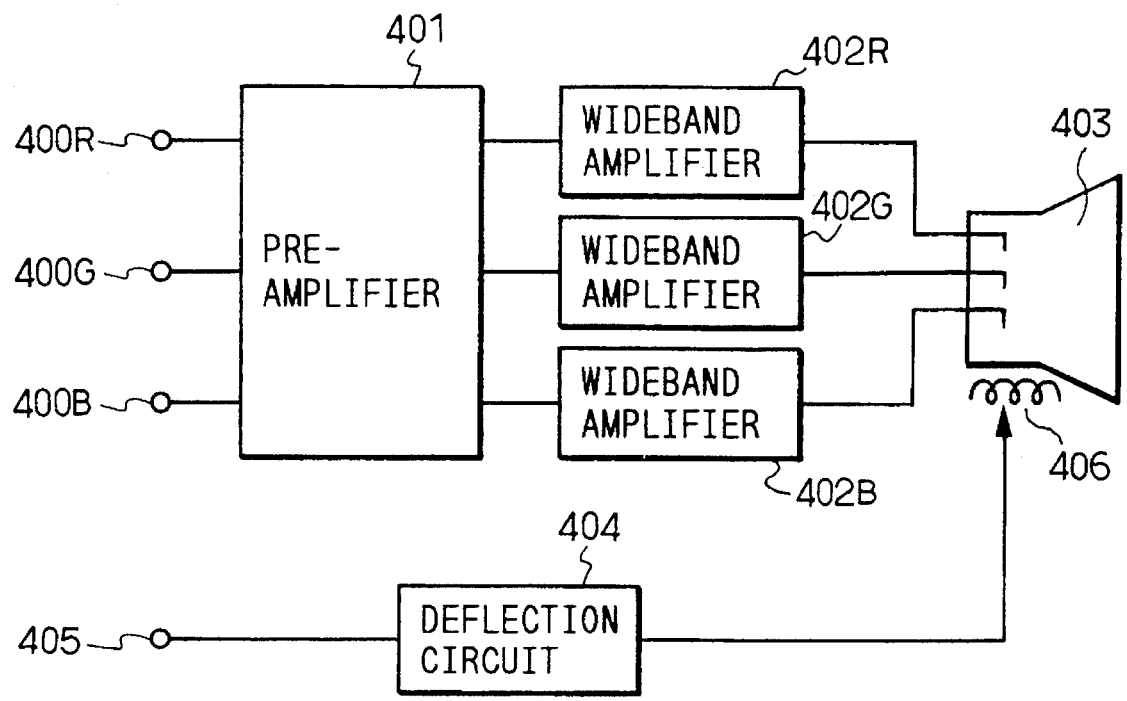
FIG. 65 is a block diagram illustrating a display apparatus as another embodiment of the present invention.

Finally, FIG. 65 depicts a block diagram illustrating a display apparatus as still another embodiment of the present invention. This embodiment makes use of at least any one of the previous embodiments of wideband amplifier described above in the display apparatus thereof. In FIG. 65, that is, at least any one of the previous embodiments described above is used for wideband amplifiers 402R, 402G, and 402B.

In FIG. 65, video signals R, G, and B are input to a preamplifier 401 through input pins 400R, 400G, and 400B, respectively. The video signals R, G, and B are processed by the preamplifier 401 before being fed to the respective wideband amplifiers 402R, 402G, and 402B to amplify for which previous embodiment described above is used. The respective signals amplified by the wideband amplifiers 402R, 402G, and 402B are fed out to a display 403.

On the other hand, a synchronizing signal is input to a deflection circuit 404 through a synchronizing signal input pin 405. A signal output of the deflection circuit 404 is input to a deflection coil.

With use of at least any one of the previous embodiments described above for the wideband amplifiers 402R, 402G, and 402B, the display apparatus provides lower power consumption, smaller size, and high resolution. Further, the smaller size is an important effect of the present invention in that it can make shielding the amplifier easier and suppress an undesired radiation from the display apparatus.

Figure 66:
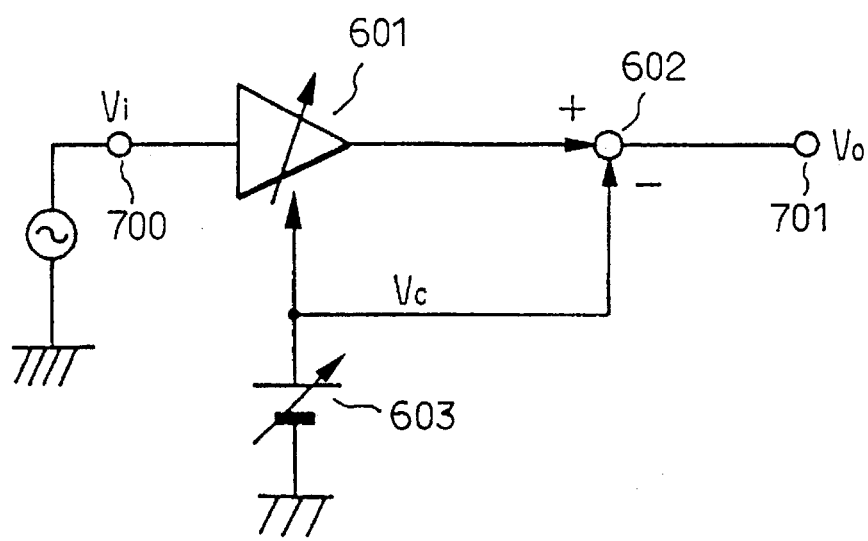
FIG. 66 is a circuit diagram illustrating an embodiment of the present invention according to the third object of the present invention.

FIG. 66 depicts a circuit diagram illustrating a signal processor as an embodiment of the present invention for accomplishing the third object of the present invention. In FIG. 66, an output of a variable gain amplifier 601 having a signal input through an input pin 700 is connected to one input of an adder-subtracter 602. The aforementioned wideband amplifier can be employed as an output circuit of the variable gain amplifier 601 and an output circuit of the adder-subtracter 602.

To control a gain of the variable gain amplifier 601, a control signal fed from a control signal source 603 is fed to the other input of the adder-subtracter 602 and to a grain control pin of the variable gain amplifier 601. An output of the adder-subtracter 602 is connected to an output pin 701 of the signal processor.

Figure 67:
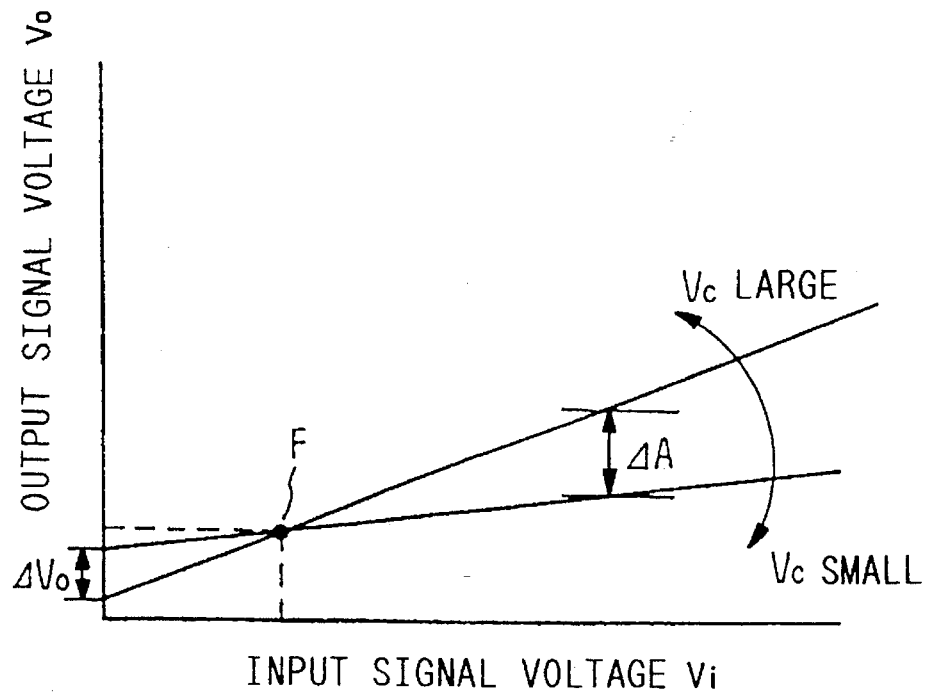
FIG. 67 is a characteristic graph illustrating a relationship between an input signal and an output signal of the signal processor in FIG. 66.

In turn, the embodiment is described below by reference to FIG. 67 together. FIG. 67 depicts a characteristic graph illustrating a relationship between the input signal and the output signal of the signal processor in FIG. 66. In FIGS. 66 and 67, Vi and Vo indicate the input and output signal voltages, respectively, and Vc is the control signal voltage. In FIG. 67, the axis of abscissas takes the input signal voltage Vi, and the axis of ordinates takes the output signal voltage Vo.

The variable gain amplifier 601 can vary its output signal amplitude on the basis of the control signal voltage Vc fed from the control signal source 603 to adjust the drive. Let a variation of the output signal amplitude be $\Delta A$. The adder-subtracter 602 can control a dc level of the output voltage with the gain variation in adjustment of the drive. Let a variation of the output signal amplitude be $\Delta V_o$.

The control signal source 603 can not only control the gain of the variable gain amplifier 601, but can also control the output voltage $V_o$ of the signal processor through the adder-subtracter 602. Assume a ratio of $\Delta A$ to $\Delta V_o$ be always constant.

In the above operation, FIG. 67 shows an operating point (hereinafter referred to as the fixed operating point F) at which the input and output relationship can be kept even if the gain of the variable gain amplifier 601 is varied. That is, the adder-subtracter 602 can operate to keep the relationship that the output dc level can be decreased while the variable gain amplifier 601 increases the gain in the drive adjustment.

Therefore, the variable gain amplifier 601 can be replaced by an inverted variable gain amplifier, and the adder-subtracter 602 by a mere adder. If a change of the fixed operating point F in varying the gain is in a negligible range, the relationship between the gain of the variable gain amplifier and the control voltage may not be linear. Also, in FIG. 66, the input signal used is the voltage signal. Instead, the input signal can be a current signal. Changing the ratio of $\Delta A$ to $\Delta V_o$ can set the fixed operating point F to a desired point.

Figure 68:
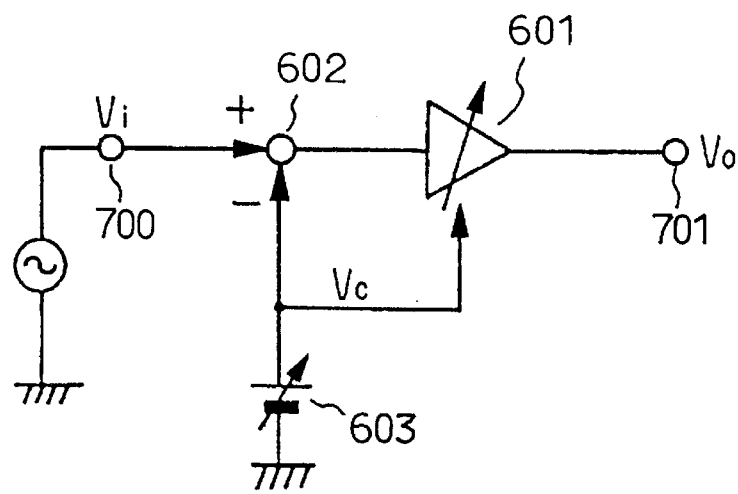
FIG. 68 is a circuit diagram illustrating a version of the embodiment in FIG. 66.
Figure 69:
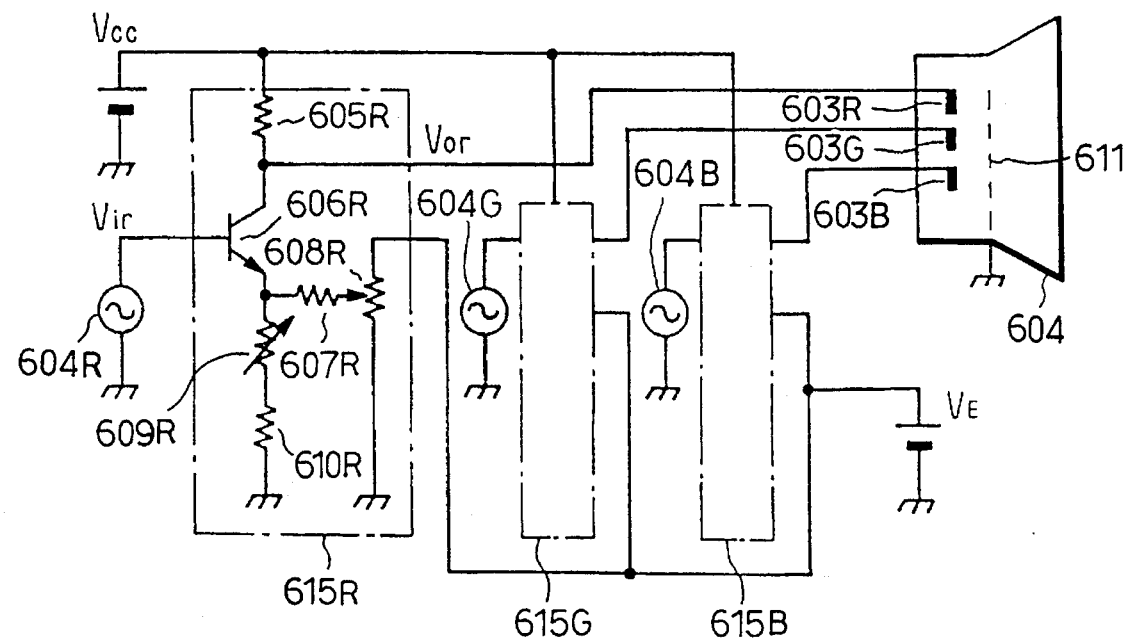
FIG. 69 is a circuit diagram illustrating a prior video amplifier for use in a color CRT display.

FIG. 68 depicts a circuit diagram illustrating a version of the embodiment in FIG. 66. In FIG. 68, an input signal to be processed is fed to one input pin of the adder-subtracter 602 through an input pin 700. A signal output of the adder-subtracter 602 is fed into and amplified by the variable gain amplifier 601 before being fed out to an output pin 701. A control signal from the control signal source 603 is fed to a gain control pin of the variable gain amplifier 601 and at the same time, fed to the other input pin of the adder-subtracter 602. Such a circuit construction, also, can provide the same effect as the embodiment in FIG. 66.

Figure 71:
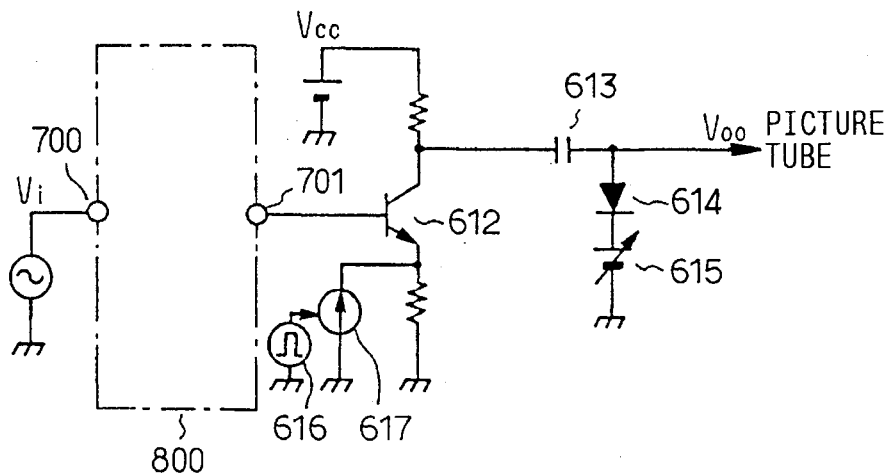
FIG. 71 is a circuit diagram illustrating an embodiment of the present invention used in a video signal amplifier circuit.

In turn, FIG. 71 depicts a circuit diagram illustrating an embodiment of the signal processor of the present invention used in the video signal amplifier circuit. In FIG. 71, 800 indicates the signal processor of the present invention. The signal processing circuit 800 has an amplifier circuit formed of a transistor 612 and a clamping circuit formed of a capacitor 613 and a diode 614 provided there behind to from the video signal amplifier circuit.

A blanking current source 617 driven by a blanking signal source 616 is connected to an embitter of the transistor 612. This can automatically make the diode 614 conduct only in blanking for clamping operation. With the clamping operation, a maximum potential and a dc voltage for driving the picture tube can be controlled with use of a cutoff adjusting variable voltage source 615. Alternatively, a similar clamping operation can be achieved by decreasing a base voltage of the transistor 612 in blanking.

Figure 70:
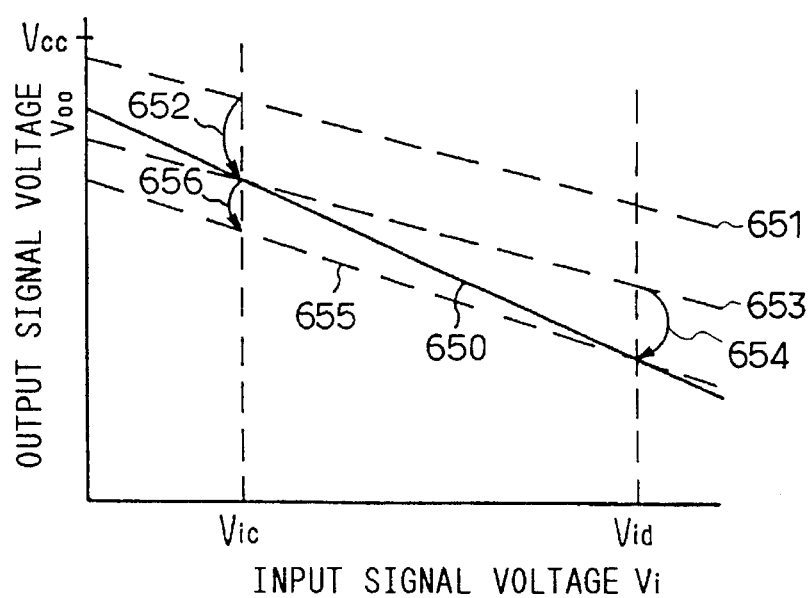
FIG. 70 is a characteristic graph illustrating an input-output characteristics of a video amplifier circuit.
Figure 72:
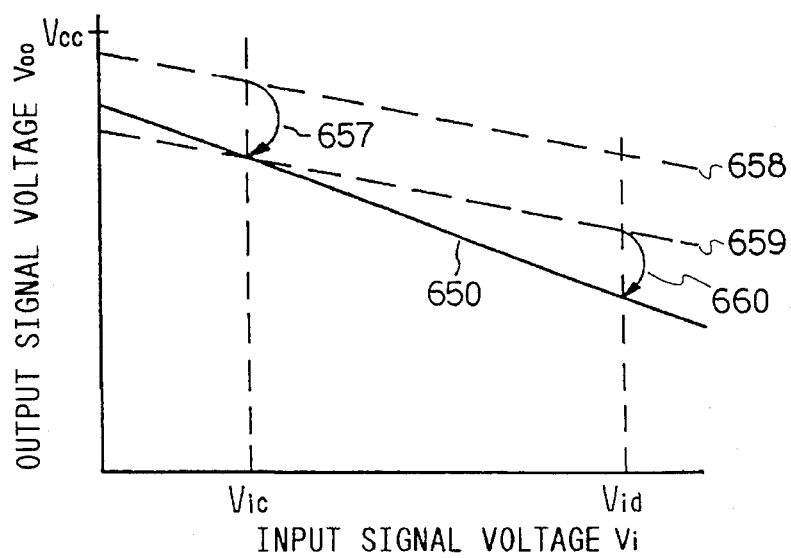
FIG. 72 is a characteristic graph illustrating an input-output characteristics of a video signal processor circuit.

A white balance adjustment process in the embodiment in FIG. 71 is described below with use of an input-output characteristic graph of the video signal processor circuit shown in FIG. 72. In the characteristic graph in FIG. 72, like the one in FIG. 70, the axis of abscissas takes the input signal voltage Vi, and the axis of ordinates takes the output signal voltage Voo. A solid characteristic straight line 650 indicates a desired input-output characteristic. Assume an initial state of the video signal amplifier circuit be a characteristic shown by a broken line 658.

A first cutoff adjustment should be made to shift the level to a characteristic indicated by a broken line 659 as shown by an arrow 657. Even if a voltage gain adjustment is indicated by an arrow 660 in the next drive adjustment, a desired input-output characteristic can be achieved without a repeated adjustment since the already set output operating point in the cutoff adjustment is kept constant.

Figure 73:
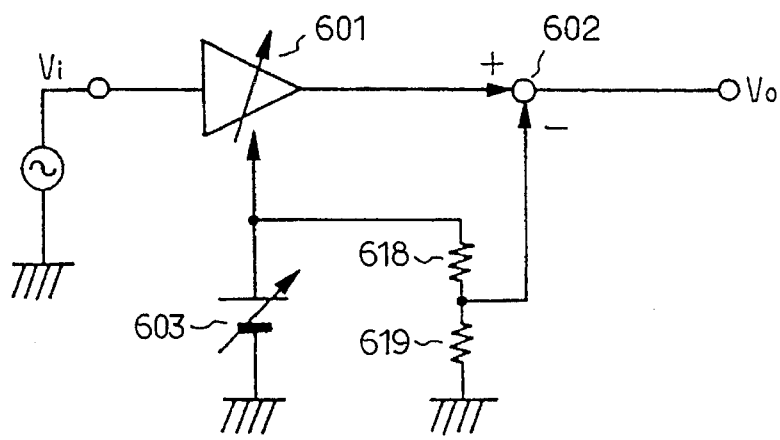
FIG. 73 is a circuit diagram illustrating another embodiment of the present invention which has a feature that a resistance voltage divider circuit is used to set the fixed operating point F to a desired point.

In turn, FIG. 73 depicts a circuit diagram illustrating an embodiment of the present invention which has a feature that a resistance voltage divider circuit is used to set the above-mentioned fixed operating point F to a desired point. The signal flow in FIG. 71 is the same as in FIG. 66 except that in FIG. 73, the control signal source 603 for controlling the output signal of the signal processor is divided by the resistance voltage divider circuit formed of resistors 618 and 619. The divided voltage is connected to the adder-subtracter 602.

The resistance voltage divider circuit can set the fixed operating point F to a desired position determined in terms of the resistors 618 and 619. One of the resistors 618 and 619 can be replaced by a variable resistor for the same effect. Also, both resistors 618 and 619 can be replaced by a single variable resistor, and its slider can be connected to the adder-subtracter 602.

Figure 74:
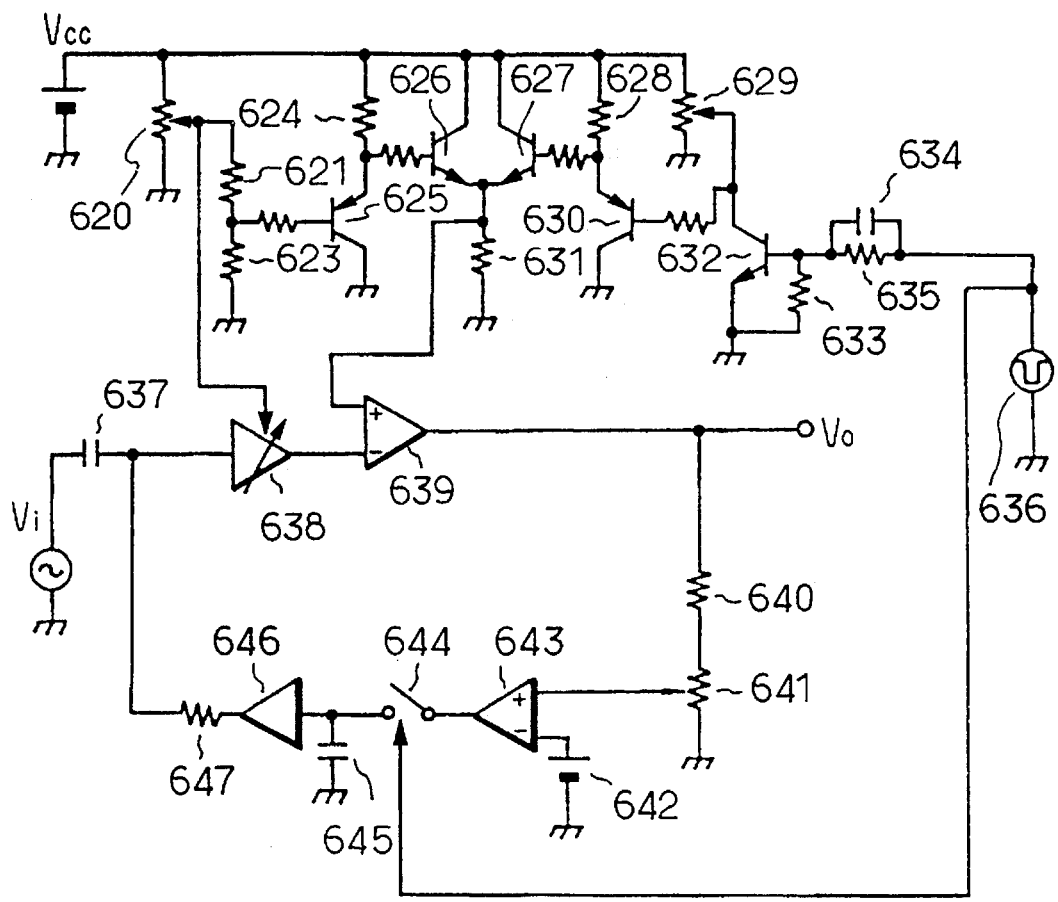
FIG. 74 is a circuit diagram illustrating a detailed embodiment for accomplishing the third object of the present invention.

In turn, FIG. 74 depicts a circuit diagram illustrating a detailed embodiment for accomplishing the third object of the present invention. The embodiment in FIG. 74 comprises a dc restorer formed of an OP amplifier (or differential amplifier) 643, an in-phase amplifier 646, and a switching circuit 644 switched on the basis of a negative blanking signal source 636, a variable gain controller formed of a variable gain amplifier 638, a differential amplifier 639, and a variable resistor 620, a blanking circuit formed of a transistor 632 switched on the basis of the negative blanking signal source 636, a switching circuit formed of transistors 626 and 627, and the variable gain amplifier 638 and the differential amplifier 639.

In turn, the following describes operation of the embodiment in FIG. 74. The input signal to be processed is ac-coupled through a capacitor 637 with the variable gain amplifier 638. The drive adjustment is made by the variable resistor 620. A signal amplitude of the variable gain amplifier 638 is varied on the basis of a control voltage appearing at a slider of the variable resistor 620. An output of the variable gain amplifier 638 is fed to an inverted input of the differential amplifier 639.

The control voltage obtained from the variable resistor 620 is divided through a resistance voltage divider circuit of resistors 621 and 622 before being input to a base of an emitter follower transistor 625. An output of the transistor 625 is fed to a base of the transistor 626. On the other hand, the negative blanking signal source 636 is connected to a base of the grounded-emitter transistor 632. During blanking, the transistor 632 is cut off before voltage obtained from the slider of a variable resistor 629 is fed to a base of a transistor 630. An output of the transistor 630 is fed to a base of the transistor 627.

A capacitor 634 is connected to make higher a response of the transistor 632 to the negative blanking signal. An emitter connection point of the switching circuit formed of the transistors 626 and 627 feeds out a base signal of the transistor 627 for a period of blanking, while it feeds out a base signal of the transistor 626 for a period of display. These output signals are fed to non-inverted input of the differential amplifier 639. As a result, a blanking pulse is added to the input signal. In this embodiment, the differential amplifier 639 serves as an adder-subtracter.

Further the output of the differential amplifier 639 is divided by a resistor 640 and a variable resistor 641. The divided voltage signal is fed to a non-inverted input of the OP amplifier (or differential amplifier) 643. The divided voltage signal is dc-restored equal to a voltage of a dc voltage source 642. An error signal obtained at the output of the OP amplifier (or differential amplifier) 643 is fed to the in-phase amplifier 646 through the switch 644 closed during blanking and is returned to an input of the variable gain amplifier 638 through a resistor 647.

A capacitor 645 is a hold capacitor for holding the input signal to the in-phase amplifier 646 while the switch 644 is closed. These means can obtain the fixed operating point F when the gain is varied.

Figure 75:
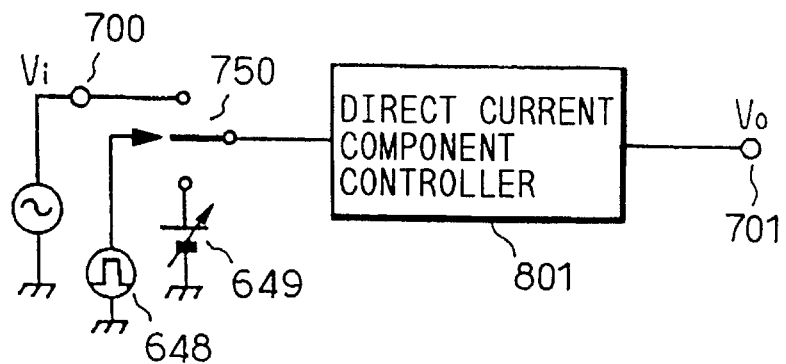
FIG. 75 is a circuit diagram illustrating an embodiment for accomplishing the fourth object of the present invention.

In turn, FIG. 75 depicts a circuit diagram illustrating an embodiment for accomplishing the fourth object of the present invention. In FIG. 75, one input pin of a switching circuit 750 switched on the basis of a blanking signal source 648 has an input signal to be processed input through the input pin 700. The other input pin of the switching circuit 750 has a dc level control signal for blanking input from a signal source 649. An output pin of the switching circuit 750 is connected to a dc component controller 801. An output pin of the dc component controller 801 is connected to the output pin 701. The aforementioned wideband amplifier can be employed in the dc component controller 801. Otherwise, the aforementioned wideband amplifier can be provided to an input or output side of the dc component controller 801.

In turn, the following describes operation of the embodiment in FIG. 75. The switching circuit 750 is switched on the basis of the blanking signal source 648 to serve to switch an input signal level to the dc level based on the dc level control signal source 649 for a period of blanking. That is, the switching circuit 750 is normally on the input pin 700 side to take the input signal in, while it is switched to the dc level control signal source 649 side for a period of blanking by the blanking signal generated for that period. As a result, a signal (dc pulse) the dc level of which continues for a short period of time is added to the input signal.

Therefore, during blanking, the input signal to be processed has the blanking pulse (dc pulse) added thereto. The dc component controller 801 newly controls a level of a dc component (dc pulse) of the signal having been subjected to the above-mentioned switching process. These means can make the signal processor effectively use a signal input dynamic range. That is, the input dynamic range can contain only a changeable range containing both the ac component of the signal and the dc component due to the brightness control.

Therefore, after the blanking pulse is added, the signal can be transmitted as being ac-coupled. Also, it is possible to not only transmit the dc component of the input signal, but also control the new dc component (brightness). For example, it is possible to control the dc component of the signal to fix the operating point. Further, a dc restorer circuit formed of a clamping circuit is provided just in front of the drive pin of the picture tube to reduce the power voltage and the power consumption of the video output amplifier.

Figure 76:
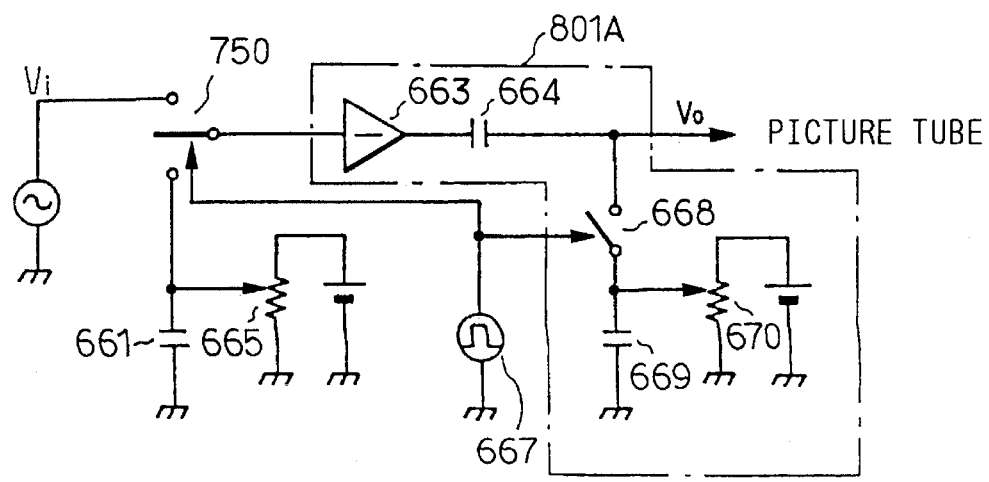
FIG. 76 is a circuit diagram illustrating an embodiment of the present invention in which a video signal amplifier circuit is used for accomplishing the fourth object of the present invention.

In turn, FIG. 76 depicts a circuit diagram illustrating an embodiment of the present invention in which a video signal amplifier circuit is used for accomplishing the fourth object of the present invention. In FIG. 76, an inverted amplifier 663 is connected to the output pin of the switching circuit 750 switched on the basis of a blanking signal source 667. The aforementioned wideband amplifier can be employed as the inverted amplifier 663. The inverted amplifier 663 has a dc component restorer circuit 801A formed of a capacitor 664 and a switch 668 provided there behind to form the video signal amplifier circuit.

The switching circuit 750 is switched on the basis of the blanking signal source 667 to serve to switch an input signal level to the dc based on a dc level control variable resistor 665 for the period of blanking. With such a dc component restoration operation, a dc voltage component of the output signal Voo for driving the picture tube can be controlled with use of a cut-off adjustment variable resistor 670. Capacitors 661 and 669 are bypass capacitors to prevent an effect of a current which is made to flow when the switches 750 and 668 are switched to the variable resistors 665 and 670 sides, respectively.

Figure 77:
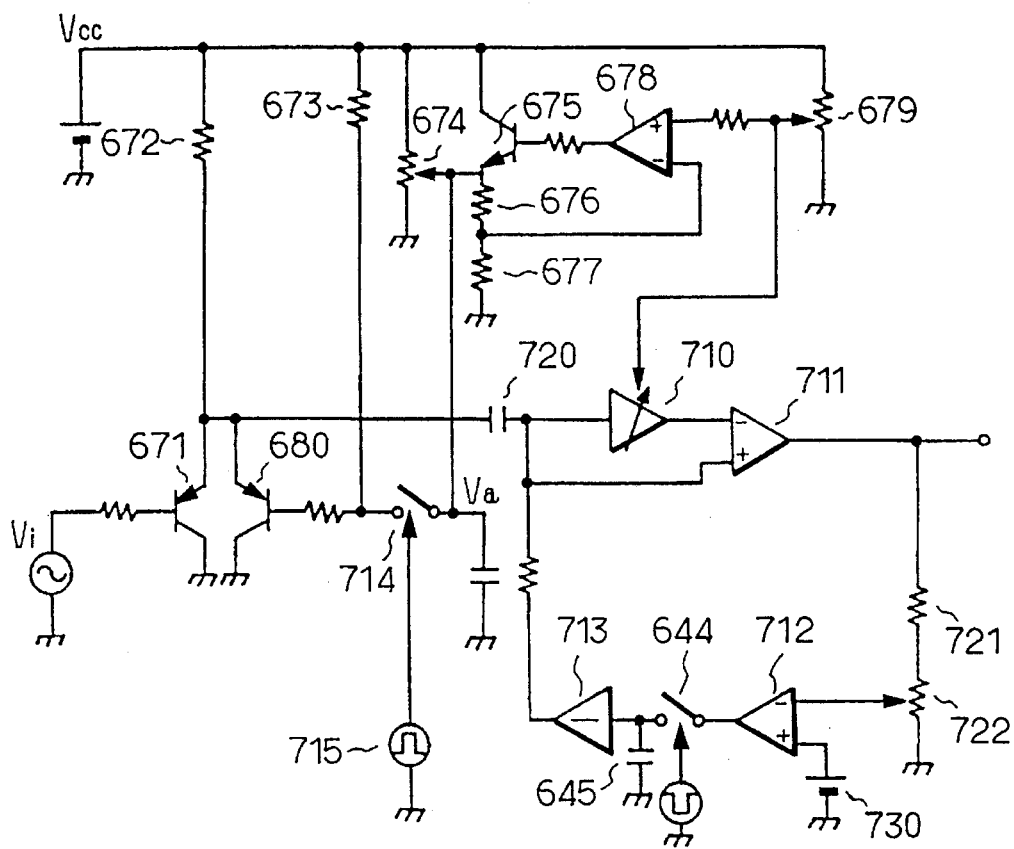
FIG. 77 is a circuit diagram illustrating an embodiment for accomplishing the third and fourth objects of the present invention.

In turn, FIG. 77 depicts a circuit diagram illustrating an embodiment for accomplishing the third and fourth objects of the present invention at the same time. The embodiment in FIG. 77 comprises a switching circuit formed of transistors 671 and 680, a negative feedback amplifier circuit formed of a variable gain amplifier 710, a differential amplifier 711, an OP amplifier (or differential amplifier) 712, and an inverted amplifier 713, an in-phase amplifier formed of an OP amplifier (or differential amplifier) 678 and an emitter follower transistor 675, and a blanking circuit having a switch 714 switched on the basis of a negative blanking signal source 715.

In turn, the following describes operation of the embodiment in FIG. 77. The input signal to be processed is connected to a base of the transistor 671. The switch 714 switched on the basis of the negative blanking signal source 715 is connected to a base of the transistor 680. The switch 714 feeds an output voltage Va of the dc voltage source circuit to a base of the transistor 680 for a period of blanking. An emitter connection point of the switching circuit formed of the transistors 671 and 680 feeds out a base voltage of the transistor 680 for a period of blanking, while it feeds out a base voltage of the transistor 671 for a period of display.

As a result, the signal appearing at the emitter connection point of the transistors 671 and 680 has a waveform of the input signal added with the blanking pulse. The input signal added with the blanking pulse is ac-coupled through a capacitor 720 with the variable gain amplifier 710. The drive adjustment is made by a variable resistor 679. A signal amplitude of the variable gain amplifier 710 is varied on the basis of a control voltage appearing at a slider of the variable resistor 679. An output of the variable gain amplifier 710 is fed to an inverted input of the differential amplifier 711. In this embodiment, the differential amplifier 711 serves as an adder-subtracter. Further the output of the differential amplifier 711 is divided by a resistor 721 and a variable resistor 722. The divided voltage signal is fed to an inverted input of the OP amplifier 712. The divided voltage signal is dc-restored to a target voltage of a dc voltage source 730 by the switch 644 which is closed for the period of negative blanking. The dc-restored signal is fed to the inverted amplifier 713. The inverted signal is returned to an input of the variable gain amplifier 710 through a resistor. A capacitor 645 is a hold capacitor for holding the input signal to the inverted amplifier 713 while the switch 644 is closed.

These means can obtain the fixed operating point F when the gain is varied. Also, they can make effective use of the signal dynamic range of the signal processor circuit. Further, the switching circuit formed of the resistors 671 and 680 can be replaced by an adder-subtracter or a differential amplifier having the blanking signal source input to one input pin thereof.

Figure 78:
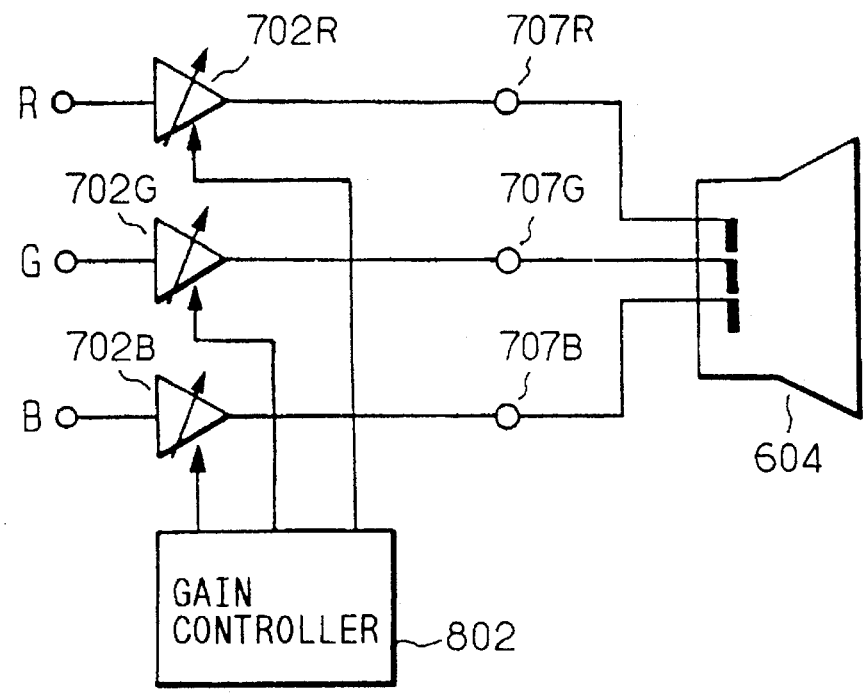
FIG. 78 is a circuit diagram illustrating an embodiment for accomplishing the fifth object of the present invention.

In turn, FIG. 78 depicts a circuit diagram illustrating an embodiment for accomplishing the fifth object of the present invention. The embodiment in FIG. 78 uses three variable gain amplifiers 702R, 702G, and 702B to which the respective primary color signals R, G, and B are input. Three output pins of a gain controller 802 are connected to the respective control pins of the above-mentioned three variable gain amplifiers 702R, 702G, and 702B. Output pins of the three variable gain amplifiers 702R, 702G, and 702B are connected to the respective output pins 707R, 707G, and 707B of the signal processor of the present invention.

In turn, the following describes operation of the embodiment in FIG. 78. Each of the three variable gain amplifiers 702R, 702G, and 702B is used for drive adjustment, or to vary the respective signal amplitudes on the basis of control signals. The gain controller 802 can control gains of the three variable gain amplifiers 702R, 702G, and 702B so that the circuit operation can be normally made without change of brightness in white display. These means can make the signal processor cause no change of the brightness in variation of color temperature and make it hard to lose the white balance.

Figure 79:
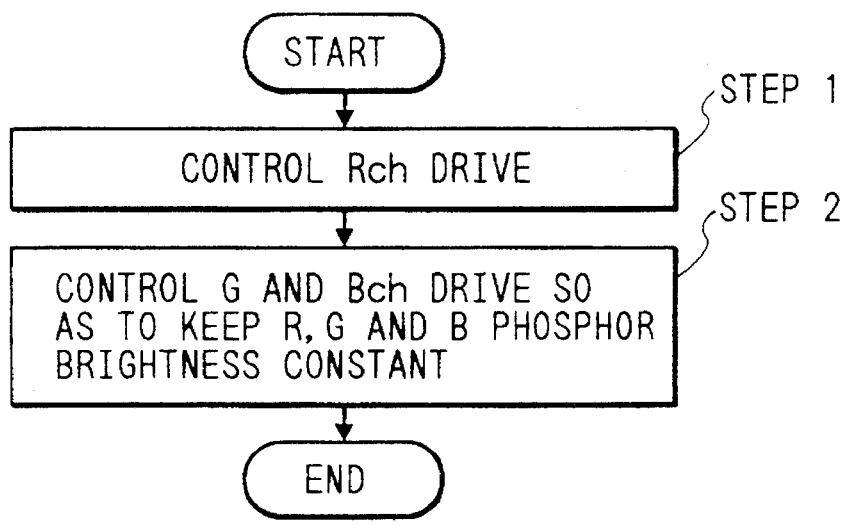
FIG. 79 is a flow chart illustrating an operation flow of the gain controller in FIG. 78.

FIG. 79 depicts a flow chart illustrating an example of operation flow of the gain controller 702 in FIG. 78 if a user drive-controls the R channel. The following describes the drive control by reference to FIG. 79.

In step 1, the gain of the variable gain amplifier 702R is adjusted on the basis of the drive control of the R channel by the user. In step 2, the G and B channels are drive-controlled so that a sum of brightnesses of the R, G, and B phosphors in white display can be kept constant with the amount of R channel drive control adjusted in step 1. This completes the drive control.

With such a control process, the signal processor will not cause the brightness in white display to change and the white balance to be lost even if the user varies the color temperature. Also, even if the user drive-controls the G channel, step 1 can drive-control the G channel, and step 2 can drive-control the R and B channels so that the sum of the brightnesses of the R, G, and B phosphors in white display can be kept constant with the amount of G channel drive control adjusted in step 1, thus completing the drive control.

Further, even if the user drive-controls the B channel, step 1 can drive-control the B channel, and step 2 can drive-control the R and G channels so that the sum of the brightnesses of the R, G, and B phosphors in white display can be kept constant with the amount of B channel drive control adjusted in step 1, thus completing the drive control. In addition, the user's drive control is made possible if variable resistor knobs for control and key switches and the like as interface for digital control are arranged at positions available for the user.

Figure 80:
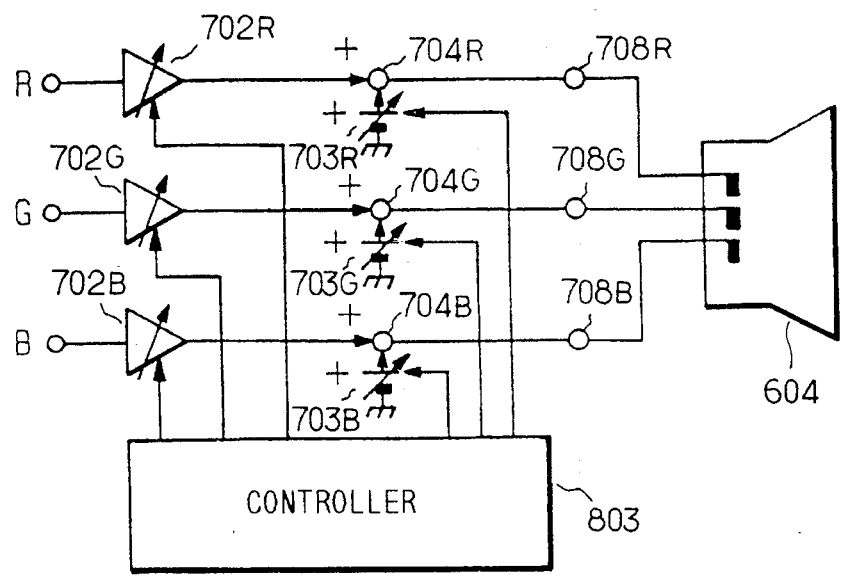
FIG. 80 is a circuit diagram illustrating an embodiment of the present invention in which a color temperature can be varied with a white balance kept correctly as a drive adjustment is made in parallel with a cut-off adjustment as well.

In turn, FIG. 80 depicts a circuit diagram illustrating an embodiment of the present invention in which a user can vary the color temperature with the white balance kept correctly as the drive adjustment is made in parallel with a cut-off adjustment as well. In FIG. 80, each of the three variable gain amplifiers 702R, 702G, and 702B mentioned in FIG. 78 has the respective primary color signals R, G, and B input to one input thereof, respectively. Each of the outputs of the three variable gain amplifiers 702R, 702G, and 702B is connected to one input of each of the adders 704R, 704G, and 704B, respectively. The other input of each of these adders has the respective variable voltage sources 703R, 703G, and 703B connected thereto.

Further, six outputs of a controller 803 are connected to the respective control pins of the three variable gain amplifiers 702R, 702G, and 702B and the respective control pins of the three variable voltage sources 703R, 703G, and 703B as shown. Output pins of the three adders 704R, 704G, and 704B are connected to the respective output pins 708R, 708G, and 708B of the signal processor of the present invention.

In turn, the following describes operation of the embodiment in FIG. 80. The three variable gain amplifiers 702R, 702G, and 702B are for use in drive adjustment to vary the respective signal amplitudes on the basis of control signals. The three adders 704R, 704G, and 704B are used for cut-off adjustments in a way that they can control the respective dc voltages of the variable gain amplifiers 702R, 702G, and 702B on the basis of the control signals to control the dc levels of the signals. The gain controller 802 can control gains of the three variable gain amplifiers 702R, 702G, and 702B so that the circuit operation can be normally made without change of brightness in white display.

If the white balance is lost with the above-described control process, the controller 803 makes the three adders 704R, 704G, and 704B do the cut-off adjustments before making the three variable gain amplifiers 702R, 702G, and 702B do the drive adjustments to correct the white balance. These means can make the signal processor cause no change of the brightness in variation of color temperature and no loss of the white balance.

Figure 81:
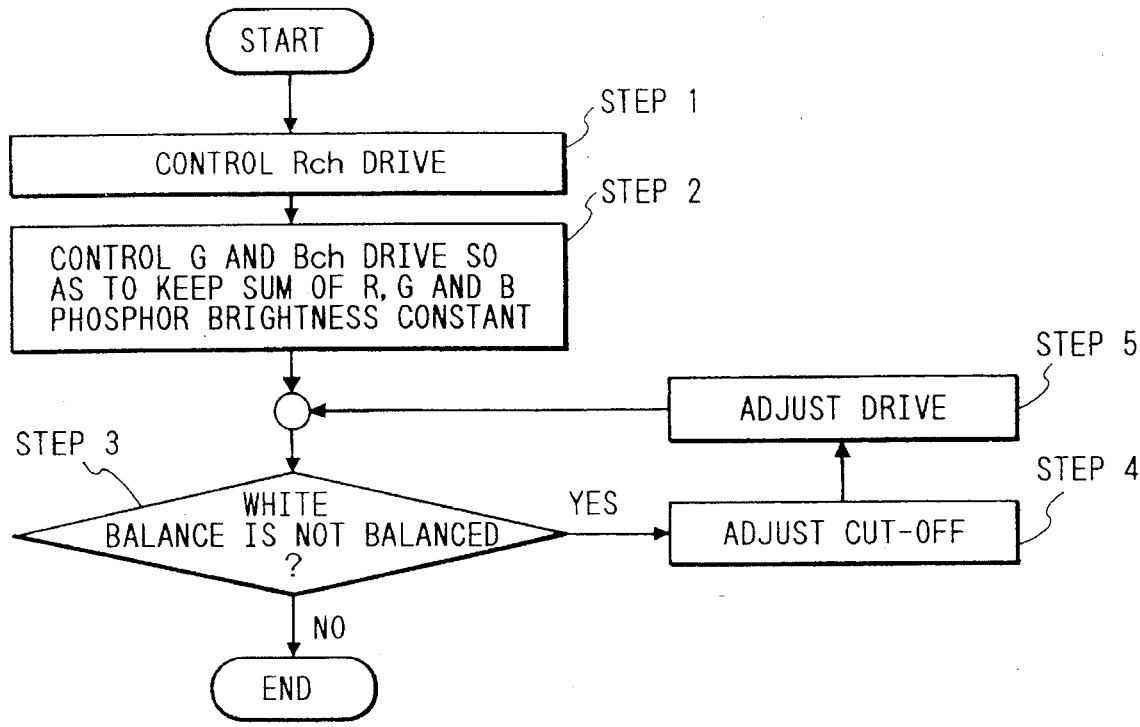
FIG. 81 is a flow chart illustrating an operation flow of the gain controller in FIG. 80.

FIG. 81 depicts a flow chart illustrating an example of operation flow of the controller 803 in FIG. 80 with the R channel drive-controlled by the user. The following describes the drive control and cut-off adjustment process by reference to FIG. 81.

In step 1, the gain of the variable gain amplifier 702R is adjusted on the basis of the drive control of the R channel by the user. In step 2, the G and B channels are drive-controlled so that a sum of brightnesses of the R, G, and B phosphors in white display can be kept constant with the amount of R channel drive control adjusted in step 1. In step 3, judgement is made as to whether or not loss of the white balance exceeds a permissible range in steps 1 and 2 above. If no excessive loss of the white balance is judged, the process ends.

If excessive loss of the white balance is judged in step 3, step 4 makes the cut-off adjustment before step 5 makes the drive adjustment. In turn, step 3 judges as to whether or not the white balance is lost. With such a control process, the signal processor will not cause the brightness in white display to change and the white balance to be lost even if the user varies the color temperature.

Also, even if the user drive-controls the G channel, step 1 can drive-control the G channel, and step 2 can drive-control the R and B channels so that the sum of the brightnesses of the R, G, and B phosphors in white display can be kept constant with the amount of G channel drive control adjusted in step 1. Step 3 and the following steps proceed as above.

Further, even if the user drive-controls the B channel, step 1 can drive-control the B channel, and step 2 can drive-control the R and G channels so that the sum of the brightnesses of the R, G, and B phosphors in white display can be kept constant with the amount of B channel drive control adjusted in step 1. Step 3 and the following steps proceed as above.

In addition, the user's drive control is made possible if variable resistor knobs for control and key switches and the like as interface for digital control are arranged at positions available for the user.

Figure 82:
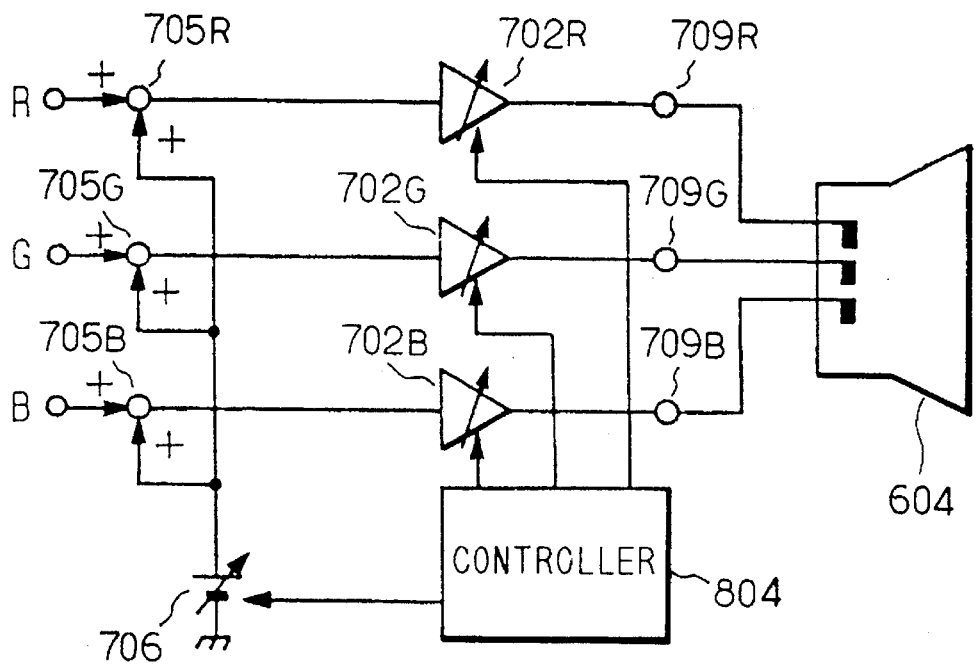
FIG. 82 is a circuit diagram illustrating an embodiment of the present invention in which a color temperature can be changed while a white balance can be kept accurately without a cut-off adjustment.

In turn, FIG. 82 depicts a circuit diagram illustrating an embodiment of the present invention in which the white balance can be kept accurately without the cut-off adjustment if a user makes the drive control (color temperature change in white display). In FIG. 82, each of three adders 705R, 705G, and 705B has the respective primary color signals R, G, and B input to one input thereof, respectively. The other input of each of these adders has a variable voltage source 706 brightness control connected thereto. Each of outputs of the three adders 705R, 705G, and 705B is connected to the respective inputs of the three variable gain amplifiers 702R, 702G, and 702B similar to the ones in FIG. 78, respectively. Further, three outputs of a controller 804 are connected to the respective control pins of the three variable gain amplifiers 702R, 702G, and 702B. Output pins of the three variable gain amplifiers 702R, 702G, and 702B are connected to the respective output pins 709R, 709G, and 709B of the signal processor of the present invention.

In turn, the following describes operation of the embodiment in FIG. 82. Each of the three adders 705R, 705G, and 705B is used for brightness control in normal display, or controls the dc level of the signal by adding a dc voltage of the variable voltage source 706 controlled on the basis of the brightness control. The three variable gain amplifiers 702R, 702G, and 702B are used for the drive adjustment, or to vary the respective signal amplitudes on the basis of control signals. While the user is making the drive control, the gain controller 804 can control gains of the three variable gain amplifiers 702R, 702G, and 702B so that the circuit operation can be normally made without change of brightness in white display. At the same time, the gain controller 804 can control the variable voltage source 706 so that the voltage of the variable voltage source 706 applied to the three adders 705R, 705G, and 705B can be made constant. Note that the voltage of the variable voltage source 706 should be set at a value at which the black level brightness of the signal can be regarded as just zero.

These means can make the signal processor cause no change of the brightness in variation of color temperature by user and keep the white balance at a high accuracy. The circuit construction can be made of cheap devices for constant brightness control securing highly accurate white balance independent of the drive control state, as no expensive electronically controlled cut-off adjustment circuit is used.

Figure 83:
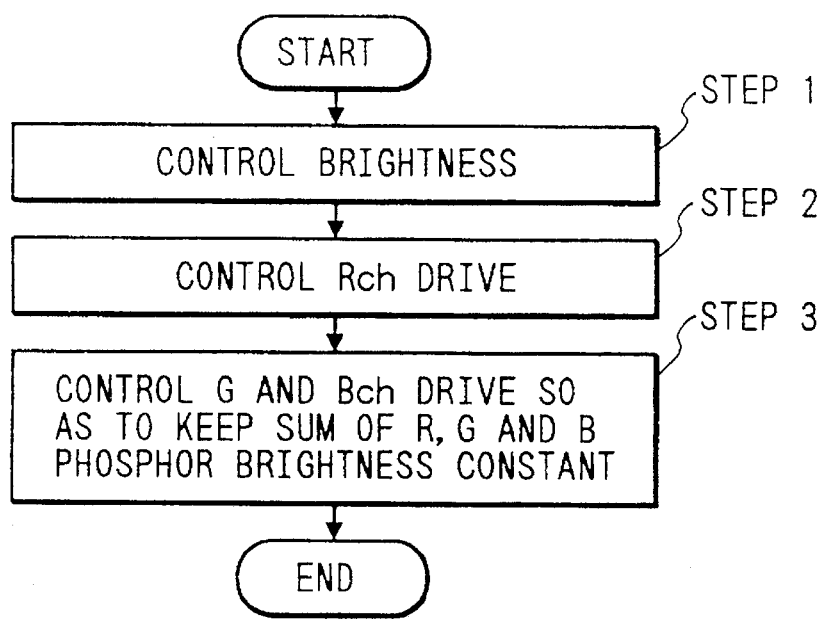
FIG. 83 is a flow chart illustrating an operation flow of the gain controller in FIG. 82.

FIG. 83 depicts a flow chart illustrating an example of operation flow of the controller 804 in FIG. 82 with the R channel drive-controlled by the user. The following describes the drive control process by reference to FIG. 83.

In step 1, as the drive control is started by the user, the brightness control is made in a way that the dc voltage of the variable voltage source 706 is controlled to a predetermined value. In step 2, the gain of the variable gain amplifier 702R is adjusted on the basis of the drive control of the R channel by the user. In step 3, the G and B channels are drive-controlled so that a sum of brightnesses of the R, G, and B phosphors in white display can be kept constant with the amount of R channel drive control adjusted in step 2.

With such a control process, the signal processor will not cause the brightness in white display to change and can secure the white balance even if the user varies the color temperature. Note that after the color temperature is varied by the user, change of the color balance will occur in a permissible range in the brightness adjustment. Also, even if the user drive-controls the G channel, step 2 can drive-control the G channel, and step 3 can drive-control the R and B channels so that the sum of the brightnesses of the R, G, and B phosphors in white display can be kept constant with the amount of G channel drive control adjusted in step 2, thus completing the drive control.

Further, even if the user drive-controls the B channel, step 2 can drive-control the B channel, and step 3 can drive-control the R and G channels so that the sum of the brightnesses of the R, G, and B phosphors in white display can be kept constant with the amount of B channel drive control adjusted in step 2, thus completing the drive control. In addition, the user's drive control is made possible if variable resistor knobs for control and key switches and the like as interface for digital control are arranged at positions available for the user.

As described in detail so far, the present invention can accomplish the wideband amplifier capable of feeding out the high amplitude, wideband signal without increase of power consumption. The present invention, therefore, can accomplish the wideband, high amplitude picture tube drive circuit of frequency band as wide as 50 to 300 MHz and output amplitude as high as 50 to 50 V useful for the computer displays for CAD and CAM with use of the small-scale circuits of low power consumption. This means that the entire amplifier circuit can be easily covered with shielding plate to reduce the spurious radiation.

Also, the present invention can reduce the parasitic capacitance on the output side of the amplifier section the parasitic capacitance which makes narrower the basic frequency band $f_{BH}$ of the amplifier. This means that the present invention can make wider the basic frequency band $f_{BH}$ and lower the power consumption to accomplish the wideband amplifier capable of feeding out the high amplitude, wideband signal.

Further, the present invention can accomplish the signal processor having the operating point (fixed operating point F) at which the input-output relationship can be kept even if the gain is varied. Thus, the present invention is advantageous in that the signal processor can be used in the video amplifier circuit to need no repetition of the cut-off adjustment and the drive adjustment in the white balance adjustment.

Still further, the present invention is advantageous in that the input dynamic range of the signal processor can be effectively used without expansion of the input dynamic range.

Still further, the present invention is advantageous in that the signal processor will not cause the brightness to change and make it hard to lose the white balance even if the user is allowed to vary the color temperature in white display.

What is claimed is:

1. An amplifier including a push-pull circuit having two active elements and two points at which electrodes of said two active elements interconnect, wherein one of the two interconnection points is made an input end, the other interconnection point is connected to one terminal of a peaking capacitor for use in setting a gain, another terminal of said peaking capacitor being connected to an AC ground point and one of remaining non-interconnected electrodes of said two active elements is made an output end of the amplifier.

2. The amplifier according to claim 1, wherein said peaking capacitor is comprised of a through-hole capacitor having a capacitance between a pipe and a lead wire passing through the pipe, wherein both ends of the lead wire passing through the pipe are short-circuited there across outside the pipe to form a first end, and the pipe end is made a second end, thereby producing the capacitance between the two ends.

3. The amplifier according to claim 1, wherein said peaking capacitor is comprised of a through-hole capacitor having a capacitance between a pipe and a lead wire passing through the pipe, wherein any one of the ends of the lead wire passing through the pipe is made a first end, the other remaining end of the lead wire is connected with another capacitor, and the pipe end is made a second end, thereby producing the capacitance between the first end and the second end.

4. The amplifier according to claim 1, wherein said peaking capacitor is comprised of a three-electrode capacitor made so that one of two ends for producing a capacitance there between is branched into two leads, wherein the two leads are short-circuited with a lead wire to form a first end, and the other end of the two ends for producing the capacitance is made of a second end, thereby producing the capacitance between the first end and the second end.

5. An amplifier including a push-pull circuit comprising two transistors, wherein each of the first and second transistors forming said push-pull circuit has a base thereof or a gate thereof referred to as a first electrode, an emitter thereof or a source thereof as a second electrode, and a collector thereof or a drain thereof as a third electrode, wherein the first electrode of said first transistor is connected to an input end of the amplifier, the second electrode of said first transistor has a peaking capacitor connected therewith and also is connected with the second electrode of said second transistor, said second transistor of a polarity inverse to said first transistor, the first electrode of said second transistor is connected to the input end, and the third electrode of said first transistor is connected to an output end of the amplifier.

6. An amplifier including a push-pull circuit including two transistors wherein each of the first and second transistors forming said push-pull circuit has a base thereof or a gate thereof referred to as a first electrode, an emitter thereof or a source thereof as a second electrode, and a collector thereof or a drain thereof as a third electrode, and a first current mirror circuit and a second current mirror circuit wherein:

the first electrode of said first transistor is connected to an input end and the second electrode of said first transistor has a peaking capacitor connected therewith and also is connected with the second electrode of said second transistor, said second transistor of a polarity inverse to said first transistor, the first electrode of said second transistor is connected to the input end, and the third electrode of said first transistor is connected to an output end; and the third electrode of said second transistor is connected to an input end of said first current mirror circuit, an output end of said first current mirror circuit is connected with an input end of said second current mirror circuit, and an output end of said second current mirror circuit is connected with said output end of the amplifier.

7. An amplifier including a peaking capacitor and a push-pull circuit including two transistors, each of the two transistors having a base thereof or a gate thereof referred to as a first electrode, an emitter thereof or a source thereof as a second electrode, and a collector thereof or a drain thereof as a third electrode, characterized in that:

one end of a peaking capacitor is connected to an input end of the amplifier, the other end of the peaking capacitor is connected with the second electrode of a first one of the two transistors and also is connected with the second electrode of the second one of the two transistors, the second transistor of a polarity inverse to said first transistor, the first electrode of said first transistor is interconnected with the first electrode of said second transistor, and the third electrode of said first transistor is connected to an output end of the amplifier.

8. An amplifier including a first transistor and a push-pull circuit including two additional transistors referred to as second and third transistors, each of the three transistors has a base thereof or a gate thereof referred to as a first electrode, an emitter thereof or a source thereof as a second electrode, and a collector thereof or a drain thereof as a third electrode, wherein the first electrode of the second transistor is connected to an input end and a second electrode of said second transistor has a peaking capacitor connected therewith and also is connected with the second electrode of said third transistor, said third transistor of a polarity inverse to said second transistor, the first electrode of said third transistor is connected to the input end of the amplifier, and the third electrode of said second transistor is connected to an output end of the amplifier; and the third electrode of said third transistor is connected through a capacitor with the second electrode of said first transistor, and the third electrode of said first transistor is connected with the third electrode of said second transistor.

9. An amplifier including a first transistor and a push-pull circuit having two transistors, which are referred to as said second and third transistors, each of the transistors having a base thereof or a gate thereof referred to as a first electrode, an emitter thereof or a source thereof as a second electrode, and a collector thereof or a drain thereof as a third electrode, wherein:

the first electrode of said second transistor is connected to an input end of the amplifier and a second electrode of said second transistor has a peaking capacitor connected therewith and also is connected with the second electrode of said third transistor, said third transistor of a polarity inverse to said second transistor, the first electrode of said third transistor is connected to the input end, and the third electrode of said second transistor is connected to an output end of the amplifier; and the third electrode of said third transistor is connected through a constant-voltage circuit with the second electrode of said first transistor and the third electrode of said first transistor is connected with the third electrode of said first transistor.

10. An amplifier including a first transistor and a push-pull circuit having two transistors which are referenced to as second and third transistors, each transistor having a base thereof or a gate thereof referred to as a first electrode, an emitter thereof or a source thereof as a second electrode, and a collector thereof or a drain thereof as a third electrode, wherein the first electrode of said second transistor is connected to an input end of the amplifier and a second electrode of said second transistor has a peaking capacitor connected therewith and also is connected with the second electrode of said third transistor, said third transistor of a polarity inverse to said second transistor, the first electrode of said third transistor is connected to the input end of the amplifier and the third electrode of said second transistor is connected to an output end of the amplifier; and the third electrode of said third transistor is connected through a capacitor with the second electrode of said first transistor, the third electrode of said first transistor is connected with the third electrode of said second transistor, and the third electrode of said third transistor is connected with an impeder of high impedance, such as a constant-current circuit, resistor or coil.

11. An amplifier wherein a feedback impeder is connected between an input end and output end of an inverted amplifier including a first transistor and a second transistor, said second transistor of a polarity inverse to said first transistor, said transistors having collectors thereof or drains thereof connected with each other and also connected with an output end of said inverted amplifier, bases thereof or gates thereof connected with each other and applied with a signal, and emitters thereof or sources thereof connected to an ac grounding point, the output end of said inverted amplifier is connected through an impedance conversion amplifier with an output end of the amplifier, and the input end of said inverted amplifier is connected to an input end of the amplifier.

12. The amplifier according to claim 11, said amplifier further including:

a third transistor inserted at a junction of one end of said feedback impeder, said input end of said inverted amplifier and said input end of said amplifier, said third transistor having a base thereof or a gate thereof connected with said input end of said amplifier, an emitter thereof or a source thereof connected with one end not connected with said output end of said inverted amplifier of two ends of said feedback impeder, and a collector thereof or a drain thereof connected with said input end of said inverted amplifier.

13. The amplifier according to claim 11, said amplifier further including a third transistor inserted at a junction of one end of said feedback impeder, said input end of said inverted amplifier and said input end of said amplifier, said third transistor having an emitter thereof or a source thereof connected with one end not connected with said output end of said inverted amplifier of two ends of said feedback impeder and said input end of said amplifier, a collector thereof or a drain thereof connected with said input end of said inverted amplifier, and a base thereof or a gate thereof connected to an a/c ground point.

14. The amplifier according to claim 11, wherein said emitter or said source of said third transistor is connected to an a/c grounding point via a resistor.

15. An amplifier including a first transistor and a second transistor wherein each of the transistors has a base thereof or a gate thereof referred to as a first electrode, an emitter thereof or a source thereof as a second electrode, and a collector thereof or a drain thereof as a third electrode, wherein the first electrode of said first transistor is connected to an input end of the amplifier, and also is connected with the first electrode of said second transistor, said second transistor of a polarity inverse to said first transistor, and further is connected with one end of a feedback impeder, the third electrode of said first transistor is interconnected with the third electrode of said second transistor and also is connected with the other end of the feedback impeder, and the interconnection point of the third electrode of said first transistor, the third electrode of said second transistor, and the other end of the feedback impeder is connected to an output end of the amplifier.

16. The amplifier according to claim 15 wherein said wideband amplifier circuit is covered over with a conducting plate to suppress spurious radiation therefrom.

17. An amplifier including a first transistor and a second transistor wherein each of the transistors has a base thereof or a gate thereof referred to as a first electrode, an emitter thereof or a source thereof as a second electrode, and a collector thereof or a drain thereof as a third electrode, wherein the first electrode of said first transistor is connected through a first dc coupling circuit, which includes a resistor, to an input end of the amplifier, the first electrode of said second transistor that is of a polarity inverse to said first transistor is connected through a second dc coupling circuit, which includes a resistor, to the input end, one end of a feedback impeder is connected to the input end, the third electrode of said first transistor is interconnected with the third electrode of said second transistor and also is connected with the other end of the feedback impeder, and the interconnection point of the third electrode of said first transistor, the third electrode of said second transistor, and the other end of the feedback impeder is connected to an output end of the amplifier.

18. An amplifier including first transistor and a second transistor wherein each of the transistors has a base thereof or a gate thereof referred to as a first electrode, an emitter thereof or a source thereof as a second electrode, and a collector thereof or a drain thereof as a third electrode, wherein the first electrode of said first transistor is connected through a first dc coupling circuit, which includes a buffer amplifier and a resistor, to an input end of the amplifier, the first electrode of said second transistor that is of a polarity inverse to said first transistor, is connected through said buffer amplifier and a second dc coupling circuit including a resistor to the input end, one end of a feedback impeder is connected to the input end, the third electrode of said first transistor is interconnected with the third electrode of said second transistor and also is connected with the other end of the feedback impeder, and the interconnection point of the third electrode of said first transistor, the third electrode of said second transistor, and the other end of the feedback impeder is connected to an output end of the amplifier.

19. The amplifier according to claim 18 wherein a signal current source is connected to the input end of the amplifier.

20. The amplifier according to claim 19 wherein the signal current source is connected to the input end through a third transistor, the first electrode of which is grounded.

21. The amplifier according to claim 18 wherein said signal current source is formed of an integrated circuit.

22. An amplifier including first transistor, a second transistor, a third transistor, and a fourth transistor wherein each of the transistors has a base thereof or a gate thereof referred to as a first electrode, an emitter thereof or a source thereof as a second electrode, and a collector thereof or a drain thereof as a third electrode, wherein the first electrode of said first transistor is connected to an input end of the amplifier and also is connected with the first electrode of said second transistor that is of a polarity inverse to said first transistor, and the second electrode of said first transistor is connected with the first electrode of said third transistor that is of a polarity inverse to said first transistor;

the second electrode of said second transistor is connected with the first electrode of said fourth transistor that is of a polarity inverse to said second transistor, the third electrode of said first transistor is connected with the second electrode of said second transistor is connected with the second electrode of said third transistor; and the second electrode of said third transistor is connected to an output end of the amplifier via a first resistor and the second electrode of said fourth transistor is connected to said output end via a second resistor.

23. An amplifier including first transistor, a second transistor, a third transistor, and a fourth transistor wherein each of the transistors has a base thereof or a gate thereof referred to as a first electrode, an emitter thereof or a source thereof as a second electrode, and a collector thereof or a drain thereof as a third electrode, wherein the first electrode of said second transistor is connected to an input end of the amplifier, a bias voltage generator circuit is connected between the first electrode of said second transistor and the first electrode of said first transistor that is of a polarity inverse to said second transistor, and the second electrode of said first transistor is connected with the first electrode of said third transistor that is of a polarity inverse to said first transistor;

the second electrode of said second transistor is connected with the first electrode of said fourth transistor that is of a polarity inverse to said second transistor, the third electrode of said first transistor is connected with the second electrode of said fourth transistor, and the third electrode of said second transistor is connected with the second electrode of said third transistor; and the second electrode of said third transistor and the second electrode of said fourth transistor are both connected to an output end of the amplifier through respective impedance elements.

24. An amplifier including a first transistor, a second transistor, a third transistor, and a fourth transistor wherein each of the transistors has a base thereof or a gate thereof referred to as a first electrode, an emitter thereof or a source thereof as a second electrode, and a collector thereof or a drain thereof as a third electrode, wherein the first electrode of said first transistor is connected to an input end of the amplifier and also connected with a first electrode of said second transistor that is of a polarity inverse to said first transistor, and the second electrode of said first transistor is connected with the first electrode of said third transistor that is of a polarity inverse to said first transistor;

the second electrode of said second transistor is connected with the first electrode of said fourth transistor that is of a polarity inverse to said second transistor, the third electrode of said first transistor in connected with the second electrode of said fourth transistor, and the third electrode, of said second, transistor is connected with the second electrode of said third transistor;

the second electrode of said first transistor is connected through a capacitor to the first electrode of said fourth transistor, the second electrode of said second transistor is connected though an electrolyte capacitor to the first electrode of said third transistor; and the second electrode of said third transistor and the second electrode of said fourth transistor are both connected to an output end of the amplifier.

25. An amplifier including a first transistor, a second transistor, a third transistor, and a fourth transistor wherein each of the transistors has a base thereof or a gate thereof referred to as a first electrode, an emitter thereof or a source thereof as a second electrode, and a collector thereof or a drain there of as a third electrode, wherein the first electrode of said first transistor is connected to an input end of the amplifier and also connected with the first electrode of said second transistor that is of a polarity inverse to said first transistor, and the second electrode of said first transistor is connected through a resistor with the first electrode of said third transistor that is of a polarity inverse to said first transistor;

the second electrode of said second transistor is connected through a resistor with the first electrode of said fourth transistor that is of a polarity inverse to said second transistor, the third electrode of said first transistor is connected to a first ac guiding point, the third electrode of said second transistor is connected to a second ac grounding point;

the second electrode of said first transistor is connected through a capacitor to the first electrode of said fourth transistor, the second electrode of said second transistor is connected through an electrolyte capacitor to the first electrode of said third transistor; and the second electrode of said third transistor and the second electrode of said fourth transistor are both connected to an output end of the amplifier.

26. An amplifier including a first transistor, a second transistor, a third transistor, and a fourth transistor wherein each of the transistors has a base thereof or a gate thereof referred to as a first electrode, an emitter thereof or a source thereof as a second electrode, and a collector thereof or a drain thereof as a third electrode, wherein the first electrode of said first transistor is connected to an input end and also connected with the first electrode of said second transistor that is of a polarity inverse to said first transistor first transistor is connected with the first electrode of said third transistor that is of a polarity inverse to said first transistor;

the second electrode of said second transistor is connected through with the first electrode of said fourth transistor that is of a polarity inverse to said second transistor, the third electrode of said first transistor is connected with the second electrode of said second transistor; and the third electrode of said second transistor is connected with the second electrode of said first transistor, the second electrode of said first transistor, the second electrode of said third transistor and the second electrode of said fourth transistor are both connected to an output end of the amplifier.

27. An amplifier including a first transistor wherein said first transistor has a base thereof or a gate thereof referred to as a first electronic, an emitter thereof or a source thereof as a second electrode, and a collector thereof as a second electrode, and a collector thereof or a drain thereof as a third electrode, wherein the third electrode of said first transistor having at least one of the first electrode and the second electrode connected with one end of a first coil and with one end of a capacitor, one end of a second coil and the other end of the first coil are connected to an output end of the amplifier, and the other end of the second coil is connected with the other end of the capacitor and a voltage source via a resistor.

28. An amplifier comprising an amplifying means having a first end connected to one end of a constant-resistance circuit including an inductance connected in parallel with a first resistance, said first end also connected with an output end of the amplifier, and the other end of said constant-resistance circuit being connected to an ac grounding point via an output resistance of the same resistance as that of said first resistance.

29. A display apparatus comprising an amplifier including an amplifying means having a first end connected to one end of a constant-resistance circuit, which includes an inductance connected in parallel with a first resistance said first end also connected with an output end of the amplifier, and the other end of said constant-resistance circuit being connected to an ac grounding point via an output resistance of the same resistance as that of said first resistance, wherein said output end of said amplifier is connected with a driving terminal of a display device in said display apparatus.

30. An amplifier comprising a variable gain amplifier for amplifying an input signal before feeding out, a control signal source for feeding a control signal to the variable gain amplifier to control a gain of the amplifier, and an adder-subtracter to which the control signal that is fed to the variable gain amplifier by the control signal source is also fed, referred to as the branched control signal, which adder-subtracter takes the branched control signal into one input end thereof, takes an output of the variable gain amplifier into the other input end thereof, and performs addition or subtraction of both signals before feeding a result out as an output signal, wherein:

a fixed operating point at which a relationship between the input signal and the output signal is kept constant can be set at a desired point on an input output characteristic curve showing the relationship between the input signal and the output signal even if the gain of the variable gain amplifier is varied by changing the control signal fed from the control signal source to the variable gain amplifier.

31. The amplifier according to claim 30 wherein when the control signal fed to the variable gain amplifier by the control signal source is branched, the branched control signal is voltage-divided through a voltage divider circuit of two resistors before the adder-subtractor takes the branched control signal into one input end thereof, thereby making it possible to set the fixed operating point at a desired point on the input-output characteristic curve.

32. An amplifier comprising a control signal source, an adder-subtracter for taking an input signal into one input end thereof, for taking a control signal from the control signal source into the other input end thereof, and for performing addition or subtraction of both signals before feeding a result out, and a variable gain amplifier receiving an output of the adder-subtractor input to amplify before feeding out as an output signal and has a branched signal of the control signal from the control signal source fed thereto to control the amplification gain, wherein:

a fixed operating point at which a relationship between the input signal and the output signal is kept constant can be set at a desired point on an input-output characteristic curve showing the relationship between the input signal and the output signal even if the gain of the variable gain amplifier is varied by changing the control signal fed from the control signal source to the variable gain amplifier.

* * * * *

UNITED STATES PATENT AND TRADEMARK OFFICE
CERTIFICATE OF CORRECTION

PATENT NO. : 5,546,048
DATED : 13 August 1996
INVENTOR(S) : Yuji SANO et al.

It is certified that error appears in the above-identified patent and that said Letters Patent is hereby corrected as shown below:

| Column | Line | |
|---|---|---|
| 1 | 25 | Before "circuit" delete "that the". |
| 1 | 26 | After "components" insert --that--; delete "sized"  ; delete "weight". |
| 2 | 54 | Change "an" to --a--. |
| 5 | 5 | Change "a output" to --an output--. |
| 5 | 16 | Change "in a way" to --in such a way--. |
| 5 | 50 | Before "R, G," delete "a". |
| 6 | 3 | Change "diagrams" to --diagram--. |
| 6 | 5 | Change "diagrams" to --diagram--. |
| 6 | 7 | Change "diagrams" to --diagram--. |
| 7 | 65 | Before "structure" insert --the--. |

UNITED STATES PATENT AND TRADEMARK OFFICE
CERTIFICATE OF CORRECTION

PATENT NO. : 5,546,048

DATED : 13 August 1996

INVENTOR(S) : Yuji SANO et al.

It is certified that error appears in the above-identified patent and that said Letters Patent is hereby corrected as shown below:

| Column | Line | |
|---|---|---|
| 8 | 7 | Change "Ic" to --IC--. |
| 9 | 29 | After "path" insert --of--. |
| 11 | 27 | After "above" insert "and". |
| 13 | 46 | Change "cutin" to --cut in--. |
| 13 | 47 | Change "0. 7 V" to --0.7 V--. |
| 14 | 44 | Before "parasitic" delete "a". |
| 14 | 58 | Change "an signal" to --a signal--. |
| 15 | 22 | Change "respecting" to --respective--. |
| 15 | 26 | Change "affect" to --affecting--. |
| 16 | 2 | Delete "made". |
| 16 | 24 | Change "affect" to --effect--. |

UNITED STATES PATENT AND TRADEMARK OFFICE
CERTIFICATE OF CORRECTION

PATENT NO. : 5,546,048

DATED : 13 August 1996

INVENTOR(S) : Yuji SANO et al.

It is certified that error appears in the above-identified patent and that said Letters Patent is hereby corrected as shown below:

| Column | Line | |
|---|---|---|
| 18 | 5 | Change "biases" to --bias--. |
| 18 | 17 | Change "ac-grounds" to --ac-ground--. |
| 19 | 22 | Change "less" to --smaller--. |
| 19 | 41 | Change "widen" to --wider--. |
| 19 | 44 | Before "fed" insert --being--. |
| 19 | 51 | After "illustrating" delete "a". |
| 19 | 60 | After "input" insert --to--. |
| 21 | 62 | Change "make" to --makes--. |
| 22 | 38 | Change "grounding point" to --grounded voltage potential--. |
| 22 | 39 | Change "grounding point" to --grounded voltage potential-- |
| 23 | 13 | Change "This results in" to --This result is--. |

UNITED STATES PATENT AND TRADEMARK OFFICE
CERTIFICATE OF CORRECTION

PATENT NO. : 5,546,048

DATED : 13 August 1996

INVENTOR(S) : Yuji SANO et al.

It is certified that error appears in the above-identified patent and that said Letters Patent is hereby corrected as shown below:

| Column | Line | |
|---|---|---|
| 23 | 23 | Change "serve" to --serves--. |
| 23 | 38 | Change "coils" to --coil--. |
| 24 | 22 | Change "heatdissipating" to --heat-dissipating--. |
| 26 | 52 | After "$C_R$" insert --,--; before "few" insert --a--. |
| 26 | 53 | After "resistors" insert --,--. |
| 27 | 1 | Change "is." to --is--. |
| 27 | 20 | Change "has" to --have--. |
| 27 | 32 | Change "to" to --too--. |
| 27 | 55 | Delete "described above". |

UNITED STATES PATENT AND TRADEMARK OFFICE
CERTIFICATE OF CORRECTION

PATENT NO. : 5,546,048

DATED : 13 August 1996

INVENTOR(S) : Yuji SANO et al.

It is certified that error appears in the above-identified patent and that said Letters Patent is hereby corrected as shown below:

| Column | Line | |
|---|---|---|
| 28 | 16 | Change "boron-" to --boron--. |
| 28 | 17 | Change "niteride" to --nitride--. |
| 28 | 21 | Change "boronniteride" to --boron nitride--; delete "in". |
| 30 | 38 | Before "be" insert --to--. |
| 31 | 7 | Change "from" to --form--. |
| 37 | 47 | After "section" insert --,--. |
| 39 | 30 | Change "has" to --having--. |
| 40 | 4 | Change "referenced" to --referred--. |
| 41 | 3 | Change "claim 11" to --claim 12--. |
| 41 | 49 | Before "first" insert --a--. |

UNITED STATES PATENT AND TRADEMARK OFFICE
CERTIFICATE OF CORRECTION

PATENT NO. : 5,546,048
DATED : 13 August 1996
INVENTOR(S) : Yuji SANO et al.

It is certified that error appears in the above-identified patent and that said Letters Patent is hereby corrected as shown below:

| Column | Line | |
|---|---|---|
| 42 | 27 | After "said" insert --fourth transistor, and the third electrode of said--. |
| 43 | 11 | After "electrode" and "second" delete ",". |
| 43 | 26 | Change "there of" to --thereof--. |
| 43 | 58 | After "first transistor" insert--, and the second electrode of said--. |
| 44 | 3 | Change "both" to --all--. |
| 44 | 7 | Change "electronic" to --electrode--. |
| 44 | 30 | After "resistance" insert --,--. |
| 45 | 5 | Change "has" to --having--. |

Signed and Sealed this

Fourth Day of February, 1997

Attest:

BRUCE LEHMAN

*Attesting Officer*  *Commissioner of Patents and Trademarks*